(12) United States Patent
Chang et al.

(10) Patent No.: US 12,166,076 B2
(45) Date of Patent: Dec. 10, 2024

(54) SEMICONDUCTOR DEVICE AND METHODS OF FORMING THE SAME

(71) Applicant: Taiwan Semiconductor Manufacturing Co., Ltd., Hsinchu (TW)

(72) Inventors: Jen-Hong Chang, Hsinchu (TW); Yi-Hsiu Liu, Taipei (TW); You-Ting Lin, Miaoli County (TW); Chih-Chung Chang, Mingjian Township (TW); Kuo-Yi Chao, Hsinchu (TW); Jiun-Ming Kuo, Taipei (TW); Yuan-Ching Peng, Hsinchu (TW); Sung-En Lin, Hsinchu (TW); Chia-Cheng Chao, Hsinchu (TW); Chung-Ting Ko, Kaohsiung (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 527 days.

(21) Appl. No.: 17/402,930

(22) Filed: Aug. 16, 2021

(65) Prior Publication Data
US 2022/0328627 A1 Oct. 13, 2022

Related U.S. Application Data

(60) Provisional application No. 63/172,365, filed on Apr. 8, 2021.

(51) Int. Cl.
H01L 33/62 (2010.01)
H01L 21/768 (2006.01)
(Continued)

(52) U.S. Cl.
CPC .... H01L 29/0673 (2013.01); H01L 21/76829 (2013.01); H01L 29/78618 (2013.01); H01L 29/78696 (2013.01)

(58) Field of Classification Search
CPC ............. H01L 29/66439; H01L 29/775; H01L 29/108; H01L 29/0847; H01L 29/42392;
(Continued)

(56) References Cited

U.S. PATENT DOCUMENTS 9,209,247 B2 12/2015 Colinge et al.
9,236,267 B2 1/2016 De et al.
(Continued)

Primary Examiner — Victor A Mandala
Assistant Examiner — Lawrence C Tynes, Jr.
(74) Attorney, Agent, or Firm — Slater Matsil, LLP

(57) ABSTRACT

A semiconductor device includes a first channel region, a second channel region, and a first insulating fin, the first insulating fin being interposed between the first channel region and the second channel region. The first insulating fin includes a lower portion and an upper portion. The lower portion includes a fill material. The upper portion includes a first dielectric layer on the lower portion, the first dielectric layer being a first dielectric material, a first capping layer on the first dielectric layer, the first capping layer being a second dielectric material, the second dielectric material being different than the first dielectric material, and a second dielectric layer on the first capping layer, the second dielectric layer being the first dielectric material.

20 Claims, 57 Drawing Sheets

(51) Int. Cl.
*H01L 25/075* (2006.01)
*H01L 27/12* (2006.01)
*H01L 29/06* (2006.01)
*H01L 29/786* (2006.01)

(58) Field of Classification Search
CPC ......... H01L 21/823431; H01L 21/6829; H01L 21/76224; H01L 21/76832; H01L 21/2221; H01L 21/768; H01L 21/76829; H01L 27/0886; H01L 27/088; H01L 28/57; H01L 23/53223; H01L 23/53238; H01S 5/3407; H10N 30/708; H05H 1/2406; B82Y 10/00
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,502,410 B1* | 11/2016 | Feng | H01L 21/308 |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2020/0127113 A1* | 4/2020 | Ching | H01L 29/785 |
| 2020/0243666 A1* | 7/2020 | Ching | H01L 21/823431 |
| 2021/0082966 A1* | 3/2021 | Lin | H01L 29/78696 |
| 2021/0265508 A1* | 8/2021 | Chiang | H01L 29/0673 |

* cited by examiner

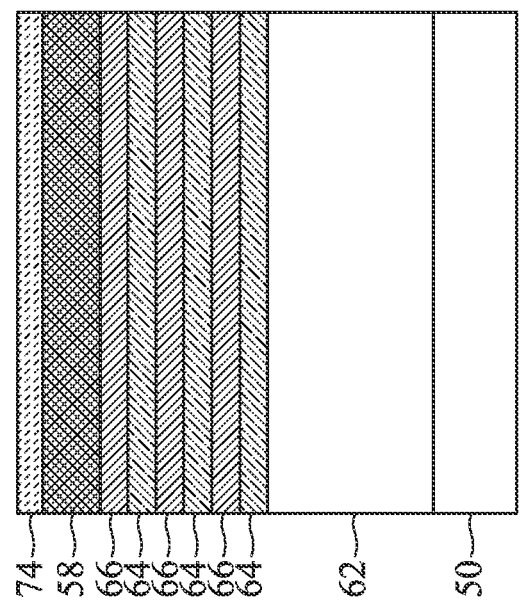

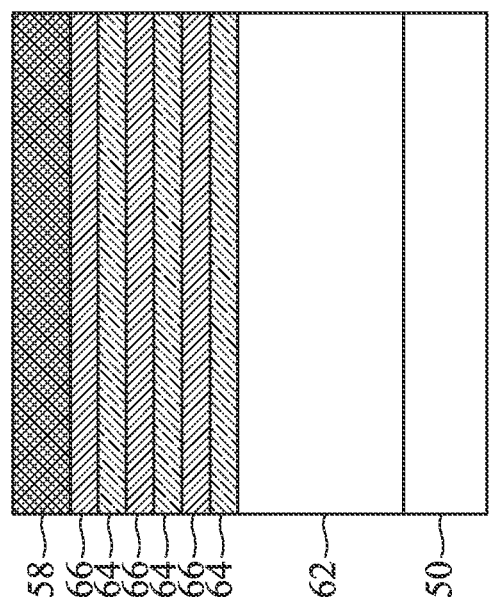

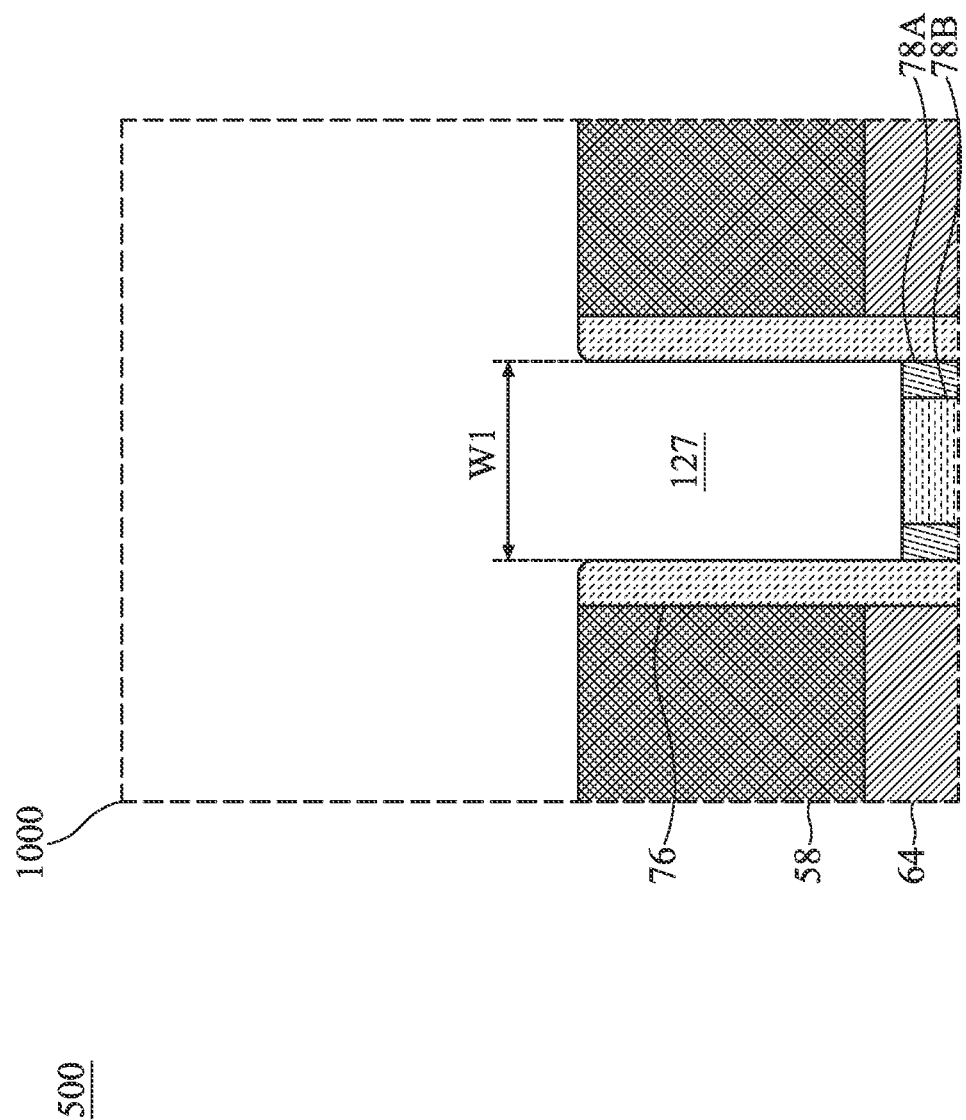

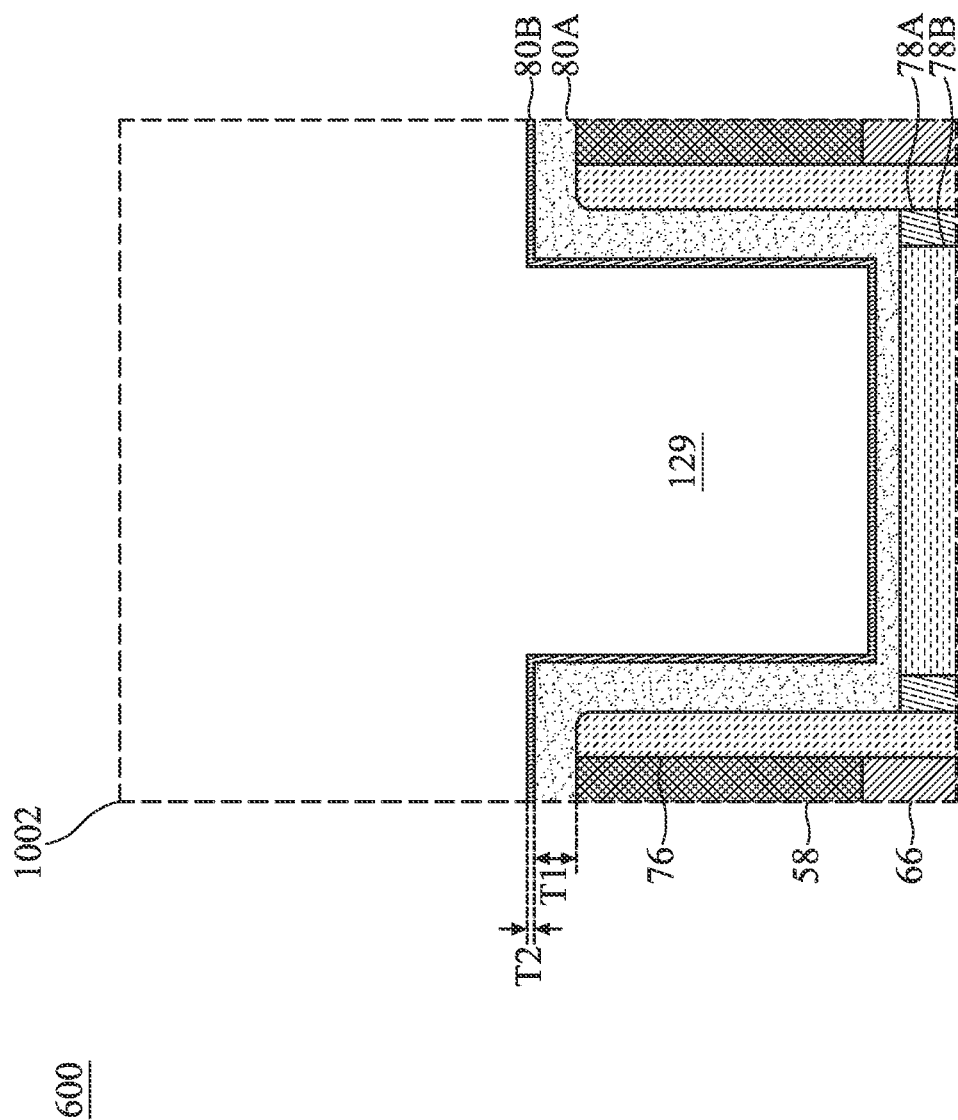

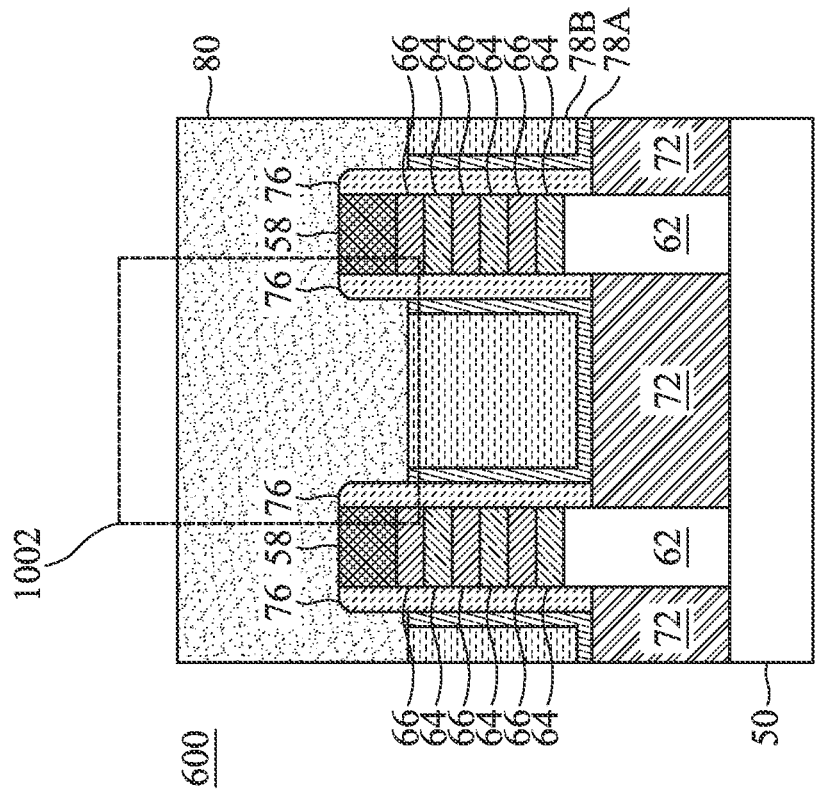
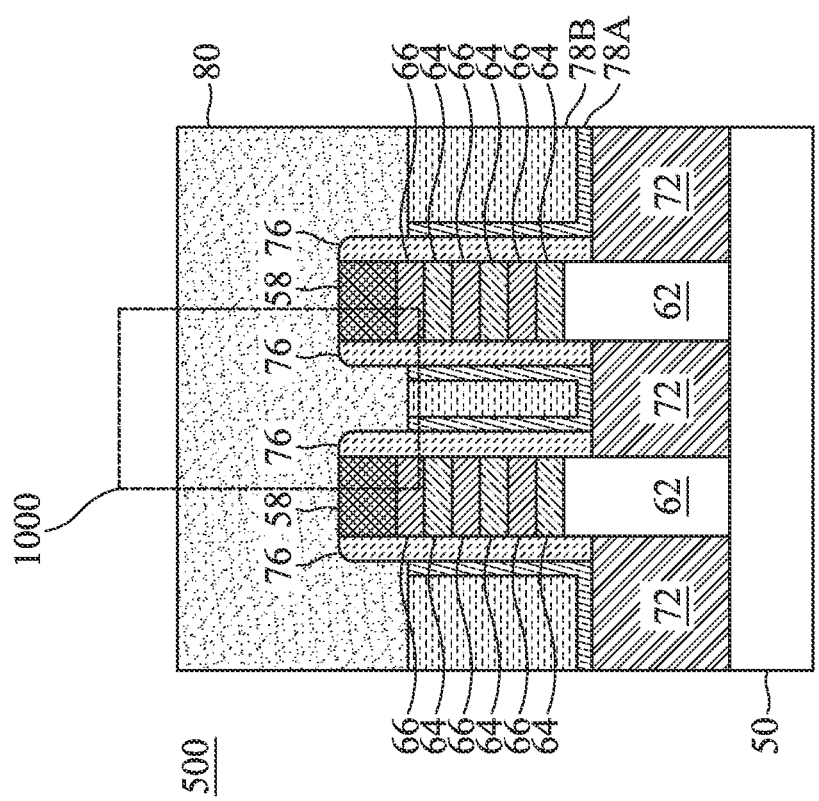
Figure 13B
Figure 13C

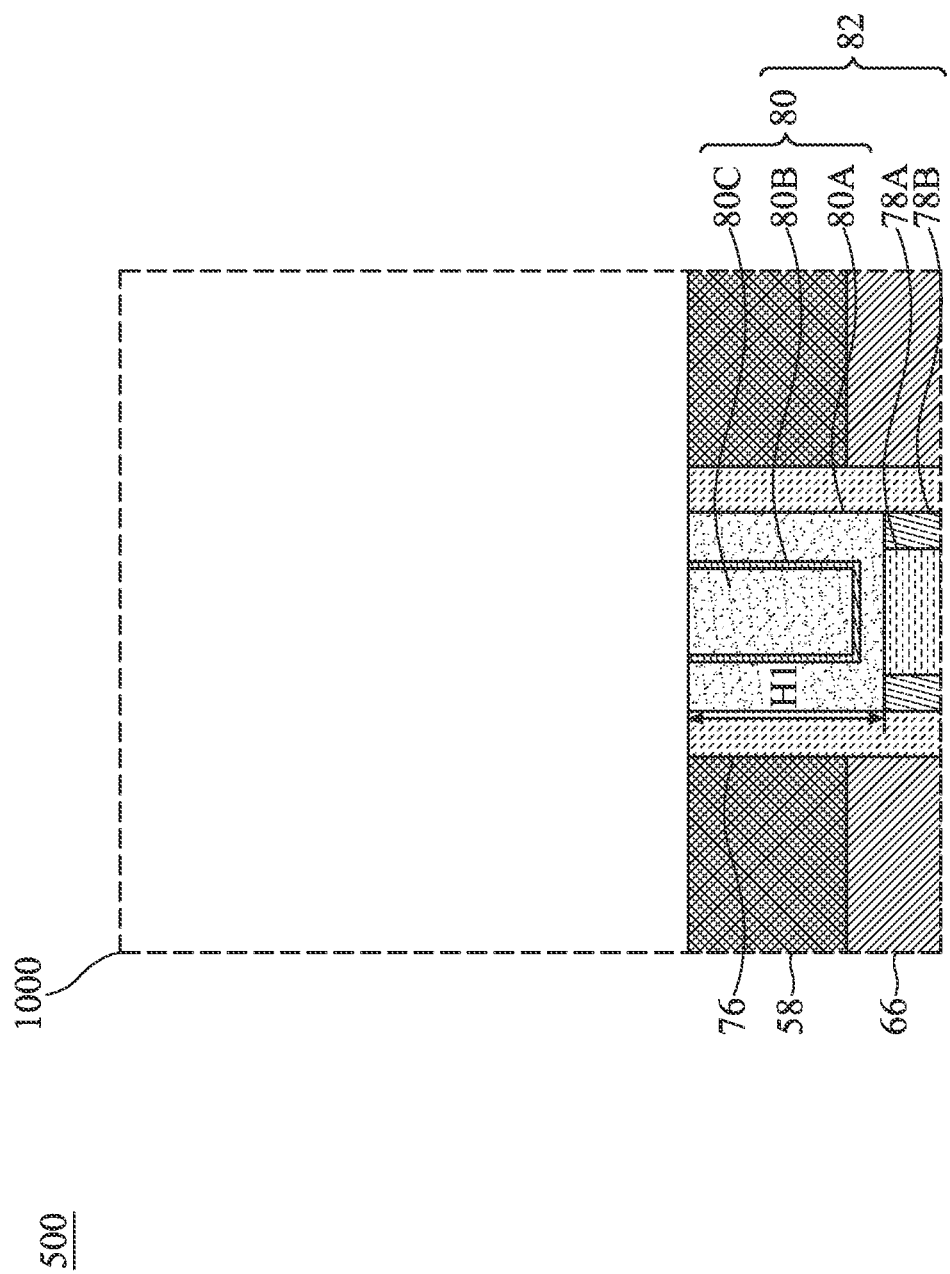

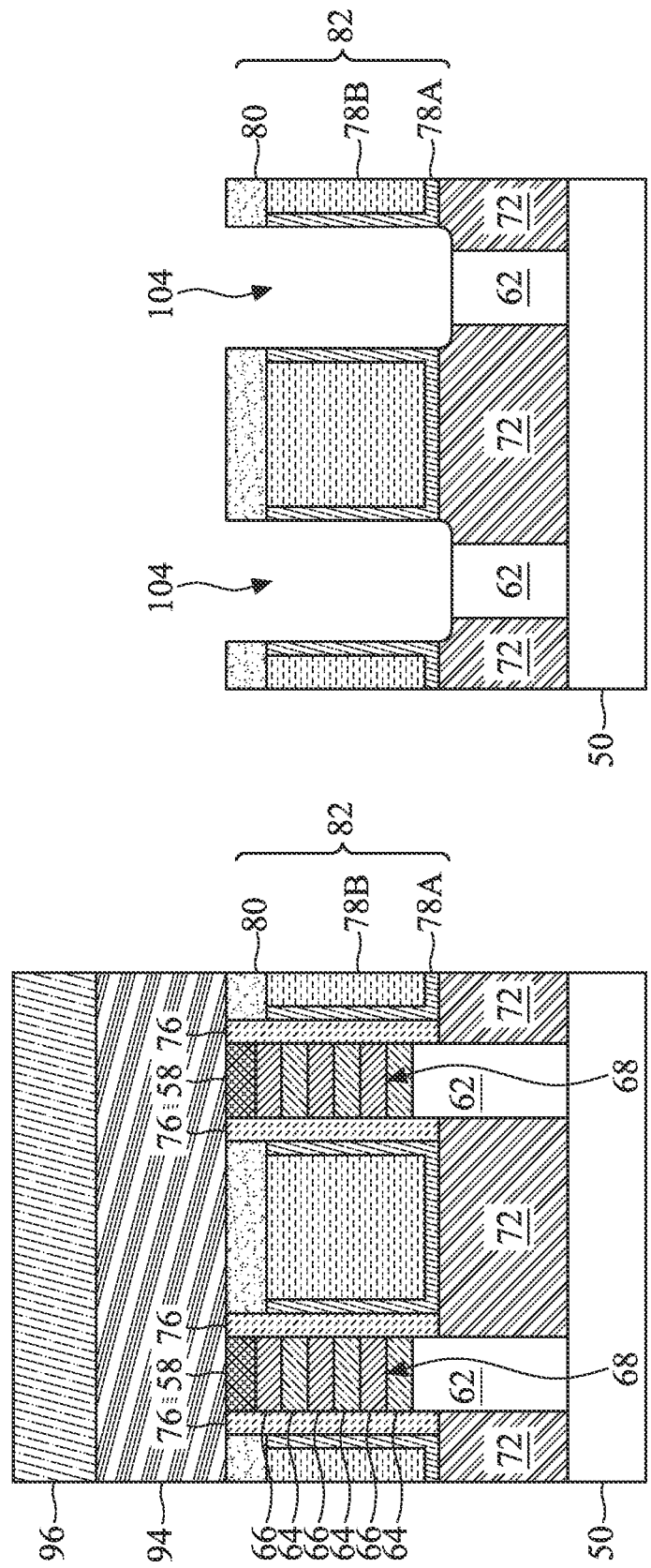

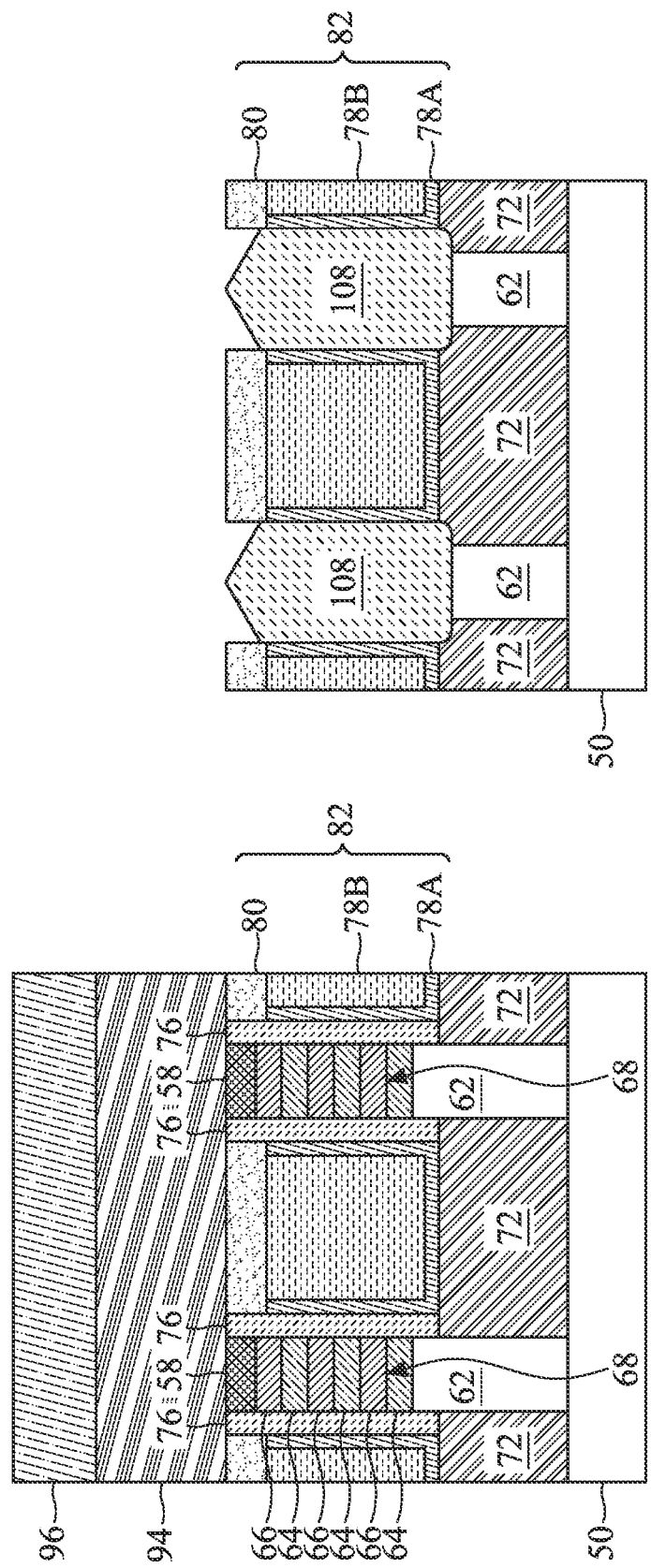

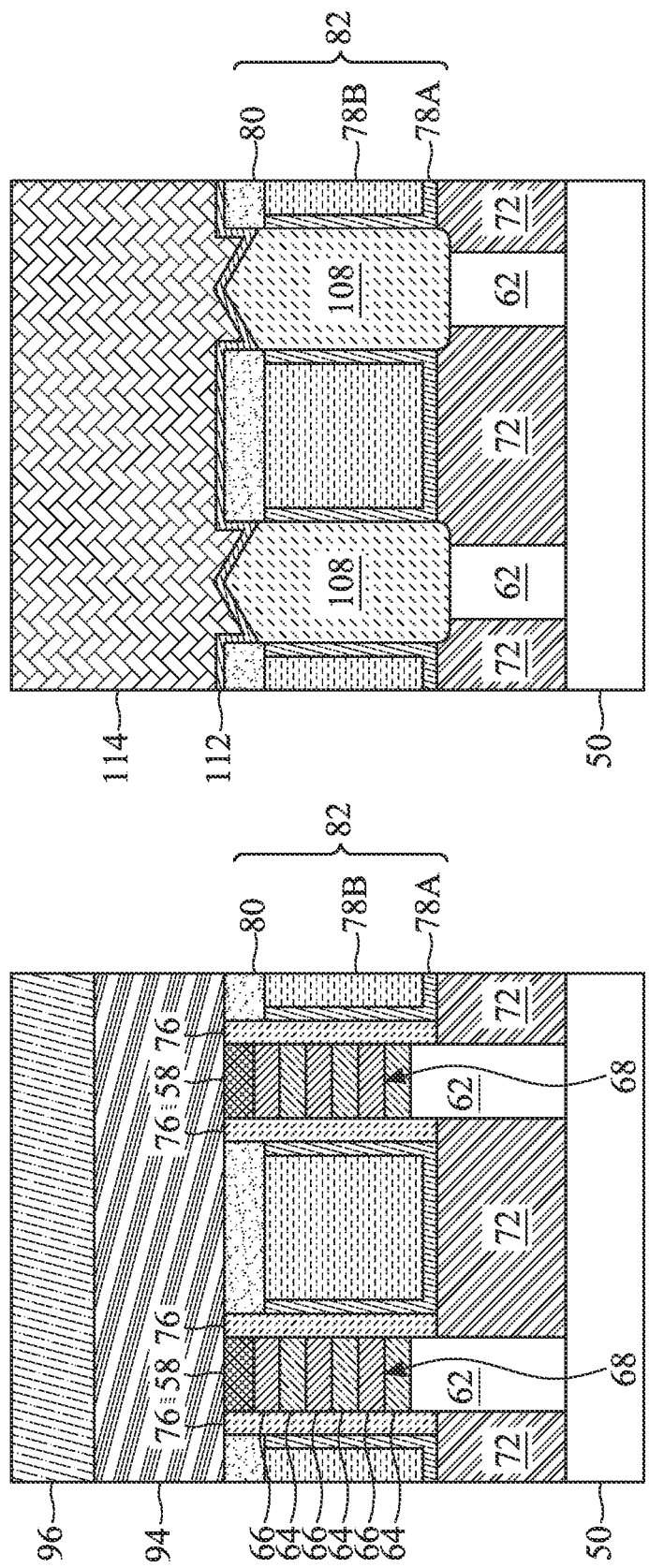

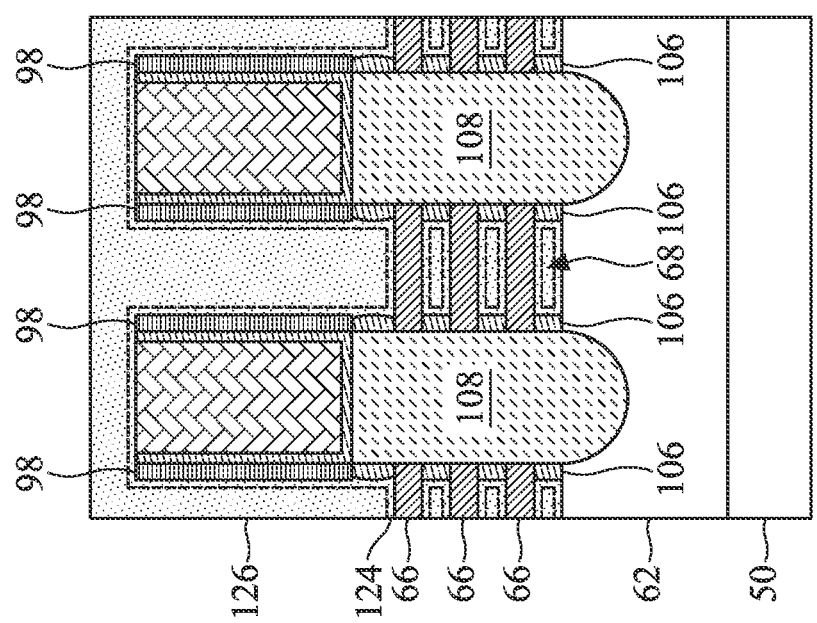

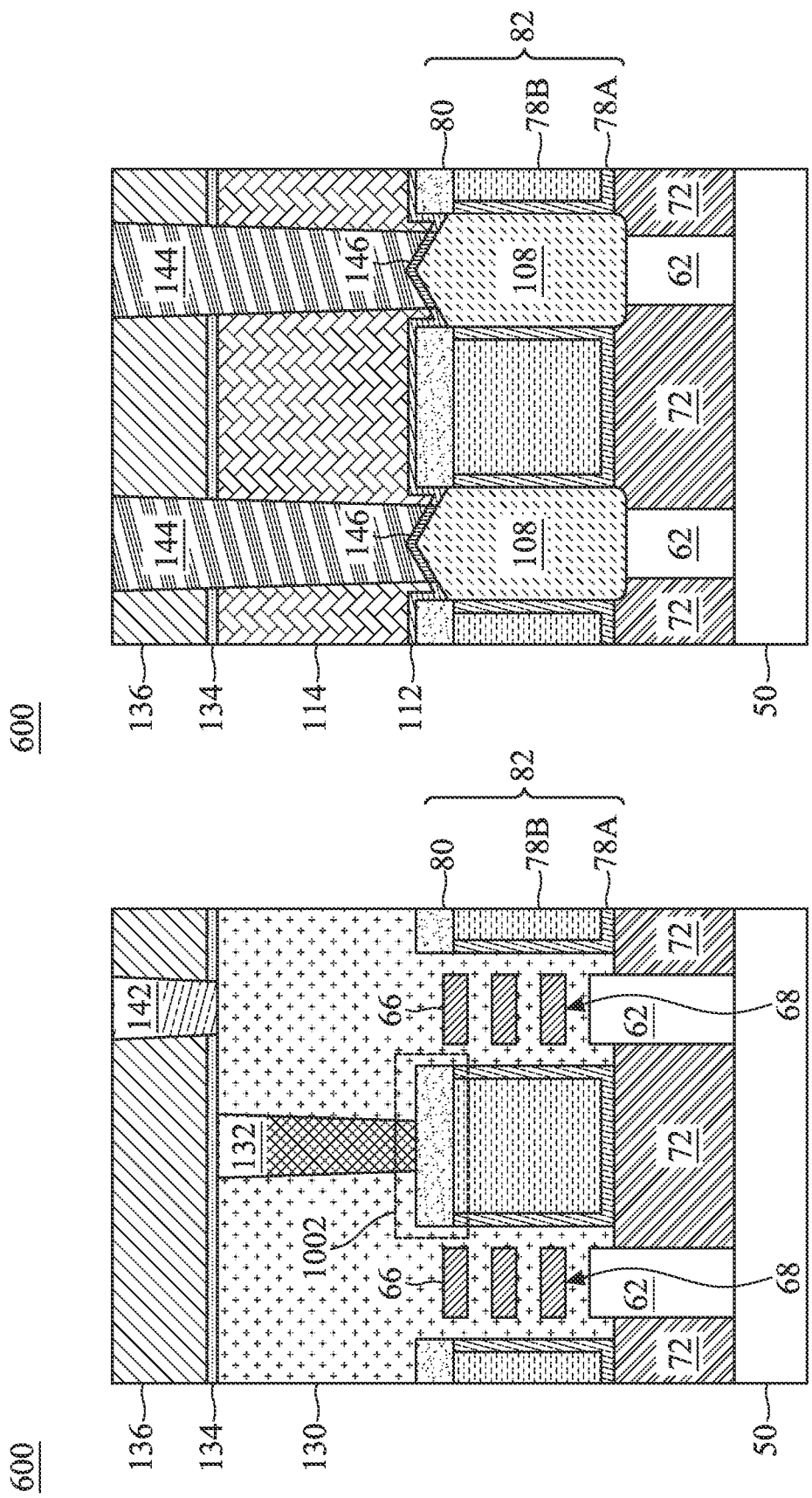

SEMICONDUCTOR DEVICE AND METHODS OF FORMING THE SAME

PRIORITY CLAIM AND CROSS-REFERENCE

This application claims the benefit of U.S. Provisional Application No. 63/172,365, filed on Apr. 8, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
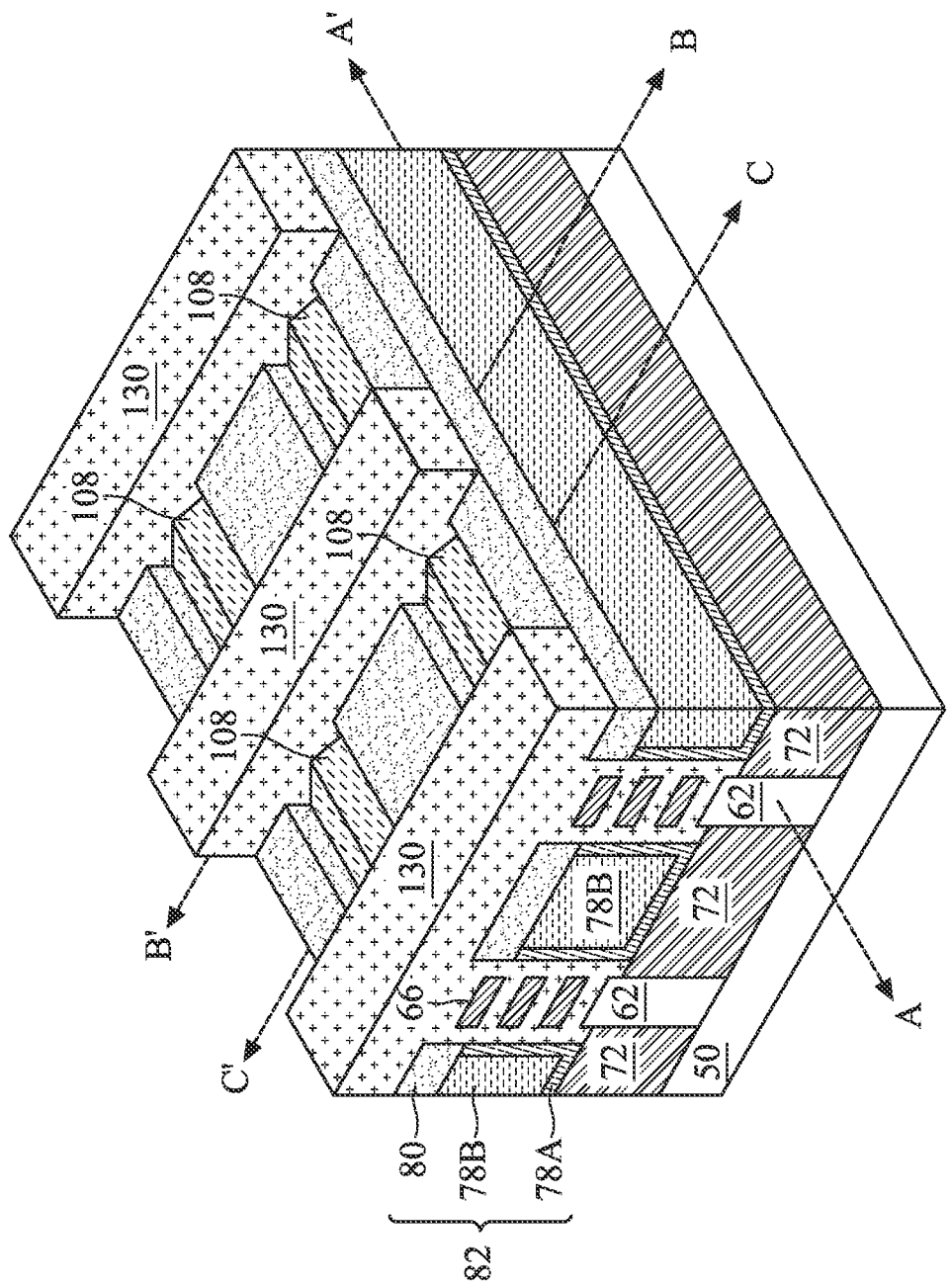
FIG. 1 illustrates an example of nanostructure field-effect transistors (nano-FETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, insulating fins are utilized. For example, in some embodiments, insulating fins are formed between stacks of nanostructures for, e.g., reducing undesired merging of source/drain regions. Top portions of the insulating fins are formed with alternating high-k dielectric layers and capping layers. Extrusion defects resulting from local grain growth on top surfaces of insulating fins may be reduced by the capping layers. The alternating high-k dielectric layers and capping layers may also be useful for improving film quality and for better control of a chemical mechanical polish (CMP) rate when planarizing the insulating fins.

Embodiments are described in a particular context, a die including nano-FETs. Various embodiments may be applied, however, to dies including other types of transistors (e.g., fin field-effect transistors (finFETs), planar transistors, or the like) in lieu of or in combination with the nano-FETs.

FIG. 1 illustrates an example of nano-FETs (e.g., nanowire FETs, nanosheet FETs, or the like), in accordance with some embodiments. FIG. 1 is a three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 66 (e.g., nanosheets, nanowires, or the like) over semiconductor fins 62 on a substrate 50 (e.g., a semiconductor substrate), with the nanostructures 66 acting as channel regions for the nano-FETs. The nanostructures 66 may include p-type nanostructures, n-type nanostructures, or a combination thereof. Isolation regions 72, such as shallow trench isolation (STI) regions, are disposed between adjacent semiconductor fins 62, which may protrude above and from between adjacent isolation regions 72. Although the isolation regions 72 are described/illustrated as being separate from the substrate 50, as used herein, the term "substrate" may refer to the semiconductor substrate alone or a combination of the semiconductor substrate and the isolation regions. Additionally, although the bottom portions of the semiconductor fins 62 are illustrated as being separate from the substrate 50, the bottom portions of the semiconductor fins 62 may be single, continuous materials with the substrate 50. In this context, the semiconductor fins 62 refer to the portion extending above and from between the adjacent isolation regions 72.

Gate structures 130 are over top surfaces of the semiconductor fins 62 and along top surfaces, sidewalls, and bottom surfaces of the nanostructures 66. Epitaxial source/drain regions 108 are disposed on the semiconductor fins 62 at opposing sides of the gate structures 130. The epitaxial source/drain regions 108 may be shared between various semiconductor fins 62. For example, adjacent epitaxial source/drain regions 108 may be electrically connected, such as through coupling the epitaxial source/drain regions 108 with a same source/drain contact.

Insulating fins 82, also referred to as hybrid fins or dielectric fins, are disposed over the isolation regions 72, and between adjacent epitaxial source/drain regions 108. The insulating fins 82 block epitaxial growth to prevent coalescing of some of the epitaxial source/drain regions 108 during epitaxial growth. For example, the insulating fins 82 may be formed at cell boundaries to separate the epitaxial source/drain regions 108 of adjacent cells. The insulating fins 82 may comprise a liner 78A, a fill material 78B, and upper dielectric layers 80 over the liner 78A and the fill material 78B.

FIG. 1 further illustrates reference cross-sections that are used in later figures. Cross-section A-A' is along a longitudinal axis of a semiconductor fin 62 and in a direction of, for example, a current flow between the epitaxial source/drain regions 108 of the nano-FET. Cross-section B-B' is along a longitudinal axis of a gate structure 130 and in a direction, for example, perpendicular to a direction of current flow between the epitaxial source/drain regions 108 of a nano-FET. Cross-section C-C' is parallel to cross-section B-B' and extends through epitaxial source/drain regions 108 of the nano-FETs. Subsequent figures refer to these reference cross-sections for clarity.

Figure 2:
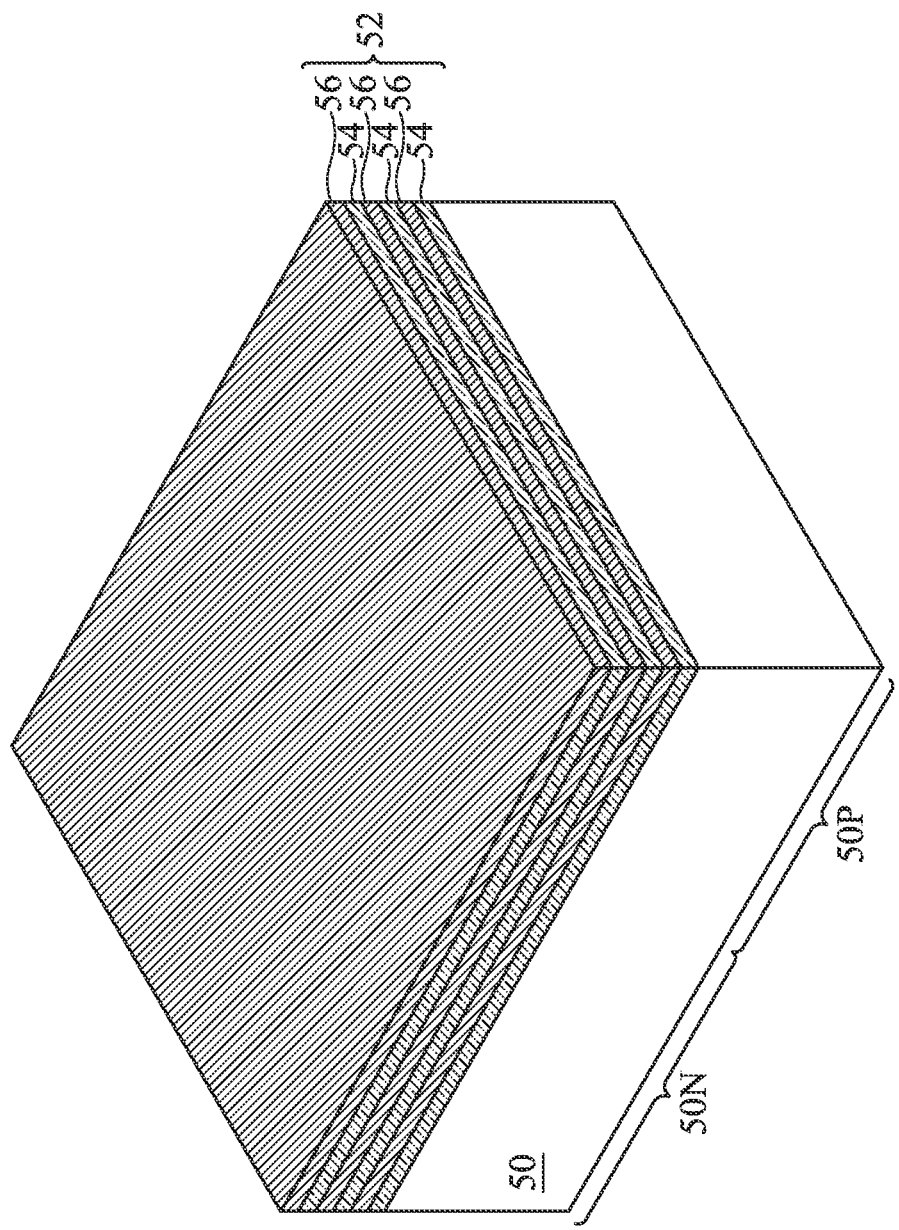
FIGS. 2-25F are cross-sectional views of intermediate stages in the manufacturing of nano-FETs, in accordance with some embodiments.
Figure 3:
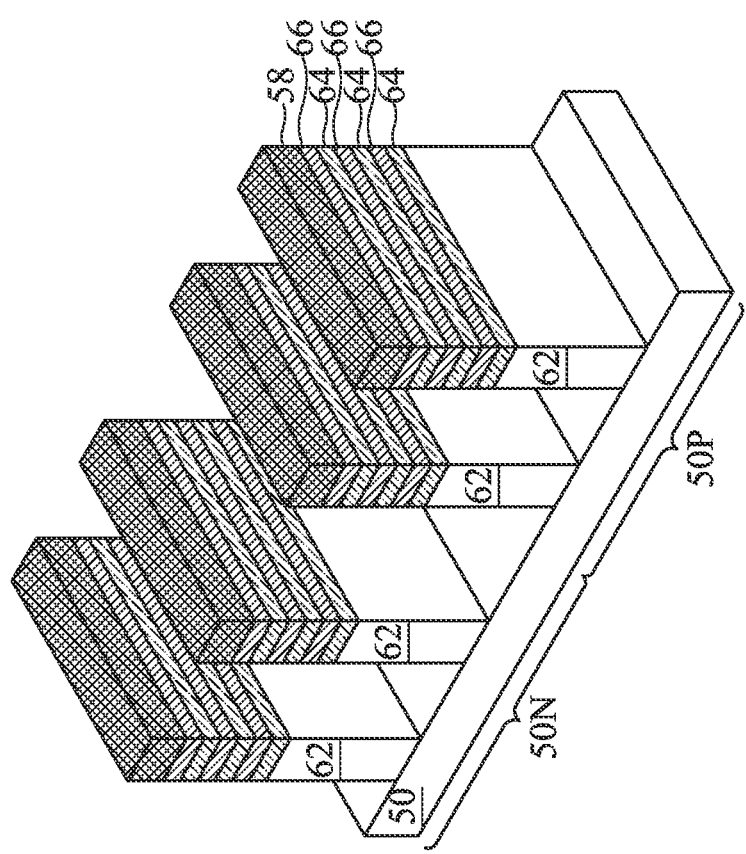
Figure 4:
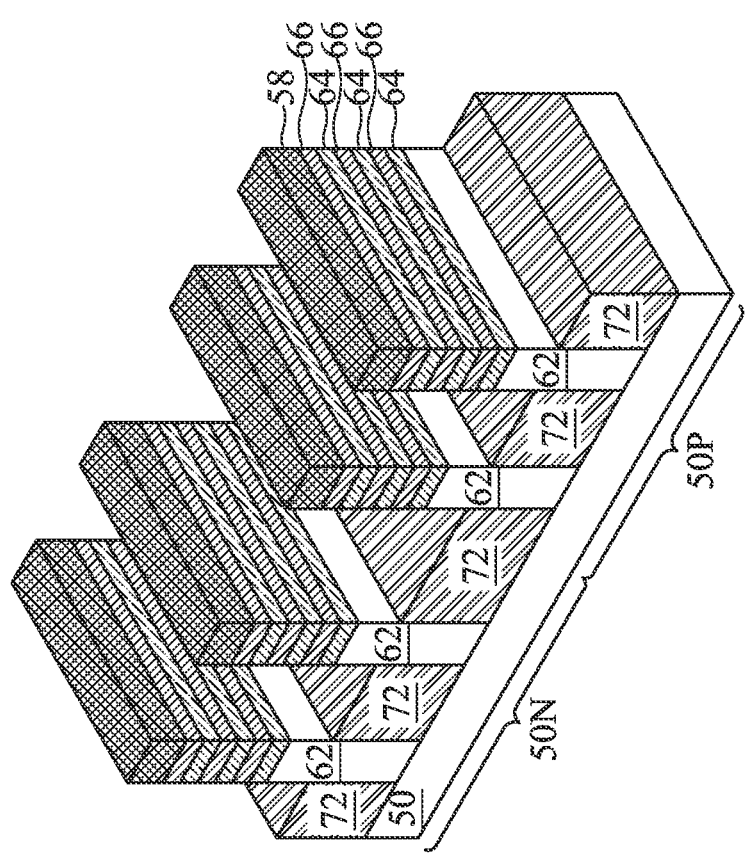

FIGS. 2-25E are views of intermediate stages in the manufacturing of nano-FETs, in accordance with some embodiments. FIGS. 2, 3, and 4 are three-dimensional views. FIGS. 5A, 6A, 7A, 8A, 13A, 14A, 15A, 16A, 17A, 18A, 19A, 20A, 21A, 22A, 23A, 24A, and 25A are cross-sectional views illustrated along a similar cross-section as reference cross-section A-A' in FIG. 1. FIGS. 5B, 5C, 6B, 6C, 7B, 7C, 8B, 8C, 8D, 8E, 8F, 9A, 9B, 10A, 10B, 11A, 11B, 12A, 12B, 13B, 13C, 13D, 13E, 13F, 14B, 14C, 14D, 14E, 15B, 16B, 17B, 18B, 19B, 20B, 21B, 22B, 23B, 24B, 25B, 25D, 25E, and 25F are cross-sectional views illustrated along a similar cross-section as reference cross-section B-B' in FIG. 1. FIGS. 15C, 16C, 17C, 18C, 19C, 20C, 21C, 22C, 23C, 24C, and 25C are cross-sectional views illustrated along a similar cross-section as reference cross-section C-C' in FIG. 1.

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in each of the n-type region 50N and the p-type region 50P. The APT region may extend under the source/drain regions in the nano-FETs. The APT region may be used to reduce the leakage from the source/drain regions to the substrate 50. In some embodiments, the doping concentration in the APT region is in the range of $10^{18}$ cm$^{-3}$ to $10^{19}$ cm$^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56. For example, the multi-layer stack 52 may include from one to ten layers of each of the first semiconductor layers 54 and the second semiconductor layers 56.

In the illustrated embodiment, and as will be subsequently described in greater detail, the first semiconductor layers 54 will be removed and the second semiconductor layers 56 will patterned to form channel regions for the nano-FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nano-FETs in one region (e.g., the p-type region 50P), and the second semiconductor layers 56 will be patterned to form channel regions for nano-FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P. Each of the layers may have a small thickness, such as a thickness in a range of 5 nm to 30 nm.

In FIG. 3, trenches are patterned in the substrate 50 and the multi-layer stack 52 to form semiconductor fins 62, nanostructures 64, and nanostructures 66. The semiconductor fins 62 are semiconductor strips patterned in the substrate 50. The nanostructures 64 and the nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The semiconductor fins 62 and the nanostructures 64, 66 may be patterned by any suitable method. For example, the semiconductor fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask 58 to pattern the semiconductor fins 62 and the nanostructures 64, 66.

In some embodiments, the semiconductor fins 62 and the nanostructures 64, 66 each have widths in a range of 8 nm to 40 nm. In the illustrated embodiment, the semiconductor fins 62 and the nanostructures 64, 66 have substantially equal widths in the n-type region 50N and the p-type region 50P. In another embodiment, the semiconductor fins 62 and the nanostructures 64, 66 in one region (e.g., the n-type region 50N) are wider or narrower than the semiconductor fins 62 and the nanostructures 64, 66 in another region (e.g., the p-type region 50P).

In FIG. 4, STI regions 72 are formed over the substrate 50 and between adjacent semiconductor fins 62. The STI regions 72 are disposed around at least a portion of the semiconductor fins 62 such that at least a portion of the nanostructures 64, 66 protrude from between adjacent STI regions 72. In the illustrated embodiment, the top surfaces of the STI regions 72 are below the top surfaces of the semiconductor fins 62. In some embodiments, the top surfaces of the STI regions 72 are above or coplanar (within process variations) with the top surfaces of the semiconductor fins 62.

The STI regions 72 may be formed by any suitable method. For example, an insulation material can be formed over the substrate 50 and the nanostructures 64, 66, and between adjacent semiconductor fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 72 are each illustrated as a single layer, some embodiments may utilize multiple layers. For example, in some embodiments a liner (not separately illustrated) may first be formed along surfaces of the substrate 50, the semiconductor fins 62, and the nanostructures 64, 66. Thereafter, an insulation material, such as those previously described may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. In some embodiments, the planarization process may expose the mask 58 or remove the mask 58. After the planarization process, the top surfaces of the insulation material and the mask 58 or the nanostructures 64, 66 are coplanar (within process variations). Accordingly, the top surfaces of the mask 58 (if present) or the nanostructures 64, 66 are exposed through the insulation material. In the illustrated embodiment, the mask 58 remains on the nanostructures 64, 66. The insulation material is then recessed to form the STI regions 72. The insulation material is recessed such that at least a portion of the nanostructures 64, 66 protrude from between adjacent portions of the insulation material. Further, the top surfaces of the STI regions 72 may have a flat surface as illustrated, a convex surface, a concave surface (such as dishing), or a combination thereof by applying an appropriate etch. The insulation material may be recessed using any acceptable etching process, such as one that is selective to the material of the insulation material (e.g., selectively etches the insulation material of the STI regions 72 at a faster rate than the materials of the semiconductor fins 62 and the nanostructures 64, 66). For example, an oxide removal may be performed using dilute hydrofluoric (dHF) acid.

The process previously described is just one example of how the semiconductor fins 62 and the nanostructures 64, 66 may be formed. In some embodiments, the semiconductor fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the semiconductor fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the semiconductor fins 62, and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using mask (not separately illustrated) such as a photoresist. For example, a photoresist may be formed over the semiconductor fins 62, the nanostructures 64, 66, and the STI regions 72 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ cm$^{-3}$ to $10^{14}$ cm$^{-3}$. After the implant, the photoresist may be removed, such as by any acceptable ashing process.

Following or prior to the implanting of the p-type region 50P, a mask (not separately illustrated) such as a photoresist is formed over the semiconductor fins 62, the nanostructures 64, 66, and the STI regions 72 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ cm$^{-3}$ to $10^{14}$ cm$^{-3}$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the semiconductor fins 62 and/or the nanostructures 64, 66, the grown materials may be in situ doped during growth, which may obviate the implantations, although in situ and implantation doping may be used together.

FIGS. 5A-25E illustrate various additional steps in the manufacturing of embodiment devices. FIGS. 5A-25F illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure. As will be subsequently described in greater detail, insulating fins 82 will be formed between the semiconductor fins 62. FIGS. 5A, 6A, 7A, 8A, 13A, 14A, 15A, 16A, 17A, 18A, 19A, 20A, 21A, 22A, 23A, 24A, and 25A illustrate a semiconductor fin 62 and structures formed on it. FIGS. 5B, 5C, 6B, 6C, 7B, 7C, 8B, 8C, 8D, 8E, 9A, 9B, 10A, 10B, 11A, 11B, 12A, 12B, 13B, 13C, 13D, 13E, 14B, 14C, 14D, 14E, 15B, 15C, 16B, 16C, 17B, 17C, 18B, 18C, 19B, 19C 20B, 20C, 21B, 21C, 22B, 22C, 23B, 23C, 24B, 24C, 25B, and 25C each illustrate two semiconductor fins 62 and portions of the insulating fins 82 and the STI regions 72 that are disposed between the two semiconductor fins 62 in the respective cross-sections. FIGS. 8F, 13F, and 25D each illustrate four semiconductor fins 62 and portions of the insulating fins 82 and the STI regions 72 that are disposed between the four semiconductor fins 62 in the respective cross-sections.

Figure 5C:
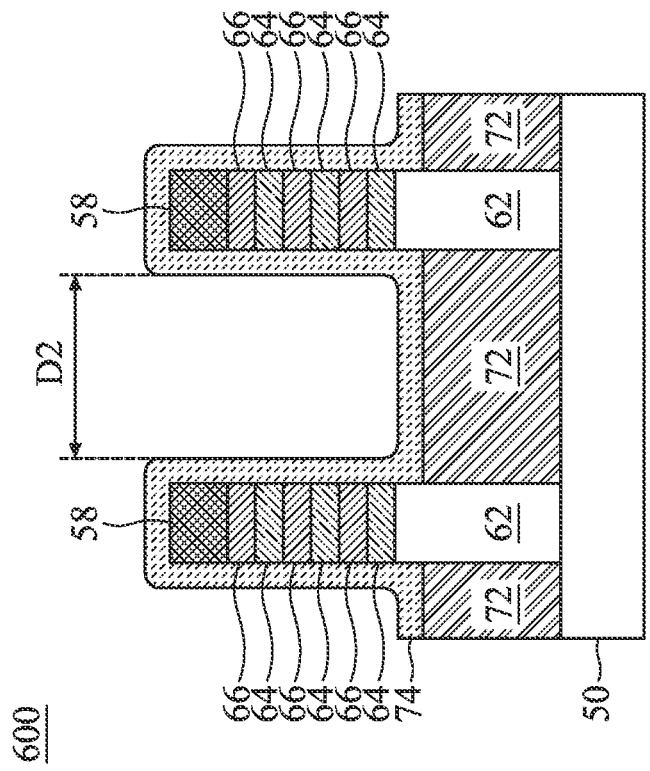
Figure 5B:
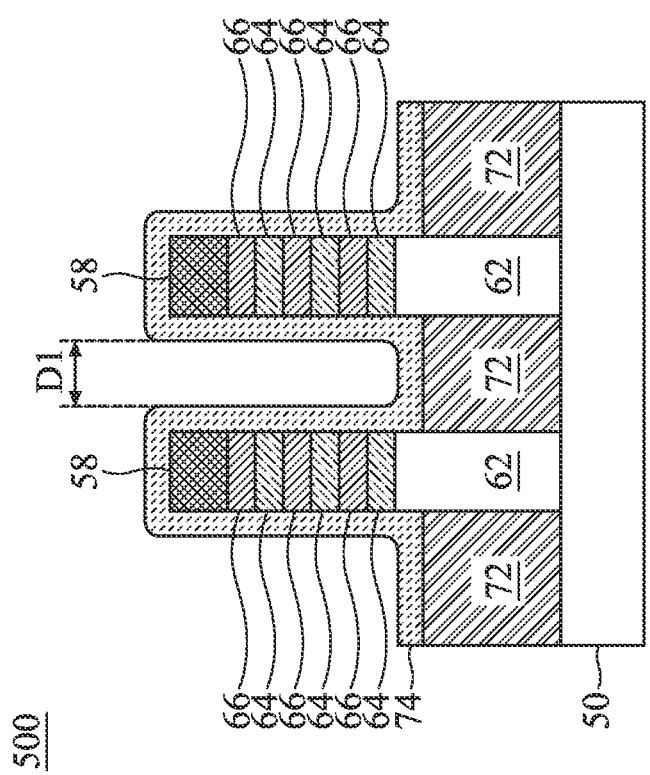

FIG. 5A illustrates a semiconductor fin 62, FIG. 5B illustrates two semiconductor fins 62 in a dense area 500 of the substrate 50, and FIG. 5C illustrates two semiconductor fins 62 in a sparse area 600 of the substrate 50. The dense area 500 may include n-type regions 50N and p-type regions 50P (not separately illustrated). In some embodiments, widths of the semiconductor fins 62 in the n-type region 50N of the dense area 500 may be greater or thinner than the semiconductor fins 62 in the p-type region 50P of the dense area 500, and widths of the semiconductor fins 62 in the n-type region 50N of the sparse area 600 may be greater or thinner than the semiconductor fins 62 in the p-type region 50P of the sparse area 600. Further, while each of the semiconductor fins 62 and the nanostructures 64, 66 are illustrated as having a consistent width throughout, in other embodiments, the semiconductor fins 62 and/or the nanostructures 64, 66 may have tapered sidewalls such that a width of each of the semiconductor fins 62 and/or the nanostructures 64, 66 continuously increases in a direction towards the substrate 50. In such embodiments, each of the nanostructures 64, 66 may have a different width and be trapezoidal in shape. In some embodiments, the semiconductor fins 62 in the dense area 500 are separated by a distance D1 in a range of 20 nm to 40 nm. The sparse area 600 may include n-type regions 50N and p-type regions 50P (not separately illustrated). In some embodiments, the semiconductor fins 62 in the sparse area 600 are separated by a distance D2 in a range of 40 nm to 600 nm.

In FIGS. 5A-5C, a sacrificial layer 74 is conformally formed over the mask 58 (if present), the semiconductor fins 62, the nanostructures 64, 66, and the STI regions 72. The sacrificial layer 74 may be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. For example, the sacrificial layer 74 may be formed of silicon or silicon germanium.

Figure 6B:
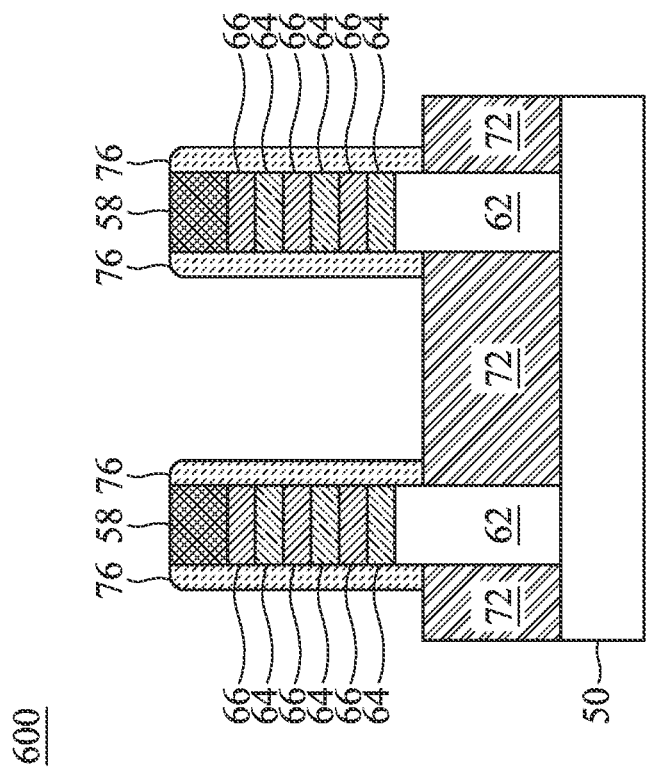
Figure 6C:
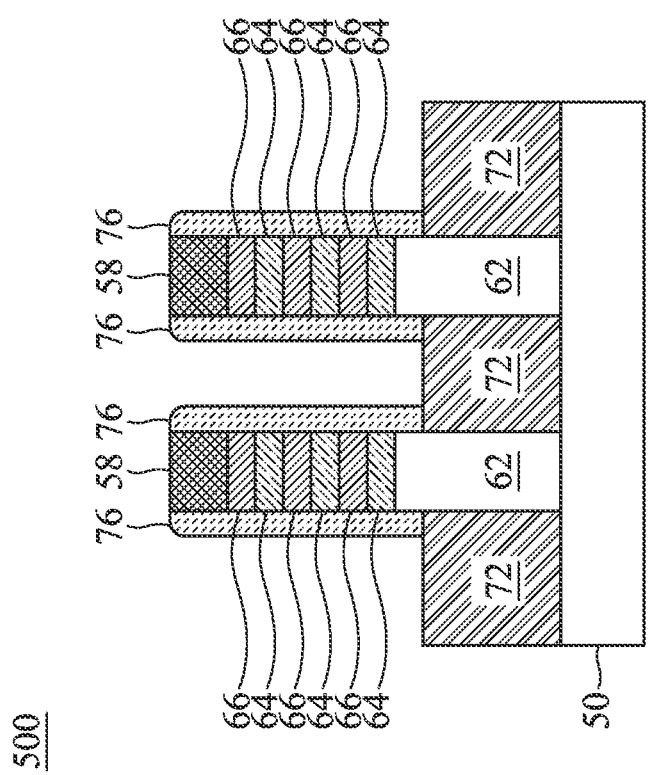

In FIGS. 6A-6C, the sacrificial layer 74 is patterned to form sacrificial spacers 76 around the mask 58 (if present), the semiconductor fins 62, and the nanostructures 64, 66. The sacrificial spacers 76 are disposed over the STI regions 72. The sacrificial layer 74, when patterned, has portions left on the sidewalls of the mask 58 (if present), the semiconductor fins 62, and the nanostructures 64, 66 (thus forming the sacrificial spacers 76). The sacrificial spacers 76 cover the sidewalls of the nanostructures 64, 66 that will be exposed in subsequent processing to form channel regions. The sacrificial spacers 76 are used as temporary spacers during processing, and will subsequently be removed to expose sidewalls of the portions of the nanostructures 66 that will act as channel regions for the nano-FETs. Specifically, in the illustrated embodiment, the sacrificial spacers 76 and the nanostructures 64 will be subsequently removed and replaced with gate structures that are wrapped around the nanostructures 66. The sacrificial spacers 76 are formed of a material that has a high etching selectivity from the etching of the material of the nanostructures 66. The sacrificial spacers 76 may be formed of the same semiconductor material as the nanostructures 64, or may be formed of a different material. In subsequent process steps, a dummy gate layer 84 may be deposited over portions of the sacrificial spacers 76 (see below, FIGS. 15A-15C), and the dummy gate layer 84 may be patterned to provide dummy gates 94 that include underlying portions of the sacrificial spacers 76 (see below, FIGS. 16A-16C). These dummy gates 94 (e.g., patterned portions of the dummy gate layer 84 and portions of the sacrificial spacers 76) may then be subsequently replaced with a functional gate stack.

In FIGS. 6A-6C, a first etching process is performed to initially pattern the sacrificial layer 74 (see FIGS. 5A-5B) into the sacrificial spacers 76. The portions of the sacrificial layer 74 over the mask 58 (if present) or the nanostructures 64, 66 are removed by the first etching process. The sacrificial spacers 76 along nanostructures 64, 66 may be patterned so that the STI regions 72 between the nanostructures 64, 66 are exposed, as illustrated by FIGS. 6A-6B. The first etching process may be a dry etch, a wet etch, the like, or a combination thereof. The first etching process may be anisotropic. In some embodiments, top portions of the exposed STI regions 72 are recessed to a depth below a bottom surface of the sacrificial spacers 76 (see below, FIG. 8F). Further, the amount of recessing of each of the STI regions 72 between pairs of the semiconductor fins 62 may vary (see below, FIG. 8F).

FIGS. 7A through 14E illustrate a formation of insulating fins 82 (also referred to as hybrid fins or dielectric fins) between the sacrificial spacers 76 adjacent to the semiconductor fins 62 and nanostructures 64, 66. The insulating fins 82 may insulate subsequently formed source/drain regions (see below, FIGS. 18A and 18C) from each other.

Figure 7A:
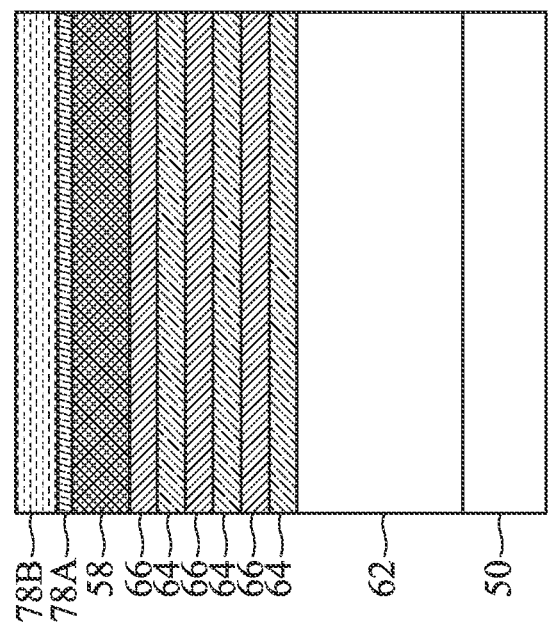
Figure 7B:
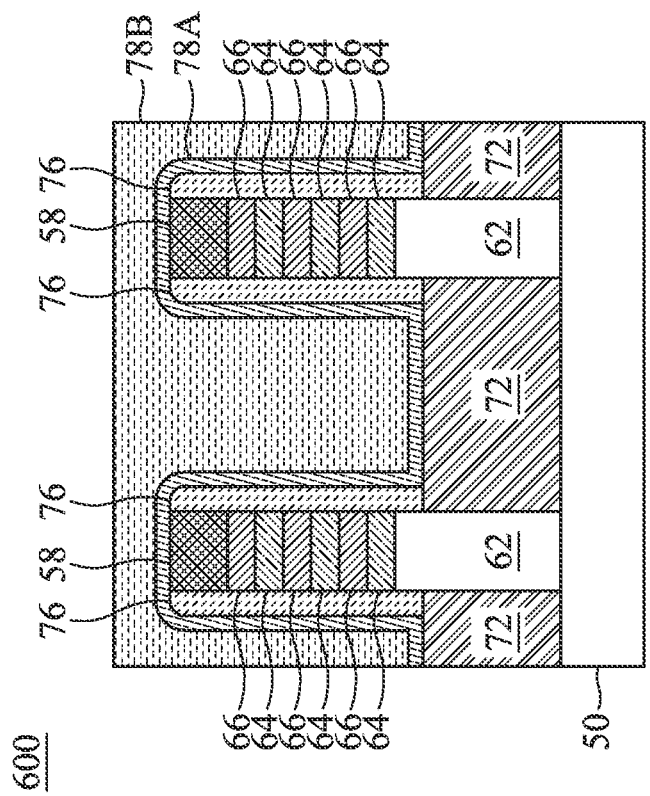
Figure 7C:
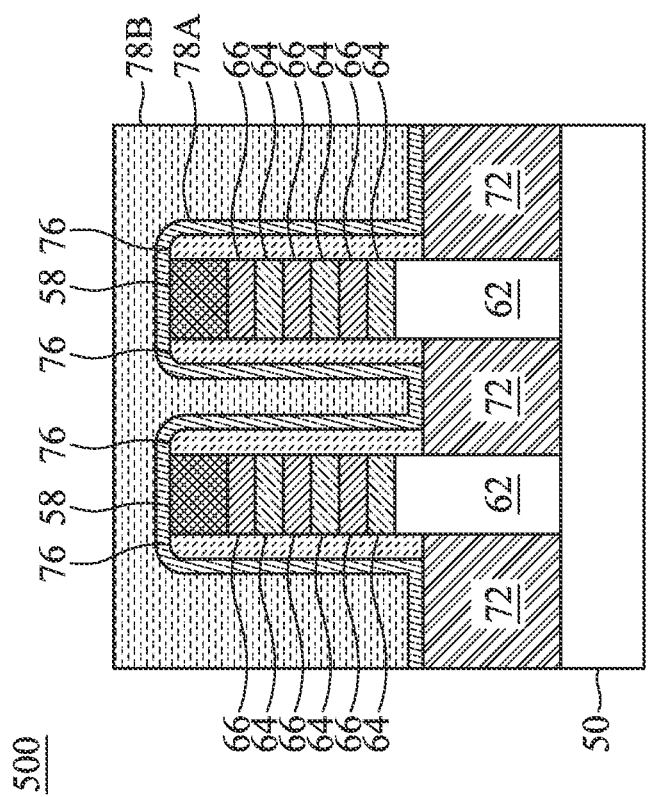

In FIGS. 7A-7C, a liner 78A and a fill material 78B are formed over the structure. The liner 78A is conformally deposited over exposed surfaces of the STI regions 72, the masks 58, the semiconductor fins 62, the nanostructures 64, 66, and the sacrificial spacers 76 by an acceptable deposition process such as atomic layer deposition (ALD), chemical vapor deposition (CVD), low-pressure chemical vapor deposition (LPCVD), plasma-enhanced chemical vapor deposition (PECVD), flowable chemical vapor deposition (FCVD), molecular-beam deposition (MBD), physical vapor deposition (PVD), or the like. The liner 78A may be formed of one or more dielectric material(s) having a high etching selectivity from the etching of the semiconductor fins 62, the nanostructures 64, 66, and the sacrificial spacers 76, e.g. a nitride such as silicon nitride, silicon carbonitride, silicon oxycarbonitride, or the like. The liner 78A may reduce oxidation of the sacrificial spacers 76 during the subsequent formation of the fill material 78B (see below, FIGS. 8A and 8B), which may be useful for a subsequent removal of the sacrificial spacers 76.

Next, a fill material 78B is formed over the liner 78A, filling the remaining area between the semiconductor fins 62 and the nanostructures 64, 66 that is not filled by the sacrificial spacers 76 or the liner 78A, and may be formed over the top surfaces of the mask 58 (if present) or the nanostructures 64, 66. The fill material 78B may form the bulk of the lower portions of the insulating fins 82 (see FIGS. 14A-14D) to insulate subsequently formed source/drain regions (see below, FIG. 18B) from each other. The fill material 78B may be formed by an acceptable deposition process such as ALD, CVD, LPCVD, PECVD, FCVD, MBD, PVD, or the like. The fill material 78B may be formed of one or more dielectric material(s) having a high etching selectivity from the etching of the semiconductor fins 62, the nanostructures 64, 66, and the sacrificial spacers 76, such as an oxide such as silicon oxide, silicon oxynitride, silicon oxycarbonitride, silicon oxycarbide, or the like; or combinations thereof.

Figure 8A:
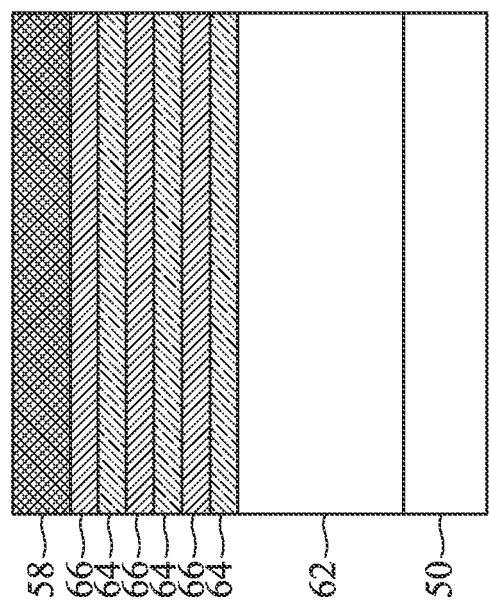
Figure 8C:
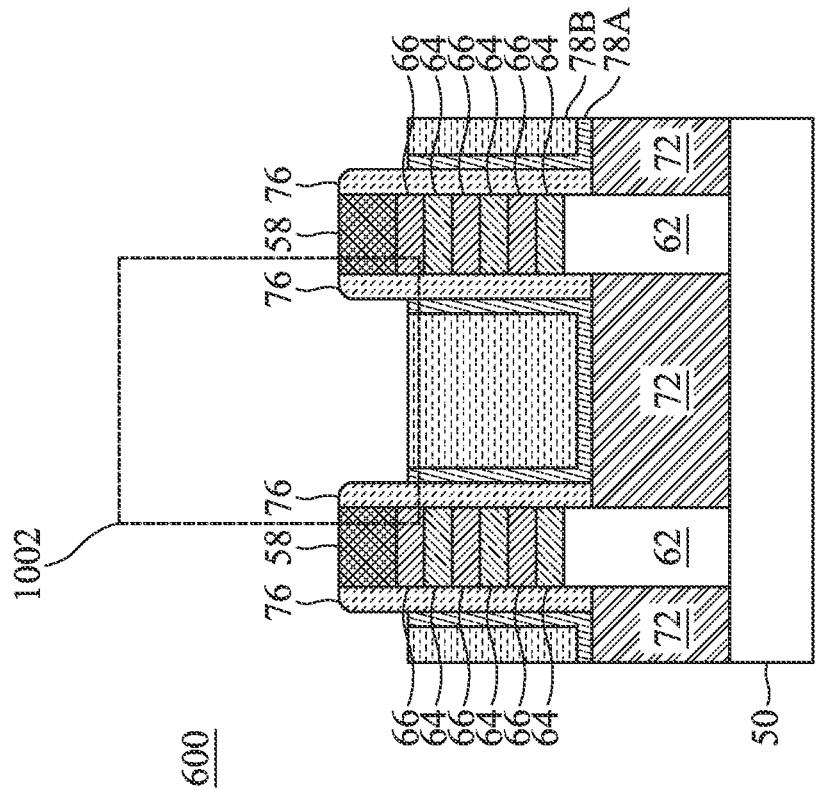
Figure 8B:
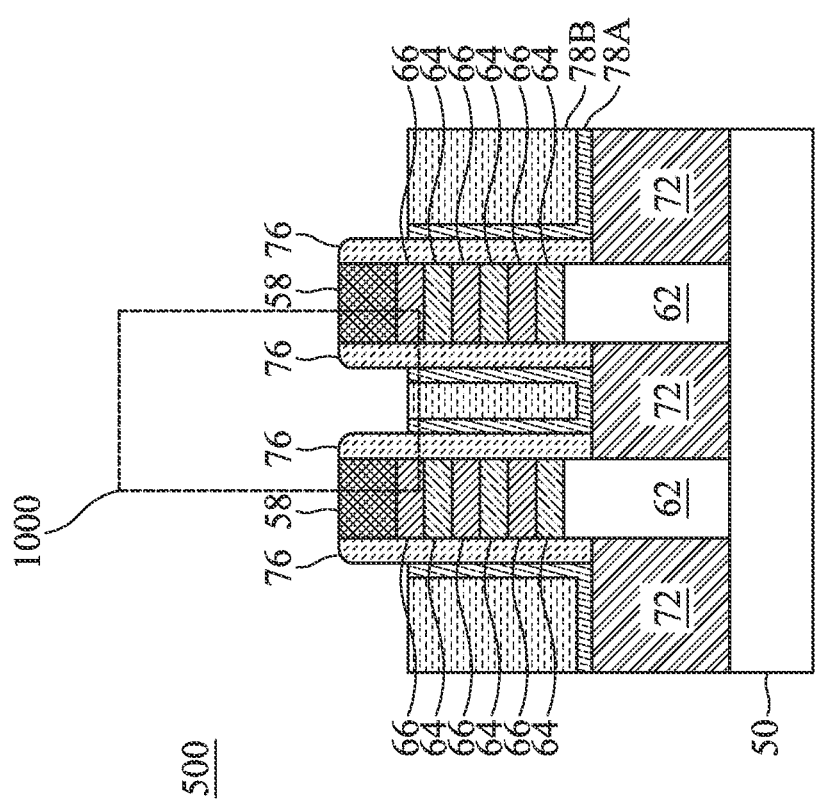
Figure 8E:
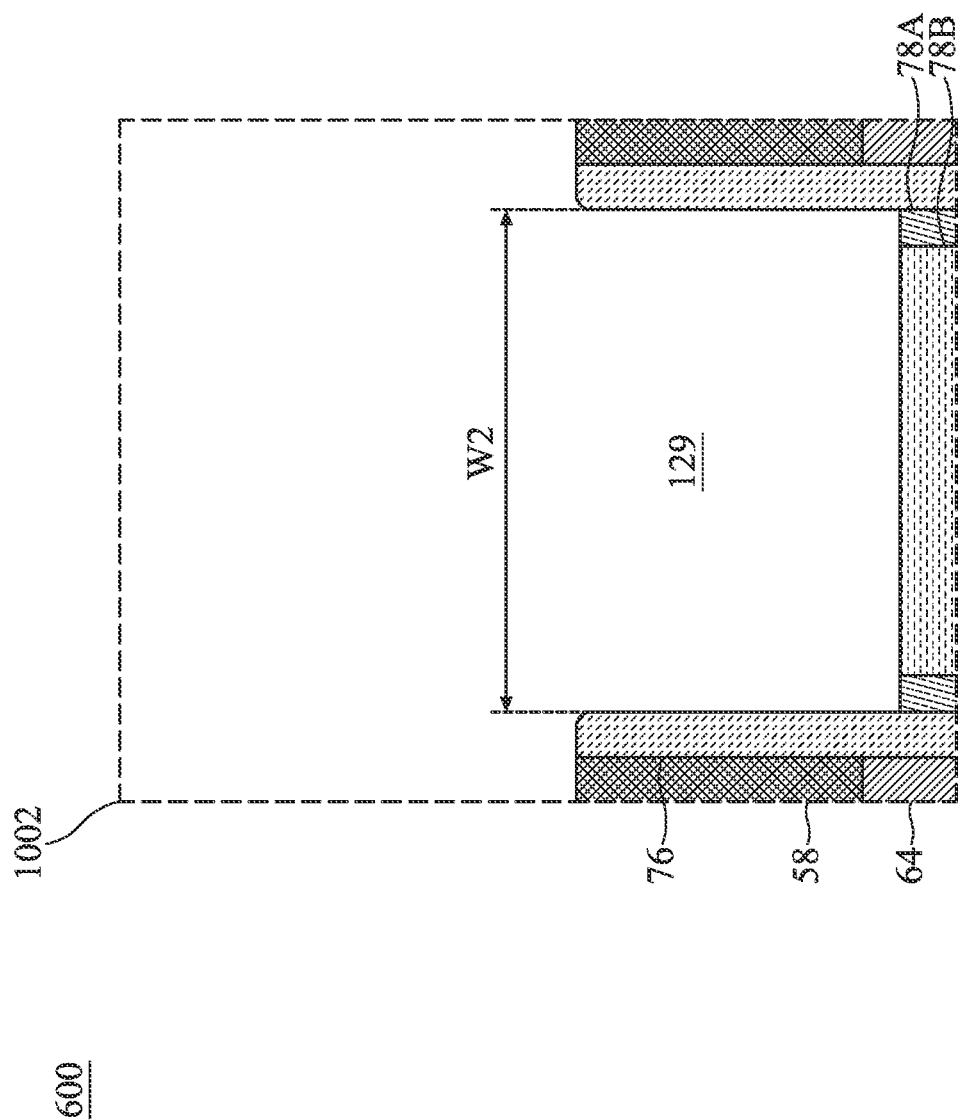
Figure 8F:
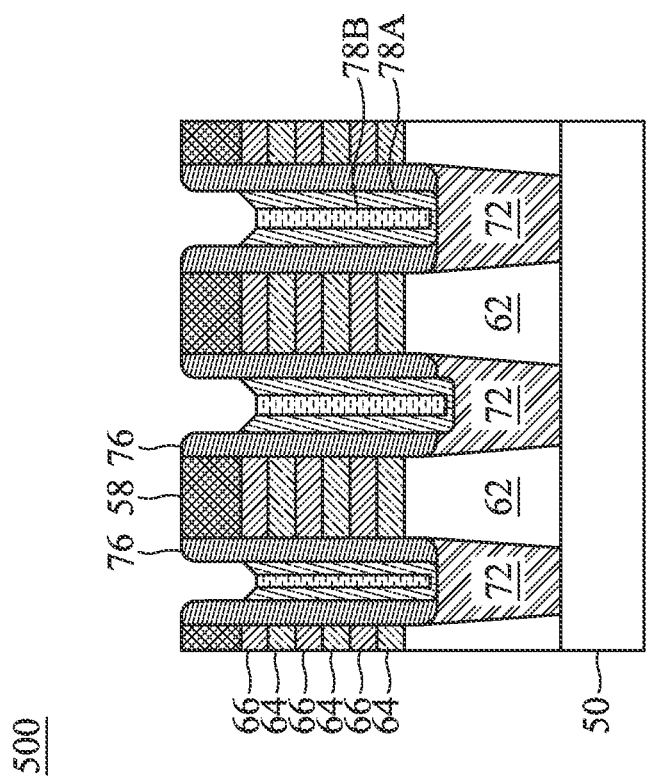

In FIGS. 8A-8E, upper portions of the liner 78A and the fill material 78B above top surfaces of the masks 58 may be removed using one or more acceptable planarization and/or etching processes, such as one that is selective to liner 78A and the fill material 78B (e.g., selectively etches the material (s) of the liner 78A and the fill material 78B at a faster rate than the material(s) of the sacrificial spacers 76). After etching, top surfaces of the liner 78A and the fill material 78B may be below top surfaces of the mask 58 (if present) and/or top surfaces of the nanostructures 64, 66, and openings 127, 129 are defined in a region above the liner 78A and fill material 78B and between adjacent sacrificial spacers 76. The openings 127 are located in the dense area 500, and the openings 129 are located in the sparse area 600. FIG. 8D illustrates a detailed view of region 1000 of the dense area 500 illustrated in FIG. 8B, and FIG. 8E illustrates a detailed view of region 1002 of the sparse area 600 illustrated in FIG. 8C. The openings 129 may be wider than the openings 127. In some embodiments, openings 127 between opposite sidewalls of the sacrificial spacers 76 in the dense area 500 have a width W1 in a range of 20 nm to 40 nm, and openings 129 between opposite sidewalls of the sacrificial spacers 76 over the semiconductor fins 62 in the sparse area 600 have a width W2 in a range of 40 nm to 600 nm.

FIG. 8F illustrates a detailed view of a region of the dense area 500 with four semiconductor fins 62 and three STI regions 72 disposed between them, in accordance with some embodiments. Remaining portions of the liner 78A and the fill material 78B are disposed between adjacent pairs of semiconductor fins 62. The amount of recessing of each of the STI regions 72 between the adjacent pairs of the semiconductor fins 62 may vary. In some embodiments, a top surface of an STI region 72 is recessed (see above, FIGS. 6A-6C) and the liner 78A and/or the fill material 78B extend below a top surface of the STI region 72. Further, as illustrated in FIG. 8F, top surfaces of the liner 78A and/or the fill material 78B may have a concave profile due to the removal of the upper portions of the liner 78A and the fill material 78B described above.

FIGS. 9A through 13E illustrate the forming of upper dielectric layers 80 on the liner 78A and the fill material 78B in order to form top portions of the insulating fins 82. The upper dielectric layers 80 may comprise alternating high-k dielectric layers 80A, 80C, 80E, 80G, 80I, and 80K, and capping layers 80B, 80D, 80F, 80H, and 80J, which may reduce extrusion defects resulting from local grain growth on top surfaces of the insulating fins 82. Using alternating high-k dielectric layers and capping layers may also improve control of film quality and the polish rate of a subsequent CMP (see below, FIGS. 14A-14E) by increasing film uniformity. As an example, FIGS. 9A through 13E illustrate the upper dielectric layers 80 comprising six high-k dielectric layers and five capping layers. However, any suitable number of alternating high-k dielectric layers and capping layers may be formed.

Figure 9A:
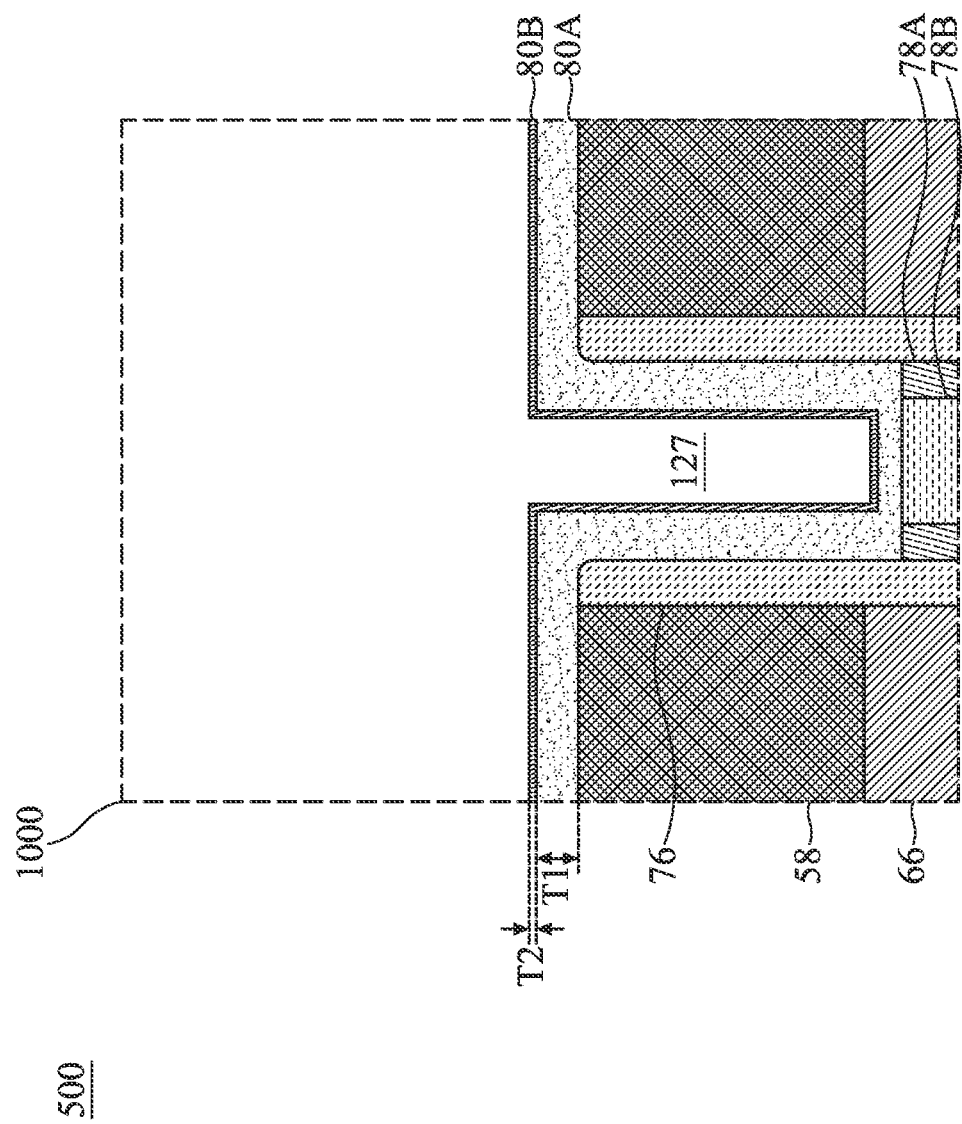

In FIGS. 9A-9B, a first high-k dielectric layer 80A and a first capping layer 80B are formed over the liner 78A, the fill material 78B, and the sacrificial spacers 76 over the semiconductor fins 62 in the opening 127 of the dense area 500 and in the opening 129 of the sparse area 600. FIG. 9A illustrates a view of region 1000 as following from FIG. 8D and FIG. 9B illustrates a view of region 1002 as following from FIG. 8E. The first high-k dielectric layer 80A may be formed of a high-k dielectric material (e.g., those having a k-value of greater than about 7) such as hafnium oxide, zirconium oxide, zirconium aluminum oxide, hafnium aluminum oxide, hafnium silicon oxide, aluminum oxide, or the like; or combinations thereof, which may be deposited by a conformal deposition process such as by CVD, ALD, or the like. In some embodiments, the liner 78A and the fill material 78B are formed of the same or a similar material as the masks 58, so the material of the first high-k dielectric layer 80A is chosen to have an etching selectivity with the material of the liner 78A and the fill material 78B. This may protect the liner 78A and the fill material 78B from a subsequent process to remove the masks 58 (see below, FIG. 21B). In some embodiments, the first high-k dielectric layer 80A is deposited in a substantially amorphous state, and the first high-k dielectric layer 80 may be subsequently crystallized by an anneal (see below, FIGS. 14A-14E).

In some embodiments, the first high-k dielectric layer 80A is formed to a first thickness T1 in a range of 3 nm to 12 nm, which may be advantageous for depositing the first high-k dielectric layer 80A with relatively uniform film characteristics and quality (e.g., uniformly amorphous) without forming extrusion defects. Forming the first high-k dielectric layer 80A to a thickness less than 3 nm may be disadvantageous by leading to insufficient crystallization of the first high-k dielectric layer 80A in subsequent annealing processes (see below, FIGS. 14A-14E). Forming the first high-k dielectric layer 80A to a thickness greater than 12 nm may be disadvantageous for leading to extrusion defects from local grain growth of the material of the first high-k dielectric layer 80A.

Next, a first capping layer 80B is formed over the first high-k dielectric layer 80A. The first capping layer 80B reduces extrusion defects that may occur on top surfaces of the first high-k dielectric layer 80A by inhibiting local grain growth of the material of the first high-k dielectric layer 80A. In some embodiments, the first capping layer 80B covers inner sidewalls of the first high-k dielectric layer 80A. The first capping layer 80B may be formed of an oxide, nitride, or carbide, such as silicon oxide, silicon dioxide, silicon nitride, silicon carbide, the like, or combinations thereof, which may be deposited by a conformal deposition process (such as one selected from the candidate methods of forming the fill material 78B; see above, FIGS. 7A-7C).

In some embodiments, the first capping layer 80B is formed to a second thickness T2 in a range of 0.5 nm to 2 nm, which may be advantageous for reducing extrusion defects. Forming the first capping layer 80B to a thickness less than 0.5 nm may lead to undesirable extrusion defects on a top surface of the upper dielectric layers 80. Forming the first capping layer 80B to a thickness greater than 2 nm may lead to an uneven top surface of the upper dielectric layers 80 and subsequent processing issues due to the etching rates of the material of the capping layers (e.g., the first capping layer 80B) and the material of the high-k dielectric layers (e.g., the first high-k dielectric layer 80A) being significantly different.

In some embodiments, a ratio of the second thickness T2 of the first capping layer 80B to the first thickness T1 of the first high-k dielectric layer 80A is in a range of 0.04 to 0.7 which may be advantageous for reducing extrusion defects. The ratio of T2:T1 being less than 0.04 may lead to undesirable extrusion defects on a top surface of the upper dielectric layers 80. The ratio of T2:T1 being greater than 0.7 may lead to an uneven top surface of the upper dielectric layers 80 and subsequent processing issues due to the etching rates of the first capping layer 80B and the first high-k dielectric layer 80A being significantly different.

Figure 10A:
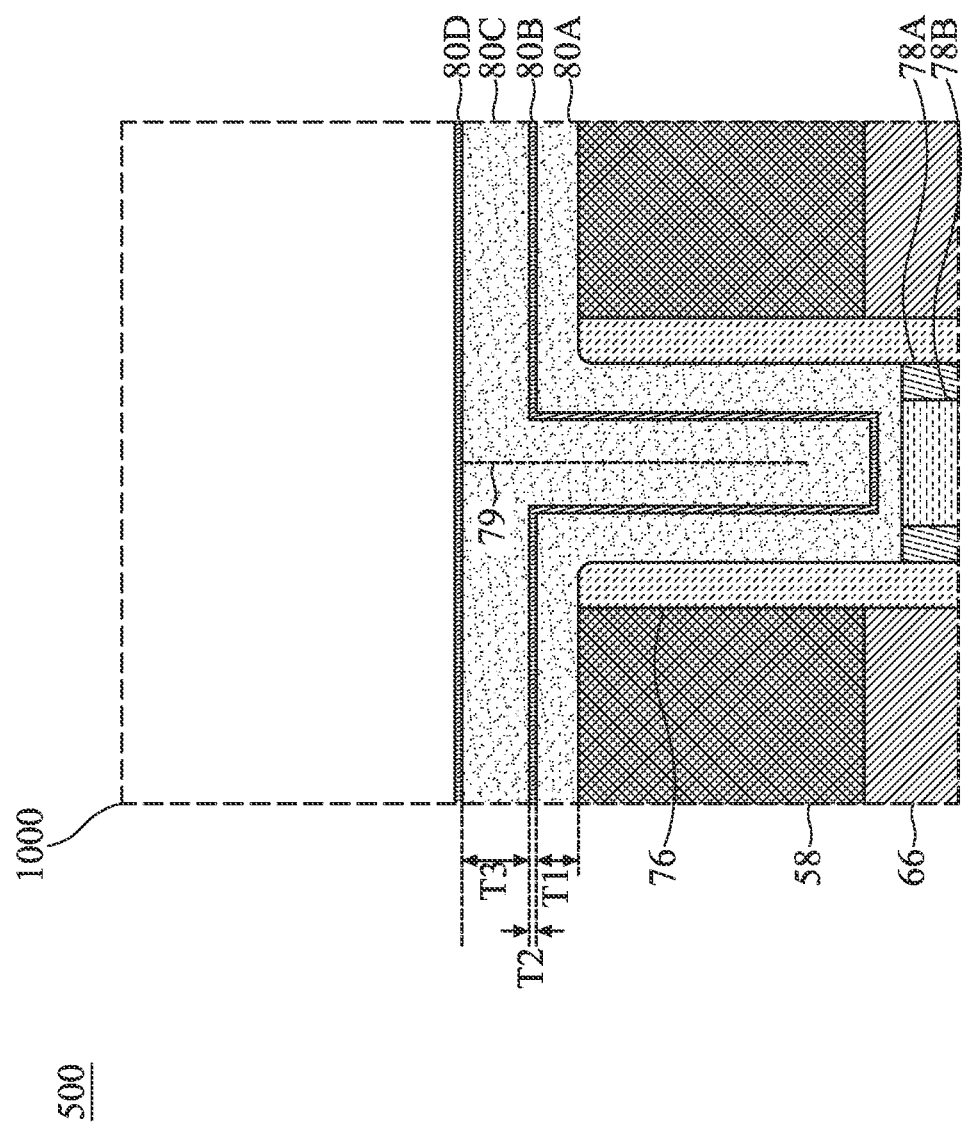
Figure 10B:
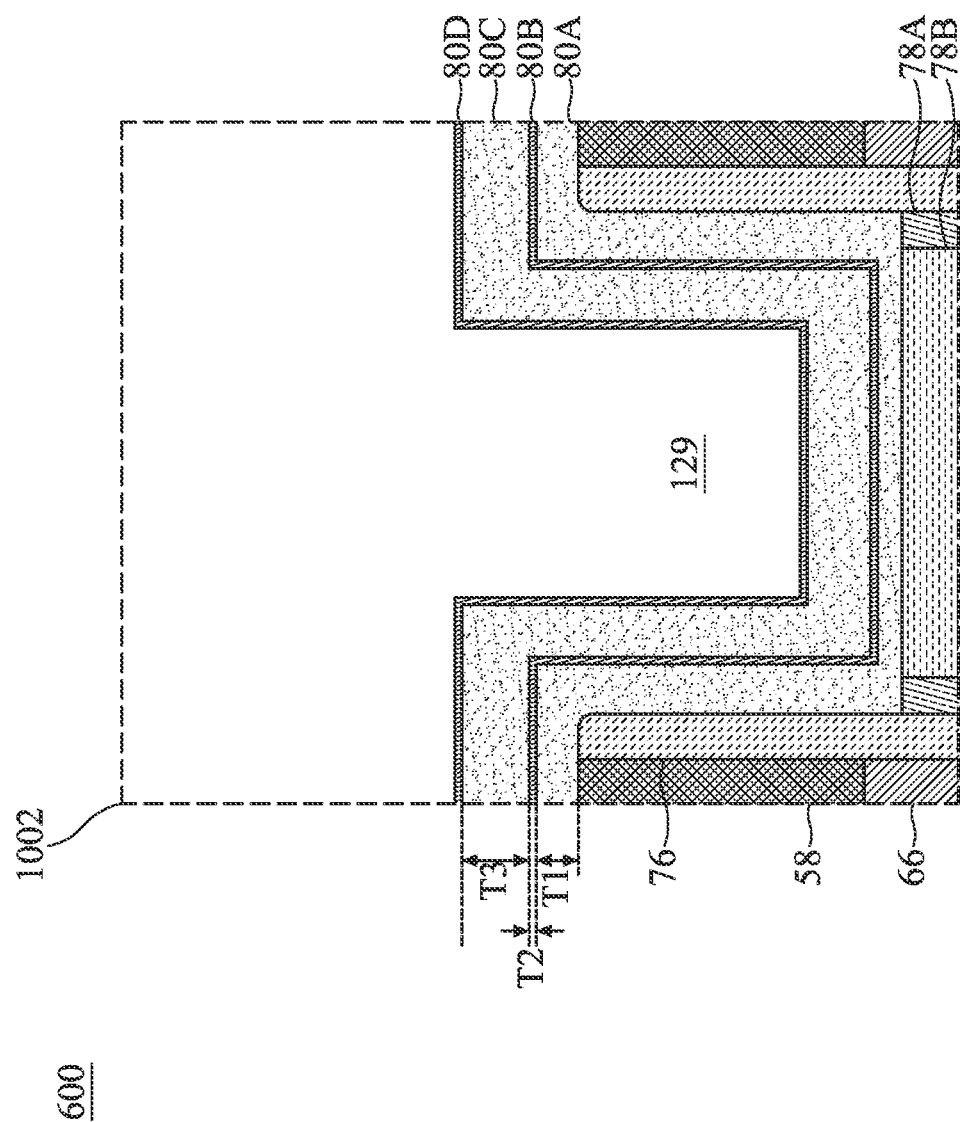

In FIGS. 10A-10B, a second high-k dielectric layer 80C and a second capping layer 80D are formed over the first capping layer 80B. The second high-k dielectric layer 80C may fill the openings 127 of the dense area 500. In some embodiments, outer sidewalls and a bottom surface of the second high-k dielectric layer 80C cover a portion of the first capping layer 80B, and portions of the second high-k dielectric layer 80C are interposed between respective sidewall portions of the first high-k dielectric layer 80A and respective sidewall portions of the first capping layer 80B. The second high-k dielectric layer 80C and the second capping layer 80D may be formed using the same materials and methods as the first high-k dielectric layer 80A and the first capping layer 80B, respectively, as described above in respect to FIGS. 9A-9B. In order to fill the opening 127 without forming voids due to early merging of a top surface of the second high-k dielectric layer 80C and/or merging of the first capping layer 80B, the first thickness T1 of the first high-k dielectric layer 80A and the second thickness T2 of the first capping layer 80B (see above, FIGS. 9A-9B) may be controlled to keep the aspect ratio of the opening 127 less than 2, prior to forming the second high-k dielectric layer 80C. For example, when the width of the first openings 127 is in a range described previously, the first high-k dielectric layer 80A may be formed to a thickness in a range of 3 nm to 5 nm in order to reduce the formation of voids when the opening 127 is filled by the second high-k dielectric layer 80C or the undesired merging of the first capping layer 80B. In some embodiments, seams 79 are formed in the second high-k dielectric layer 80C due to the merging of the second high-k dielectric layer 80C to fill the first openings 127.

In some embodiments, the second high-k dielectric layer 80C is formed to a third thickness T3 in a range of 3 nm to 12 nm, which may be advantageous for depositing the first second high-k dielectric layer 80C with relatively uniform film characteristics and quality (e.g., uniformly amorphous) without forming extrusion defects. Forming the second high-k dielectric layer 80C to a thickness less than 3 nm may be disadvantageous by leading to insufficient crystallization of the second high-k dielectric layer 80C in subsequent processes (see below, FIGS. 14A-14E). Forming the second high-k dielectric layer 80C to a thickness greater than 12 nm may be disadvantageous for leading to extrusion defects from local grain growth of the material of the second high-k dielectric layer 80C. In some embodiments, the second capping layer 80D is formed to a fourth thickness T4 in a range of 0.5 nm to 2 nm, which may be advantageous for reducing extrusion defects. Forming the second capping layer 80D to a thickness less than 0.5 nm may lead to undesirable extrusion defects on a top surface of the upper dielectric layers 80. Forming the second capping layer 80D to a thickness greater than 2 nm may lead to an uneven top surface of the upper dielectric layers 80 and subsequent processing issues due to the etching rates of the material of the capping layers (e.g., the second capping layer 80D) and the material of the high-k dielectric layers (e.g., the second high-k dielectric layer 80C) being significantly different.

In some embodiments, a ratio of the fourth thickness T4 of the second capping layer 80D to the third thickness T3 of the second high-k dielectric layer 80C is in a range of 0.04 to 0.7, which may be advantageous for reducing extrusion defects. The ratio of T4:T3 being less than 0.04 may lead to undesirable extrusion defects on a top surface of the upper dielectric layers 80. The ratio of T4:T3 being greater than 0.7 may lead to an uneven top surface of the upper dielectric layers 80 and subsequent processing issues due to the etching rates of the second capping layer 80D and the second high-k dielectric layer 80C being significantly different.

Figure 11A:
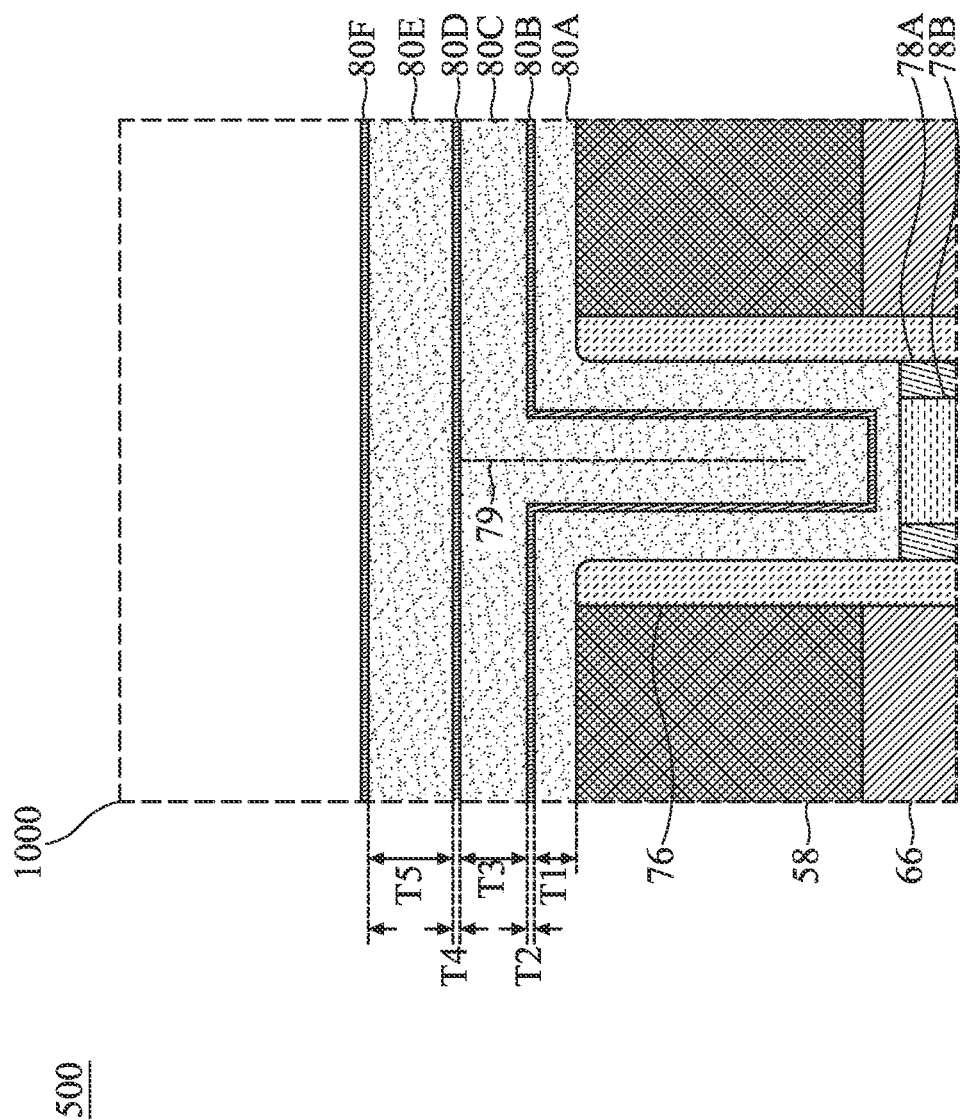
Figure 11B:
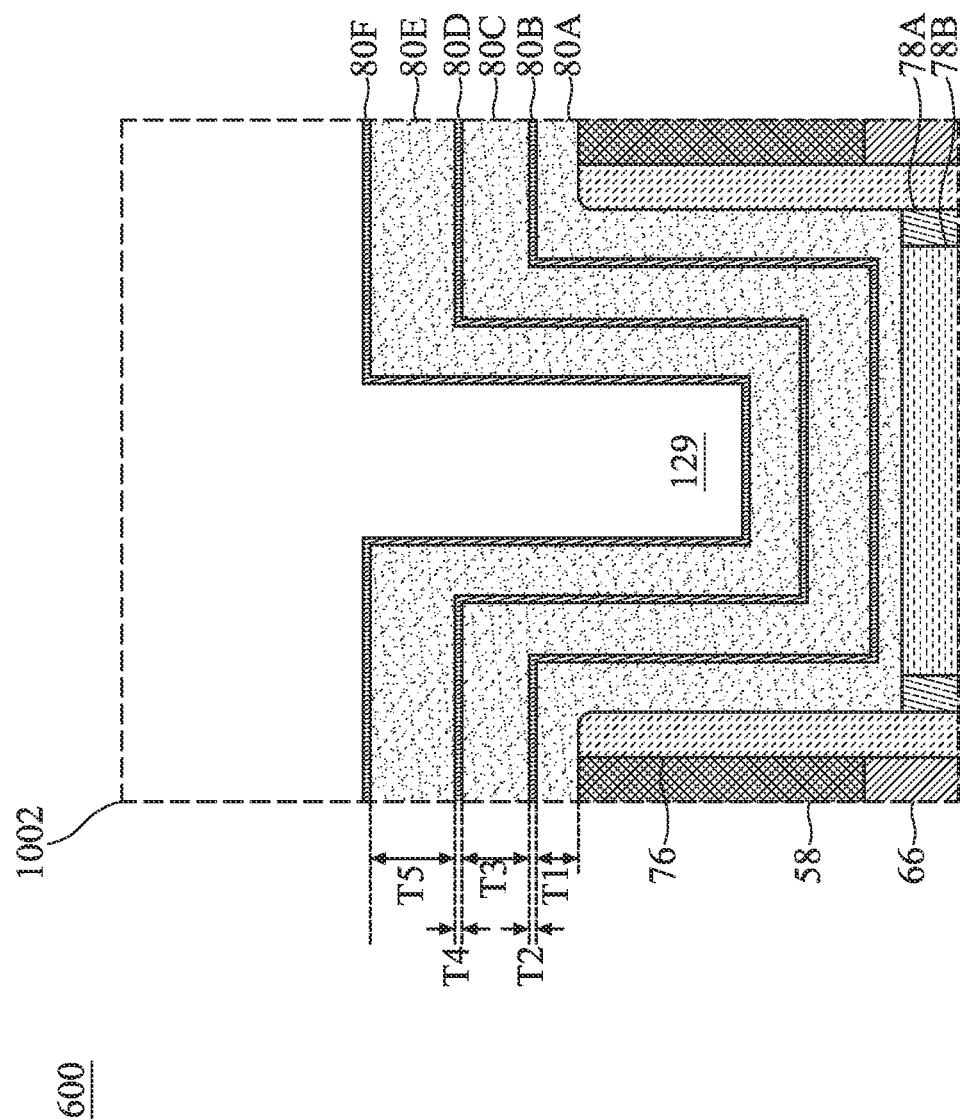

In FIGS. 11A-11B, a third high-k dielectric layer 80E and a third capping layer 80F are formed over the second capping layer 80D. The third high-k dielectric layer 80E and the third capping layer 80F may be formed using the same materials and methods as the first high-k dielectric layer 80A and the first capping layer 80B, respectively, as described above in respect to FIGS. 9A-9B. In some embodiments, the third high-k dielectric layer 80E is formed to a fifth thickness T5 in a range of 3 nm to 12 nm, which may be advantageous for depositing the third high-k dielectric layer 80E with relatively uniform film characteristics and quality (e.g., uniformly amorphous) without forming extrusion defects. Forming the third high-k dielectric layer 80E to a thickness less than 3 nm may be disadvantageous by leading to insufficient crystallization of the third high-k dielectric layer 80E in subsequent processes (see below, FIGS. 14A-14E). Forming the third high-k dielectric layer 80E to a thickness greater than 12 nm may be disadvantageous for leading to extrusion defects from local grain growth of the material of the third high-k dielectric layer 80E. In some embodiments, the third capping layer 80F is formed to a sixth thickness T6 in a range of 0.5 nm to 2 nm, which may be advantageous for reducing extrusion defects. Forming the third capping layer 80F to a thickness less than 0.5 nm may lead to undesirable extrusion defects on a top surface of the upper dielectric layers 80. Forming the third capping layer 80F to a thickness greater than 2 nm may lead to an uneven top surface of the upper dielectric layers 80 and subsequent processing issues due to the etching rates of the material of the capping layers (e.g., the third capping layer 80F) and the material of the high-k dielectric layers (e.g., the third high-k dielectric layer 80E) being significantly different.

In some embodiments, a ratio of the sixth thickness T6 of the third capping layer 80F to the fifth thickness T5 of the third high-k dielectric layer 80E is in a range of 0.04 to 0.7, which may be advantageous for reducing extrusion defects. The ratio of T6:T5 being less than 0.04 may lead to undesirable extrusion defects on a top surface of the upper dielectric layers 80. The ratio of T6:T5 being greater than 0.7 may lead to an uneven top surface of the upper dielectric layers 80 and subsequent processing issues due to the etching rates of the third capping layer 80F and the third high-k dielectric layer 80E being significantly different.

Figure 12A:
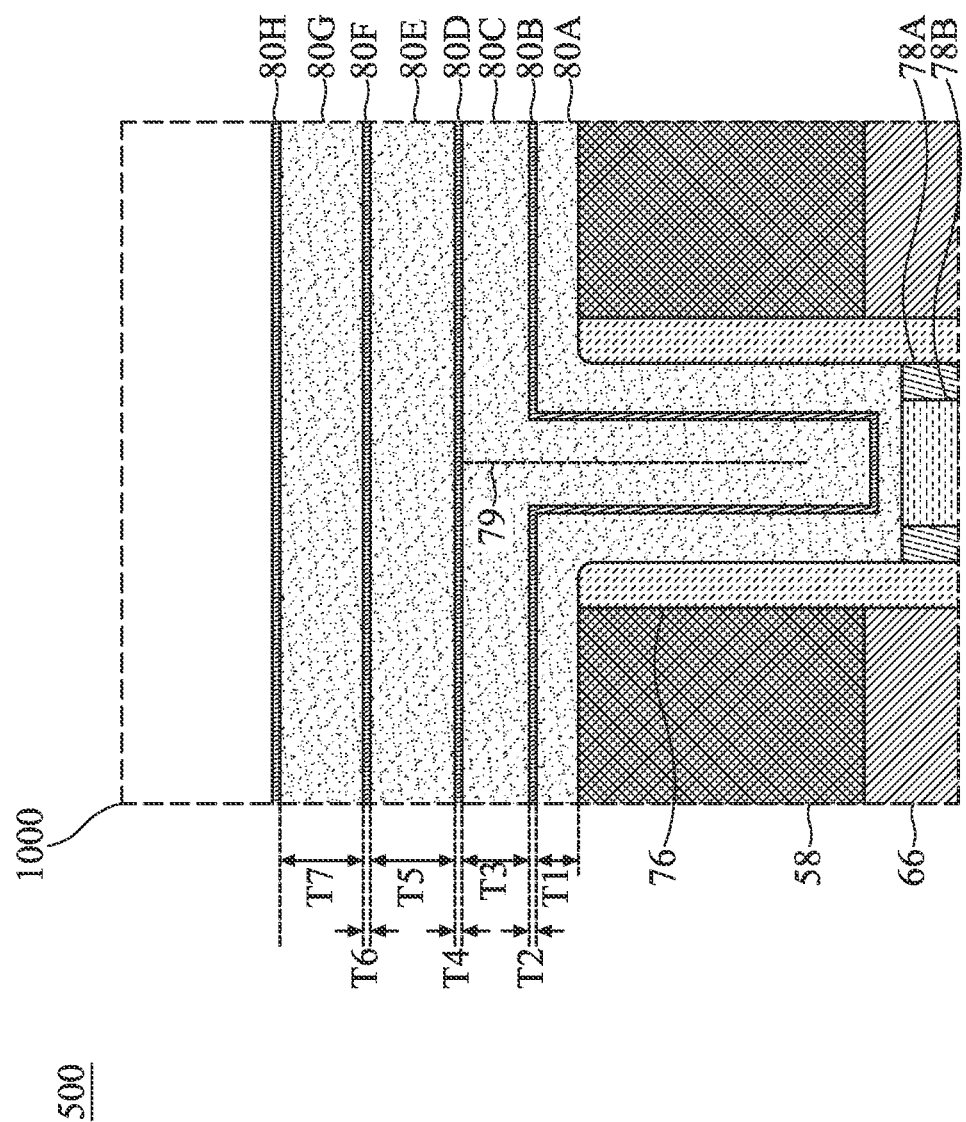
Figure 12B:
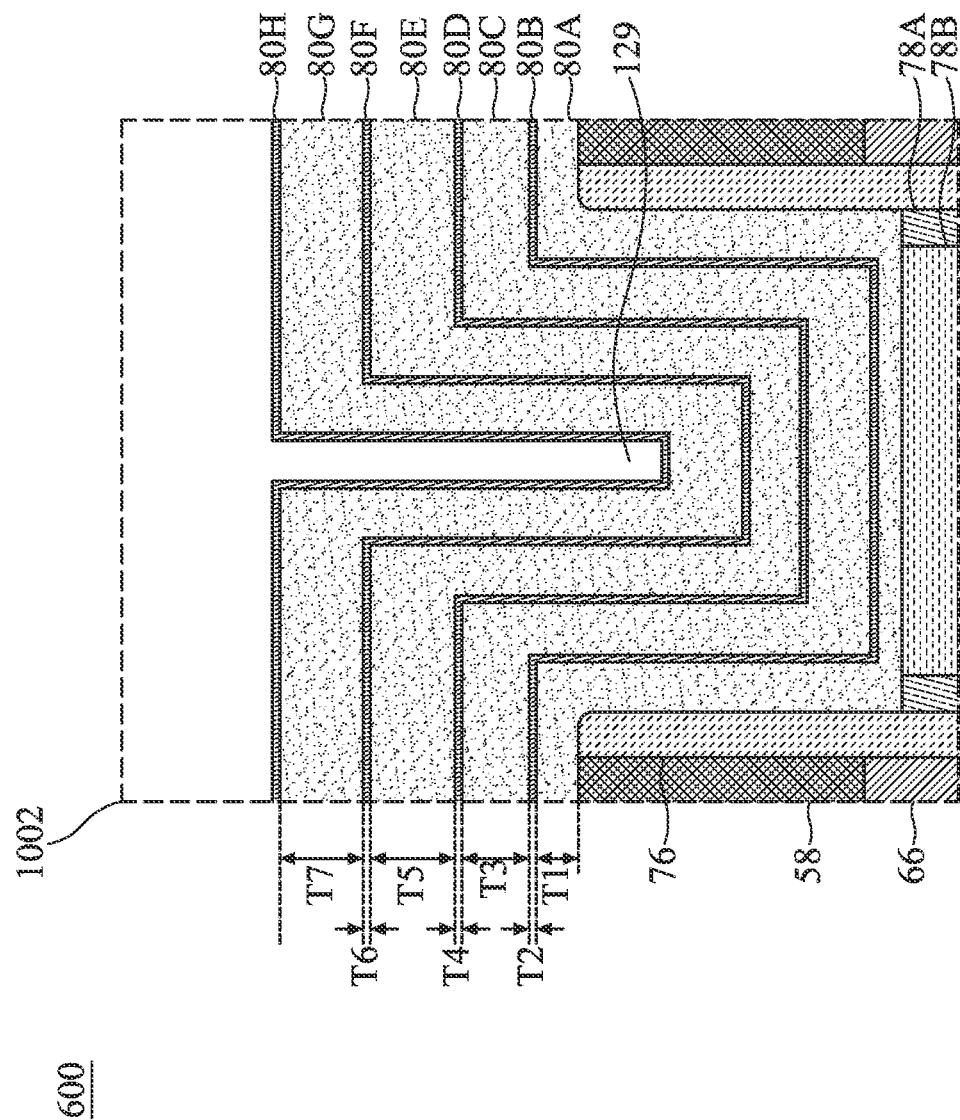
Figure 13A:
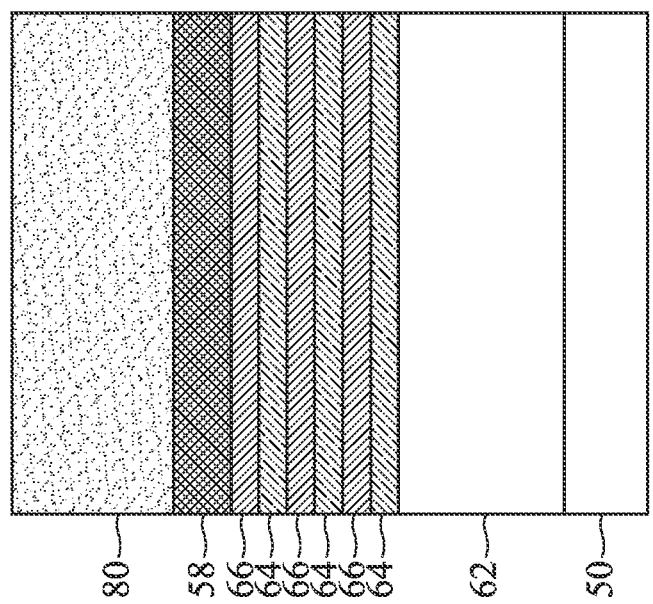
Figure 13D:
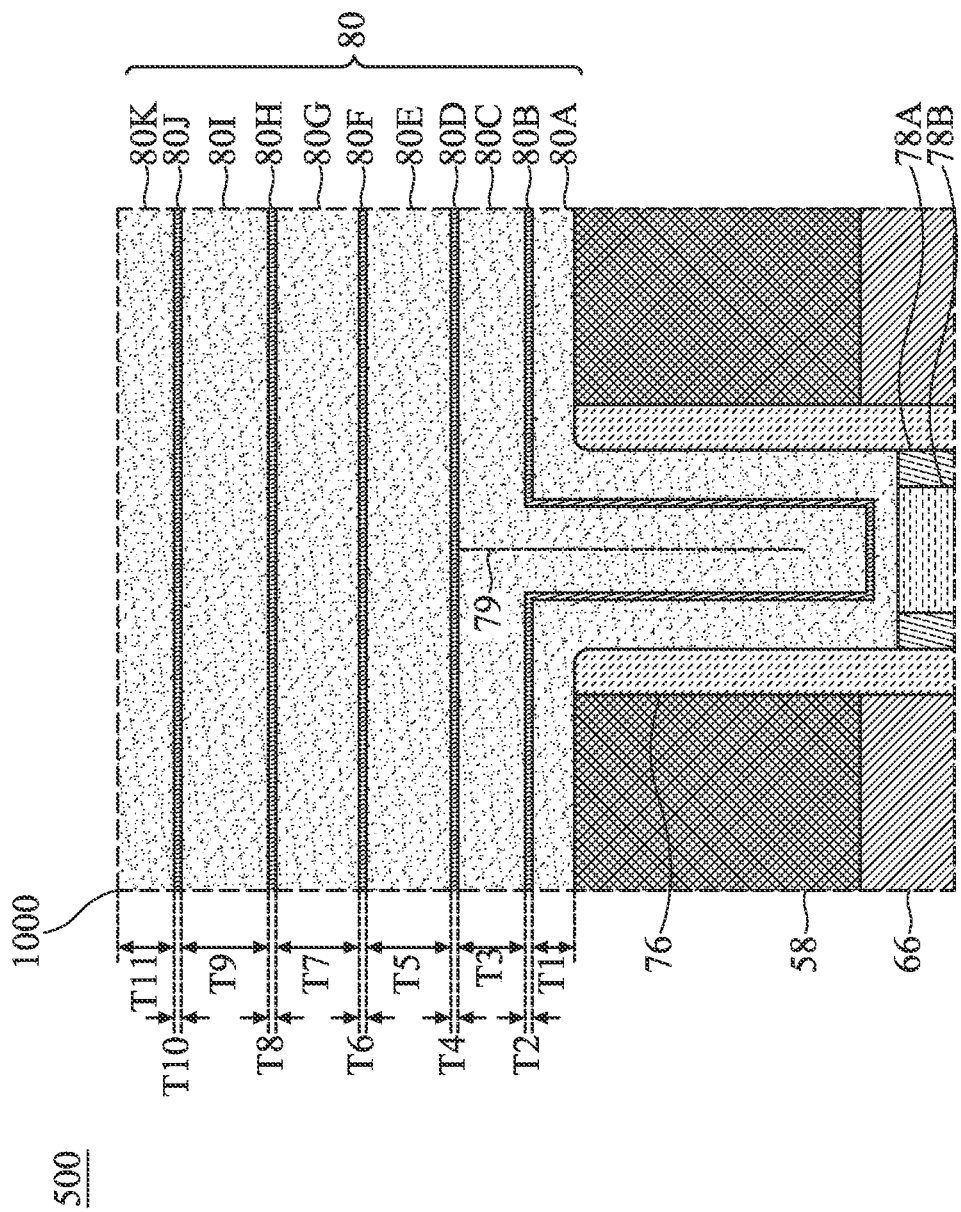
Figure 13E:
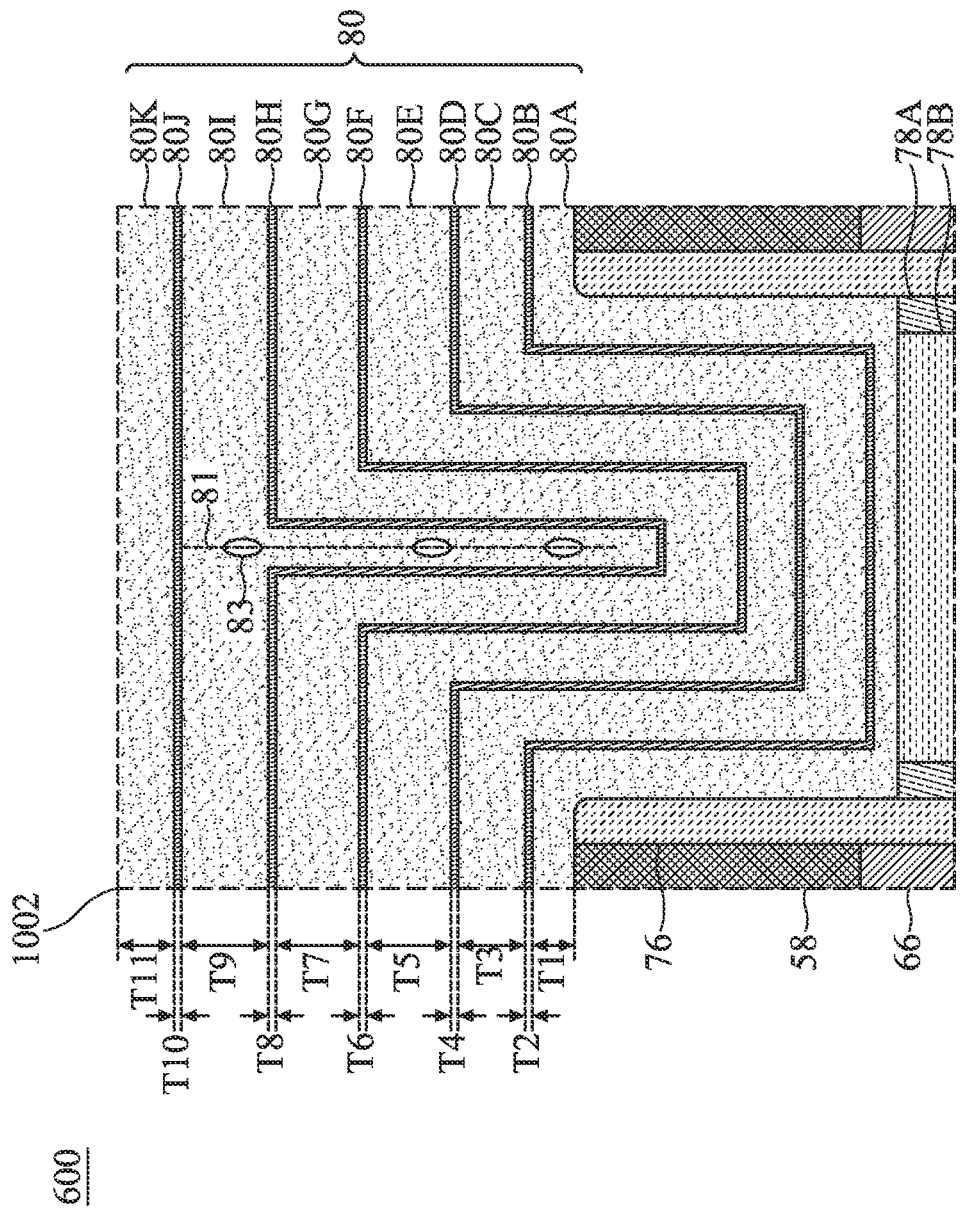
Figure 13F:
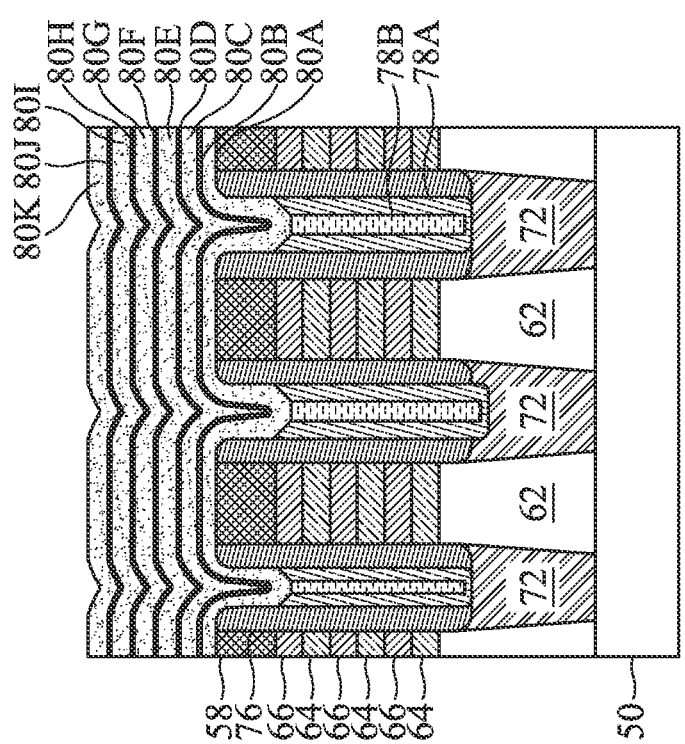
Figure 14A:
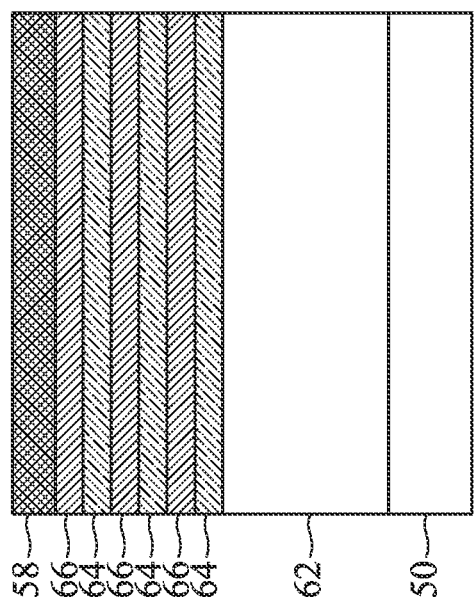
Figure 14C:
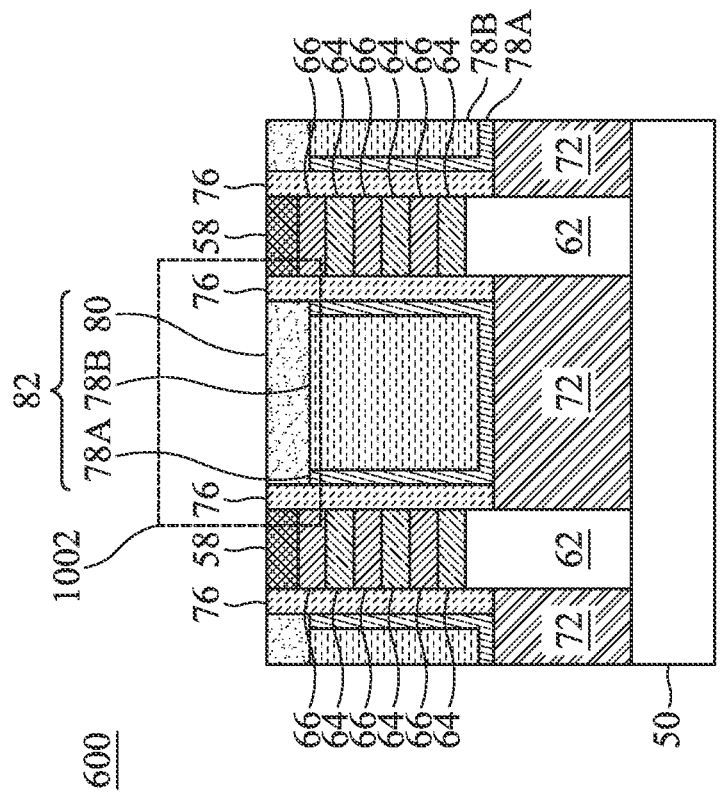
Figure 14B:
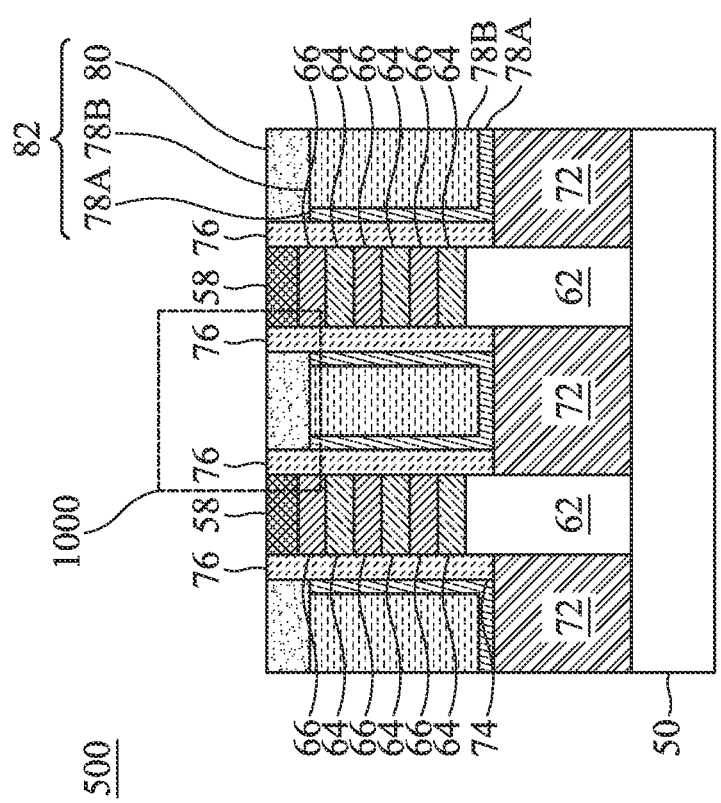
Figure 14E:
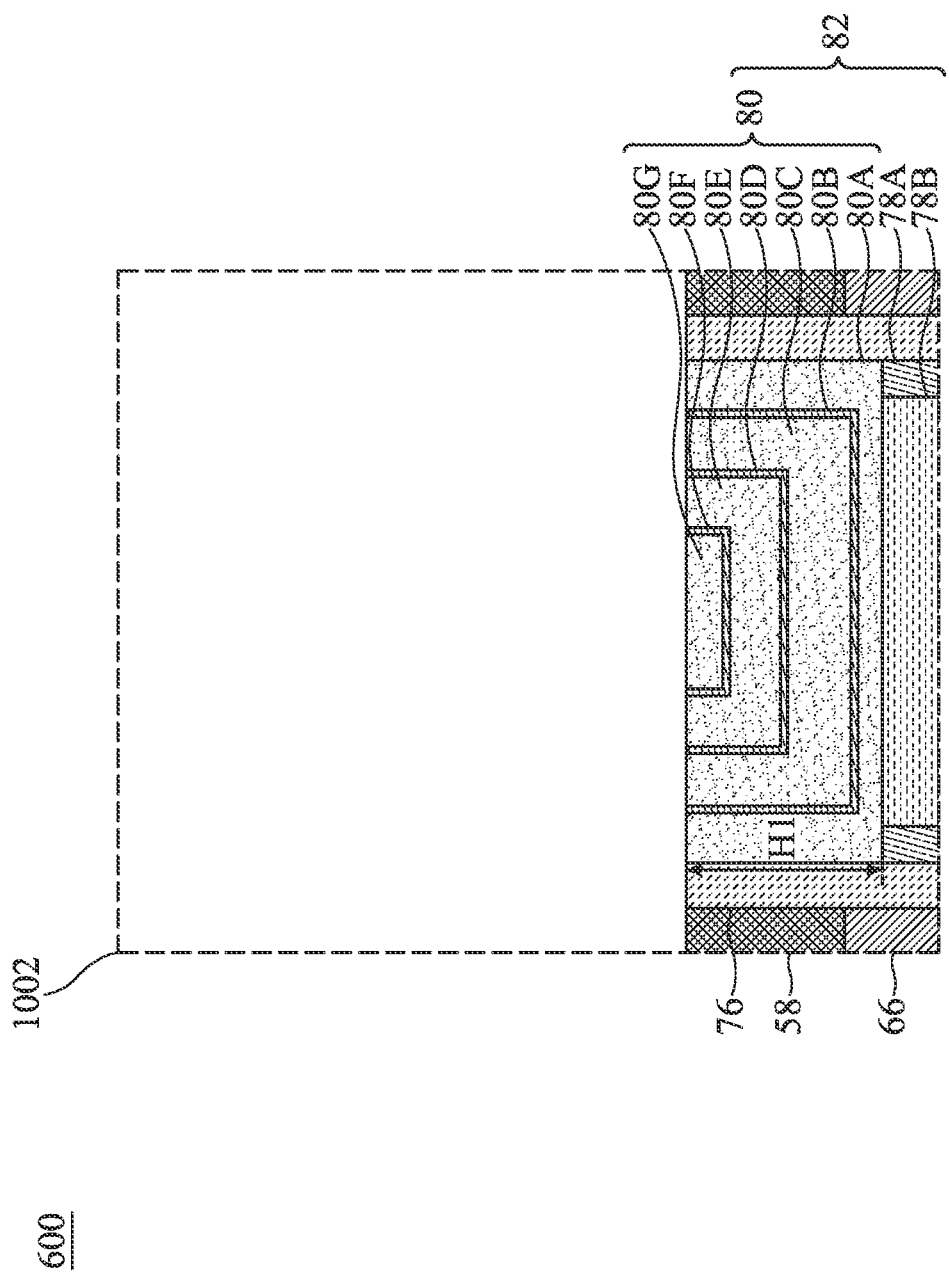

In FIGS. 12A-12B, a fourth high-k dielectric layer 80G and a fourth capping layer 80H are formed over the third capping layer 80F. In some embodiments, after forming the fourth high-k dielectric layer 80G and the fourth capping layer 80H, a bottom surface of the opening 129 is above a subsequent planarization of the structure (see below, FIGS. 14A-14E). In some embodiments, the fourth high-k dielectric layer 80G is formed to a seventh thickness T7 in a range of 3 nm to 12 nm, which may be advantageous for depositing the fourth high-k dielectric layer 80G with relatively uniform film characteristics and quality (e.g., uniformly amorphous) without forming extrusion defects. Forming the fourth high-k dielectric layer 80G to a thickness less than 3 nm may be disadvantageous by leading to insufficient crystallization of the fourth high-k dielectric layer 80G in subsequent processes (see below, FIGS. 14A-14E). Forming the fourth high-k dielectric layer 80G to a thickness greater than 12 nm may be disadvantageous for leading to extrusion defects from local grain growth of the material of the fourth high-k dielectric layer 80G. In some embodiments, the fourth capping layer 80H is formed to an eighth thickness T8 in a range of 0.5 nm to 2 nm, which may be advantageous for reducing extrusion defects. Forming the fourth capping layer 80H to a thickness less than 0.5 nm may lead to undesirable extrusion defects on a top surface of the upper dielectric layers 80. Forming the fourth capping layer 80H to a thickness greater than 2 nm may lead to an uneven top surface of the upper dielectric layers 80 and subsequent processing issues due to the etching rates of the material of the capping layers (e.g., the fourth capping layer 80H) and the material of the high-k dielectric layers (e.g., the fourth high-k dielectric layer 80G) being significantly different.

In some embodiments, a ratio of the eighth thickness T8 of the fourth capping layer 80H to the seventh thickness T7 of the fourth high-k dielectric layer 80G is in a range of 0.04 to 0.7, which may be advantageous for reducing extrusion defects. The ratio of T8:T7 being less than 0.04 may lead to undesirable extrusion defects on a top surface of the upper dielectric layers 80. The ratio of T8:T7 being greater than 0.7 may lead to an uneven top surface of the upper dielectric layers 80 and subsequent processing issues due to the etching rates of the fourth capping layer 80H and the fourth high-k dielectric layer 80G being significantly different.

In FIGS. 13A-13E, a fifth high-k dielectric layer 80I, a fifth capping layer 80J, and a sixth high-k dielectric layer 80K are formed over the fourth capping layer 80H. In some embodiments, the fifth high-k dielectric layer 80I, the fifth capping layer 80J, and the sixth high-k dielectric layer 80K fill and/or cover the opening 129 (see above, FIG. 12B). The fifth high-k dielectric layer 80I and the sixth high-k dielectric layer 80K may be formed using the same materials and methods as the first high-k dielectric layer 80A, and the fifth capping layer 80J may be formed using the same materials and methods as the first capping layer 80B, as described above in respect to FIGS. 9A-9B. In some embodiments, the fifth high-k dielectric layer 80I or the sixth high-k dielectric layer 80K merge during the filling process and seams 81 are formed due to the merging. Voids 83 may be formed along the seams 81 and may be removed by a subsequent planarization (see below, FIGS. 14A-14E). In some embodiments, the fifth high-k dielectric layer 80I is formed to a ninth thickness T9 in a range of 3 nm to 12 nm, which may be advantageous for depositing the fifth high-k dielectric layer 80I with relatively uniform film characteristics and quality (e.g., uniformly amorphous) without forming extrusion defects. Forming the fifth high-k dielectric layer 80I to a thickness less than 3 nm may be disadvantageous by leading to insufficient crystallization of the fifth high-k dielectric layer 80I in subsequent processes (see below, FIGS. 14A-14E). Forming the fifth high-k dielectric layer 80I to a thickness greater than 12 nm may be disadvantageous for leading to extrusion defects from local grain growth of the material of the fourth high-k dielectric layer 80I. In some embodiments, the fifth capping layer 80J is formed to a tenth thickness T10 in a range of 0.5 nm to 2 nm, which may be advantageous for reducing extrusion defects. Forming the fifth capping layer 80J to a thickness less than 0.5 nm may lead to undesirable extrusion defects on a top surface of the upper dielectric layers 80. Forming the fifth capping layer 80J to a thickness greater than 2 nm may lead to an uneven top surface of the upper dielectric layers 80 and subsequent processing issues due to the etching rates of the material of the capping layers (e.g., the fifth capping layer 80J) and the material of the high-k dielectric layers (e.g., the fifth high-k dielectric layer 80I) being significantly different.

In some embodiments, a ratio of the tenth thickness T10 of the fifth capping layer 80J to the ninth thickness T9 of the fifth high-k dielectric layer 80I is in a range of 0.04 to 0.7, which may be advantageous for reducing extrusion defects. The ratio of T10:T9 being less than 0.04 may lead to undesirable extrusion defects on a top surface of the upper dielectric layers 80. The ratio of T10:T9 being greater than 0.7 may lead to an uneven top surface of the upper dielectric layers 80 and subsequent processing issues due to the etching rates of the fifth capping layer 80J and the fifth high-k dielectric layer 80I being significantly different.

In some embodiments, the sixth high-k dielectric layer 80K is formed to an eleventh thickness T11 in a range of 3 nm to 12 nm, which may be advantageous for depositing the sixth high-k dielectric layer 80K with relatively uniform film characteristics and quality (e.g., uniformly amorphous) without forming extrusion defects. Forming the sixth high-k dielectric layer 80K to a thickness less than 3 nm may be disadvantageous by leading to insufficient crystallization of the sixth high-k dielectric layer 80K in subsequent processes (see below, FIGS. 14A-14E). Forming the sixth high-k dielectric layer 80K to a thickness greater than 12 nm may be disadvantageous for leading to extrusion defects from local grain growth of the material of the sixth high-k dielectric layer 80K.

FIG. 13F follows from FIG. 8F and illustrates a region of the dense area 500 with four semiconductor fins 62 and three STI regions 72 disposed between them, in accordance with some embodiments. Alternating high-k dielectric layers 80A, 80C, 80E, 80G, 80I, and 80K and capping layers 80B, 80D, 80F, 80H, and 80J are formed over the four semiconductor fins 62. However, any suitable number of alternating high-k dielectric layers and capping layers may be formed. In some embodiments, the first capping layer 80B extends below top surfaces of the top nanostructures 66. In some embodiments, the capping layers 80B, 80D, 80F, 80H, and 80J and the top high-k dielectric layer, e.g. the sixth high-k dielectric layer 80K have concave upper surfaces above the remaining portions of the liners 78A and fill material 78B.

In FIGS. 14A-14E, a removal process is applied to remove excess material(s) of the upper dielectric layers 80, the sacrificial spacers 76, and the masks 58 (if present) over the nanostructures 66. In some embodiments, a planarization process such as a chemical mechanical polish (CMP), an etch-back process, combinations thereof, or the like may be utilized. The alternating high-k dielectric layers and capping layers of the upper dielectric layers 80 may increase the film uniformity of the upper dielectric layers 80, which may improve control of the polish rate of the CMP. The planarization process exposes the masks 58 or the nanostructures 64, 66 such that top surfaces of, respectively, the masks 58 or the nanostructures 64, 66, the sacrificial spacers 76, and the upper dielectric layers 80 are coplanar (within process variations) after the planarization process is complete. In the illustrated embodiment, the masks 58 remain after the planarization process. In another embodiment, portions of or the entirety of the masks 58 may also be removed by the planarization process. The upper dielectric layers 80, when planarized, has portions left in the area between the semiconductor fins 62 and the nanostructures 64, 66 (thus forming the insulating fins 82 together with remaining portions of the liner 78A and the fill material 78B). In some embodiments, the planarization removes excess material(s) of the upper dielectric layers 80, the sacrificial spacers 76, and the masks 58 to a depth in a range of 21 nm to 23 nm. The planarization may be performed to a sufficient depth so that voids 83 and/or seams 81 in the upper dielectric layers 80 of the sparse area 600 are removed.

In some embodiments, the upper dielectric layers 80 have a height H1 in a range of 24 nm to 26 nm after the planarization, which is advantageous for protecting the liner 78A and the fill material 78B of the insulating fins 82 during a subsequent removal of the masks 58 (see below, FIGS. 21A-21B) and for removing voids 83 that may be present in the upper dielectric layers 80 above the height of the planarization. The upper dielectric layers 80 having a height less than 24 nm may lead to etching of the liner 78A and the fill material 78B, which may allow subsequently formed source/drain regions (see below, FIGS. 18A and 18C) to undesirably merge. The upper dielectric layers 80 having a height greater than 26 nm may lead to a top surface of the upper dielectric layers 80 being uneven due to voids 83 from incomplete filling of the openings 129 (see above, FIGS. 13A-13E) remaining in the upper dielectric layers 80 below the height of the planarization.

In some embodiments, an anneal is performed after the planarization of the upper dielectric layers 80 to improve properties of the upper dielectric layers 80. For example, in embodiments in which the high-k dielectric layers of the upper dielectric layers 80 comprise hafnium oxide, the anneal crystallizes amorphous hafnium oxide into crystalline hafnium oxide. The crystallized hafnium oxide of the upper dielectric layers 80 may protect the liner 78A and the fill material 78B during the subsequent removal of the masks 58 (see below, FIGS. 21A-21B). In some embodiments, the anneal is performed at a temperature in a range of 700° C. to 1000° C.

In embodiments in which a mask 58 remains on the nanostructures 64, 66, the removal process may expose the mask 58 or remove the mask 58. Further, in some embodiments, the mask 58 is removed by a separate process that is performed after the removal process. Any acceptable etch process, such as a dry etch, a wet etch, the like, or a combination thereof, may be performed to remove the mask 58. The etching may be anisotropic. In some embodiments where the mask 58 is removed, the removal process may (or may not) also recess the sacrificial spacers 76.

FIGS. 15A through 25F illustrate various additional steps in the manufacturing of embodiment devices and features. FIG. 15B is illustrated in the sparse area 600 as following from FIG. 14C for illustrative purposes. Substantially similar processes and materials may be used in the dense area 500 for semiconductor fins 62 and nanostructures 64, 66 separated by larger distances.

Figure 15A:
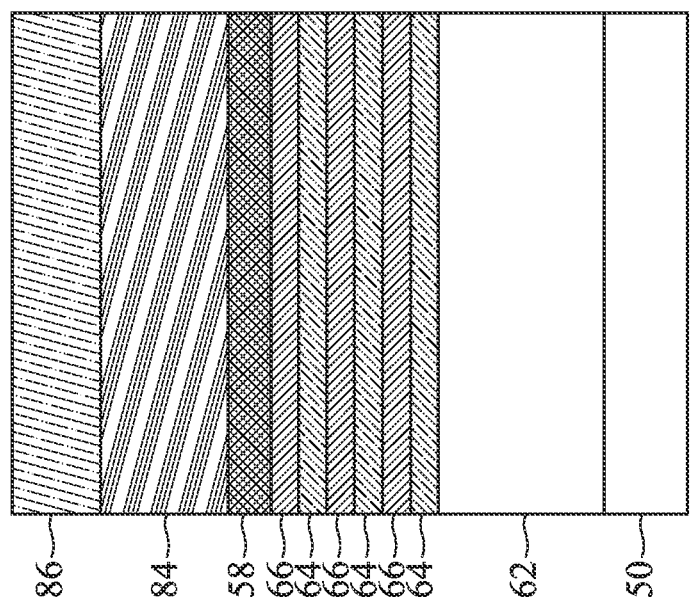
Figure 15C:
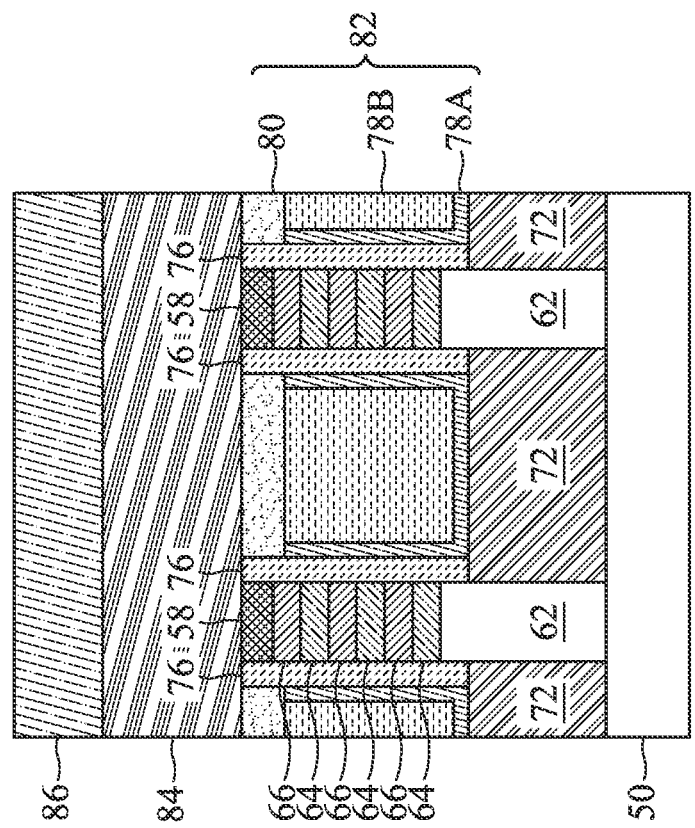
Figure 15B:
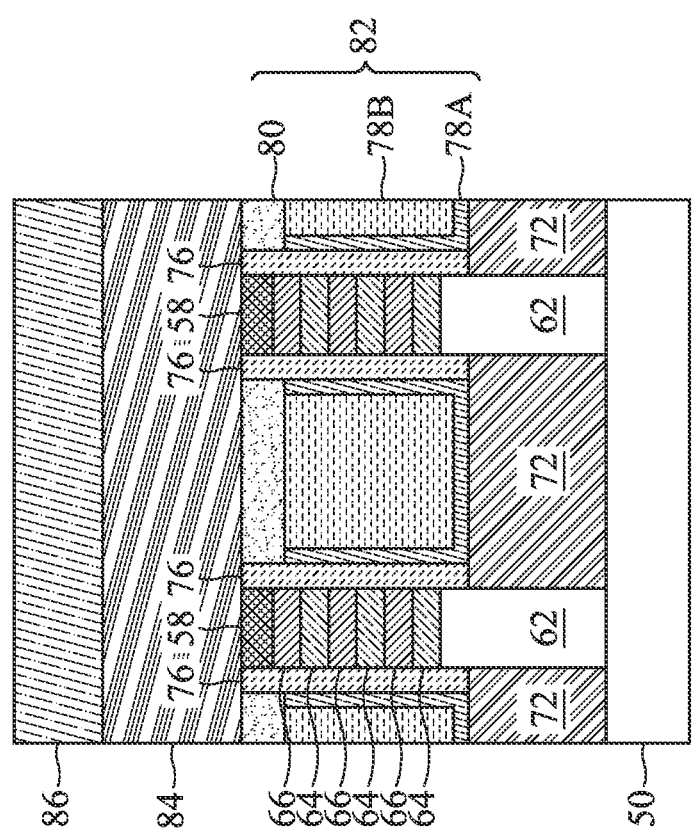

In FIG. 15A-15C, a dummy gate layer 84 is formed on the insulating fins 82, the sacrificial spacers 76, and the mask 58 (if present) or the nanostructures 64, 66. The dummy gate layer 84 may be deposited and then planarized, such as by a CMP. The dummy gate layer 84 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 84 may also be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. The dummy gate layer 84 may be formed of material(s) that have a high etching selectivity from the etching of insulation materials, e.g., the insulating fins 82. A mask layer 86 may be deposited over the dummy gate layer 84. The mask layer 86 may be formed of a dielectric material such as silicon nitride, silicon oxynitride, or the like. In this example, a single dummy gate layer 84 and a single mask layer 86 are formed across the n-type region 50N and the p-type region 50P.

Figure 16A:
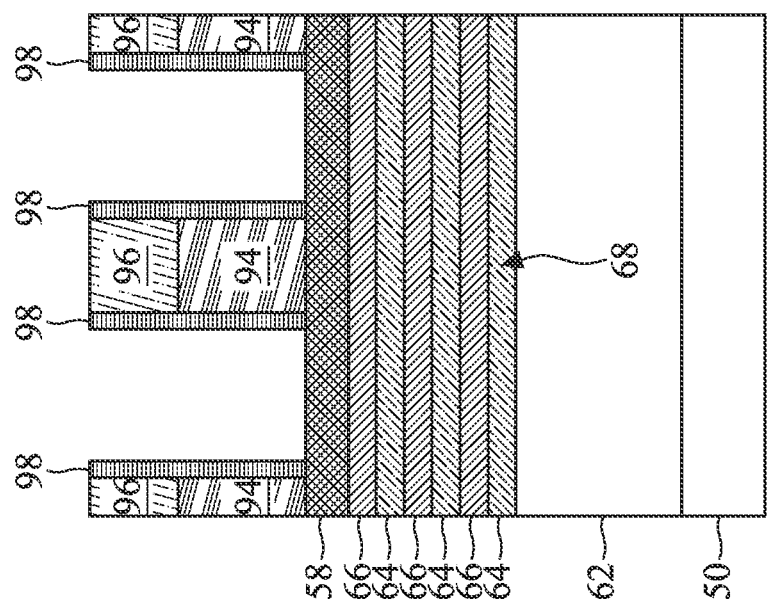
Figures 16B, 16C:
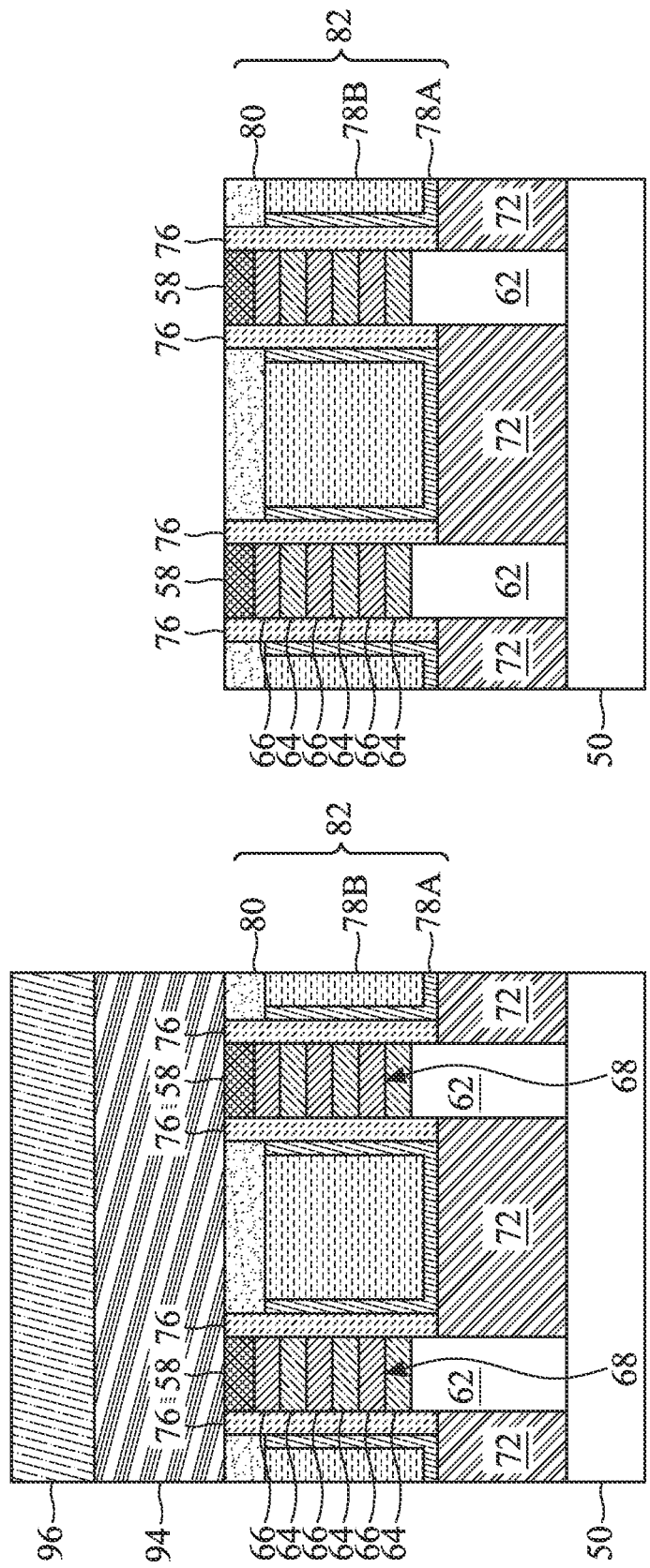

In FIGS. 16A-16C, the mask layer 86 is patterned using acceptable photolithography and etching techniques to form masks 96. The pattern of the masks 96 is then transferred to the dummy gate layer 84 by any acceptable etching technique to form dummy gates 94. The dummy gates 94 cover the top surface of the nanostructures 64, 66 that will be exposed in subsequent processing to form channel regions. The pattern of the masks 96 may be used to physically separate adjacent dummy gates 94. The dummy gates 94 may also have lengthwise directions substantially perpendicular (within process variations) to the lengthwise directions of the semiconductor fins 62. The masks 96 can optionally be removed after patterning, such as by any acceptable etching technique.

The sacrificial spacers 76 and the dummy gates 94 collectively extend along the portions of the nanostructures 66 that will be patterned to form channel regions 68. Subsequently formed gate structures will replace the sacrificial spacers 76 and the dummy gates 94. Forming the dummy gates 94 over the sacrificial spacers 76 allows the subsequently formed gate structures to have a greater height.

As noted above, the dummy gates 94 may be formed of a semiconductor material. In such embodiments, the nanostructures 64, the sacrificial spacers 76, and the dummy gates 94 are each formed of semiconductor materials. In some embodiments, the nanostructures 64 and the sacrificial spacers 76 are formed of a first semiconductor material (e.g., silicon germanium) and the dummy gates 94 are formed of a second semiconductor material (e.g., silicon), so that during a replacement gate process, the dummy gates 94 may be removed in a first etching step, and the nanostructures 64 and the sacrificial spacers 76 may be removed together in a second etching step. When the nanostructures 64 and the sacrificial spacers 76 are formed of silicon germanium: the nanostructures 64 and the sacrificial spacers 76 may have similar germanium concentrations, the nanostructures 64 may have a greater germanium concentration than the sacrificial spacers 76, or the sacrificial spacers 76 may have a greater germanium concentration than the nanostructures 64. In some embodiments, the nanostructures 64 are formed of a first semiconductor material (e.g., silicon germanium) and the sacrificial spacers 76 and the dummy gates 94 are formed of a second semiconductor material (e.g., silicon), so that during a replacement gate process, the sacrificial spacers 76 and the dummy gates 94 may be removed together in a first etching step, and the nanostructures 64 may be removed in a second etching step.

Further, gate spacers 98 are formed over the mask 58 (if present) or the nanostructures 64, 66, and on exposed sidewalls of the masks 96 (if present) and the dummy gates 94. The gate spacers 98 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 94 (thus forming the gate spacers 98). After etching, the gate spacers 98 can have curved sidewalls or can have straight sidewalls.

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the semiconductor fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the semiconductor fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 94, so that the channel regions 68 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 17A:
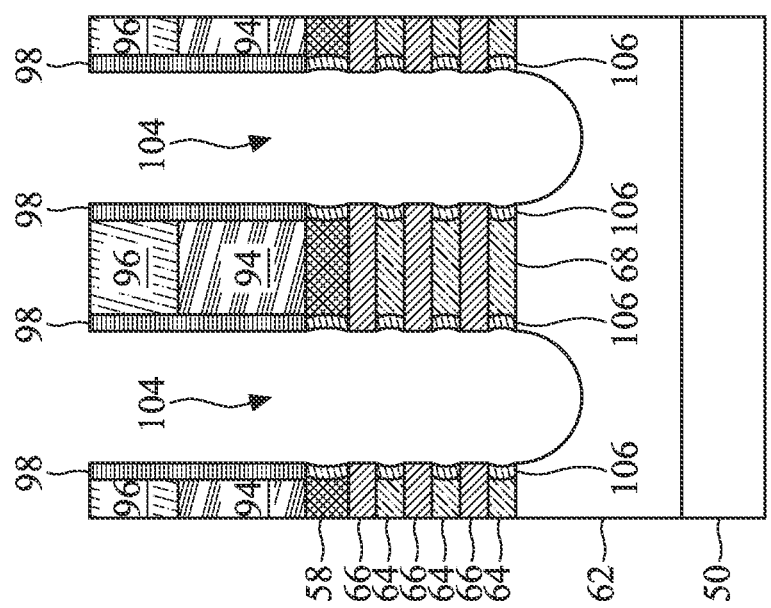

In FIGS. 17A-17C, source/drain recesses 104 are formed in the mask 58 (if present), the nanostructures 64, 66, and the sacrificial spacers 76. In the illustrated embodiment, the source/drain recesses 104 extend through the nanostructures 64, 66 and into the semiconductor fins 62. The source/drain recesses 104 may also extend into the substrate 50. In various embodiments, the source/drain recesses 104 may extend to a top surface of the substrate 50 without etching the substrate 50; the semiconductor fins 62 may be etched such that bottom surfaces of the source/drain recesses 104 are disposed below the top surfaces of the STI regions 72; or the like. The source/drain recesses 104 may be formed by etching the nanostructures 64, 66 and the sacrificial spacers 76 using an anisotropic etching processes, such as a RIE, a NBE, or the like. The gate spacers 98 and the dummy gates 94 collectively mask portions of the semiconductor fins 62 and/or the nanostructures 64, 66 during the etching processes used to form the source/drain recesses 104. A single etch process may be used to etch each of the nanostructures 64, 66, or multiple etch processes may be used to etch the nanostructures 64, 66. Timed etch processes may be used to stop the etching of the source/drain recesses 104 after the source/drain recesses 104 reach a desired depth. In some embodiments, portions of the STI regions 72 adjacent the insulating fins 82 may also be etched during the formation of the source/drain recesses 104.

Optionally, inner spacers 106 are formed on the sidewalls of the remaining portions of the mask 58 (if present) and the nanostructures 64, e.g., those sidewalls exposed by the source/drain recesses 104. As will be subsequently described in greater detail, source/drain regions will be subsequently formed in the source/drain recesses 104, and the nanostructures 64 will be subsequently replaced with corresponding gate structures. The inner spacers 106 act as isolation features between the subsequently formed source/drain regions and the subsequently formed gate structures. Further, the inner spacers 106 may be used to substantially prevent damage to the subsequently formed source/drain regions by subsequent etching processes, such as etching processes used to subsequently remove the nanostructures 64.

As an example to form the inner spacers 106, the source/drain recesses 104 can be laterally expanded. Specifically, portions of the sidewalls of the nanostructures 64 exposed by the source/drain recesses 104 may be recessed. Although sidewalls of the nanostructures 64 are illustrated as being straight, the sidewalls may be concave or convex. The sidewalls may be recessed by any acceptable etching process, such as one that is selective to the nanostructures 64 (e.g., selectively etches the materials of the nanostructures 64 at a faster rate than the material of the nanostructures 66). The etching may be isotropic. For example, when the nanostructures 66 are formed of silicon and the nanostructures 64 are formed of silicon germanium, the etching process may be a wet etch using tetramethylammonium hydroxide (TMAH), ammonium hydroxide (NH$_4$OH), or the like. In another embodiment, the etching process may be a dry etch using a fluorine-based gas such as hydrogen fluoride (HF) gas. In some embodiments, the same etching process may be continually performed to both form the source/drain recesses 104 and recess the sidewalls of the nanostructures 64. The inner spacers 106 are then formed on the recessed sidewalls of the nanostructures 64. The inner spacers 106 can be formed by conformally forming an insulating material and subsequently etching the insulating material. The insulating material may be silicon nitride or silicon oxynitride, although any suitable material, such as a low-k dielectric material, may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 106 are illustrated as being flush with respect to the sidewalls of the gate spacers 98, the outer sidewalls of the inner spacers 106 may extend beyond or be recessed from the sidewalls of the gate spacers 98. In other words, the inner spacers 106 may partially fill, completely fill, or overfill the sidewall recesses. Moreover, although the sidewalls of the inner spacers 106 are illustrated as being straight, the sidewalls of the inner spacers 106 may be concave or convex. Portions of the sidewalls of the mask 58 (if present) may also be recessed, and the inner spacers 106 can also be formed on the recessed sidewalls of the mask 58.

Figure 18A:
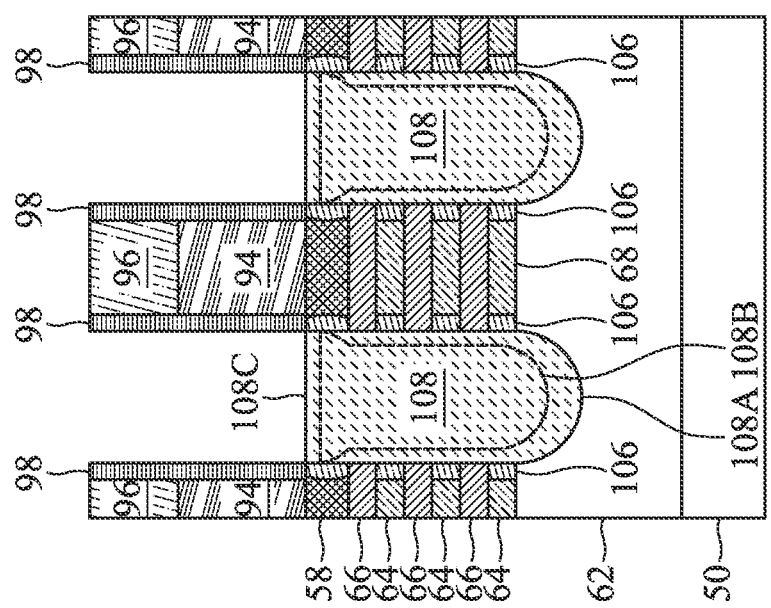

In FIGS. 18A-18C, epitaxial source/drain regions 108 are formed in the source/drain recesses 104. The epitaxial source/drain regions 108 are formed in the source/drain recesses 104 such that each dummy gate 94 (and corresponding channel region 68) is disposed between respective adjacent pairs of the epitaxial source/drain regions 108. In some embodiments, the gate spacers 98 and the inner spacers 106 are used to separate the epitaxial source/drain regions 108 from, respectively, the dummy gates 94 and the nanostructures 64 by an appropriate lateral distance so that the epitaxial source/drain regions 108 do not short out with subsequently formed gates of the resulting nano-FETs. A material of the epitaxial source/drain regions 108 may be selected to exert stress in the respective channel regions 68, thereby improving performance.

The epitaxial source/drain regions 108 in the n-type region 50N may be formed by masking the p-type region 50P. Then, the epitaxial source/drain regions 108 in the n-type region 50N are epitaxially grown in the source/drain recesses 104 in the n-type region 50N. The epitaxial source/drain regions 108 may include any acceptable material appropriate for n-type devices. For example, if the nanostructures 66 are silicon, the epitaxial source/drain regions 108 in the n-type region 50N may include materials exerting a tensile strain on the channel regions 68, such as silicon, silicon carbide, phosphorous doped silicon carbide, silicon phosphide, or the like. The epitaxial source/drain regions 108 in the n-type region 50N may be referred to as "n-type source/drain regions." The epitaxial source/drain regions 108 in the n-type region 50N may have surfaces raised from respective surfaces of the semiconductor fins 62 and the nanostructures 64, 66, and may have facets.

The epitaxial source/drain regions 108 in the p-type region 50P may be formed by masking the n-type region 50N. Then, the epitaxial source/drain regions 108 in the p-type region 50P are epitaxially grown in the source/drain recesses 104 in the p-type region 50P. The epitaxial source/drain regions 108 may include any acceptable material appropriate for p-type devices. For example, if the nanostructures 66 are silicon, the epitaxial source/drain regions 108 in the p-type region 50P may include materials exerting a compressive strain on the channel regions 68, such as silicon germanium, boron doped silicon germanium, germanium, germanium tin, or the like. The epitaxial source/drain regions 108 in the p-type region 50P may be referred to as "p-type source/drain regions." The epitaxial source/drain regions 108 in the p-type region 50P may have surfaces raised from respective surfaces of the semiconductor fins 62 and the nanostructures 64, 66, and may have facets.

The epitaxial source/drain regions 108, the nanostructures 64, 66, and/or the semiconductor fins 62 may be implanted with impurities to form source/drain regions, similar to the process previously described for forming LDD regions, followed by an anneal. The source/drain regions may have an impurity concentration in the range of $10^{19}$ cm$^{-3}$ to $10^{21}$ cm$^{-3}$. The n-type and/or p-type impurities for source/drain regions may be any of the impurities previously described. In some embodiments, the epitaxial source/drain regions 108 may be in situ doped during growth.

The epitaxial source/drain regions 108 may include one or more semiconductor material layers. For example, the epitaxial source/drain regions 108 may each include a liner layer 108A, a main layer 108B, and a finishing layer 108C (or more generally, a first semiconductor material layer, a second semiconductor material layer, and a third semiconductor material layer). Any number of semiconductor material layers may be used for the epitaxial source/drain regions 108. Each of the liner layer 108A, the main layer 108B, and the finishing layer 108C may be formed of different semiconductor materials and may be doped to different impurity concentrations. In some embodiments, the liner layer 108A may have a lesser concentration of impurities than the main layer 108B, and the finishing layer 108C may have a greater concentration of impurities than the liner layer 108A and a lesser concentration of impurities than the main layer 108B. In embodiments in which the epitaxial source/drain regions include three semiconductor material layers, the liner layers 108A may be grown in the source/drain recesses 104, the main layers 108B may be grown on the liner layers 108A, and the finishing layers 108C may be grown on the main layers 108B.

As a result of the epitaxy processes used to form the epitaxial source/drain regions 108, upper surfaces of the epitaxial source/drain regions have facets which expand laterally outward beyond sidewalls of the semiconductor fins 62 and the nanostructures 64, 66. However, the insulating fins 82 block the lateral epitaxial growth. Therefore, adjacent epitaxial source/drain regions 108 remain separated after the epitaxy process is completed as illustrated by FIG. 18C. The epitaxial source/drain regions 108 contact the sidewalls of the insulating fins 82. In the illustrated embodiment, the epitaxial source/drain regions 108 are grown so that the upper surfaces of the epitaxial source/drain regions 108 are disposed below the top surfaces of the insulating fins 82. In various embodiments, the upper surfaces of the epitaxial source/drain regions 108 are disposed above the top surfaces of the insulating fins 82; the upper surfaces of the epitaxial source/drain regions 108 have portions disposed above and below the top surfaces of the insulating fins 82; or the like.

Figure 19A:
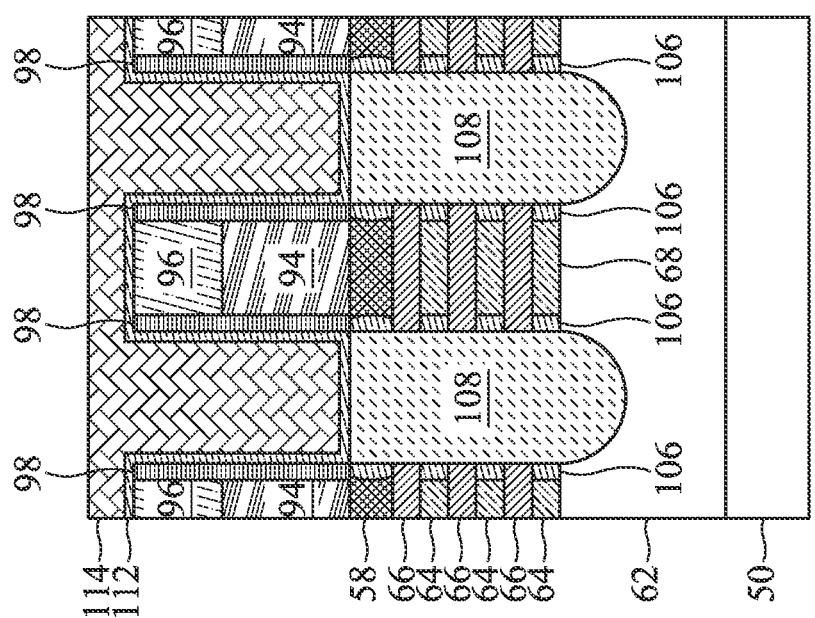
Figure 19C:
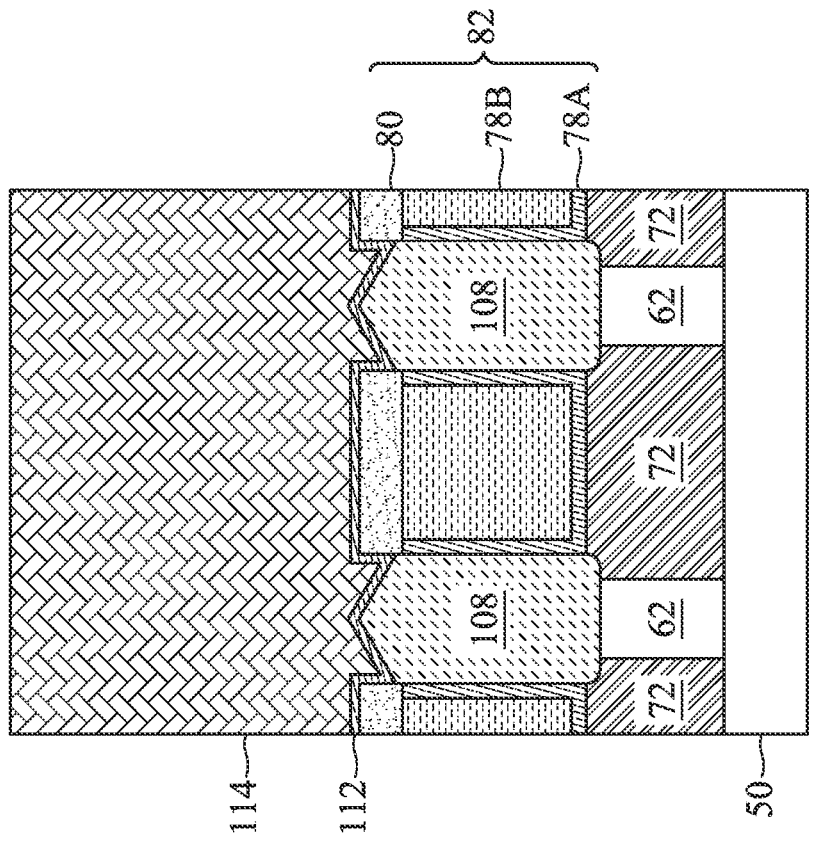
Figure 19B:
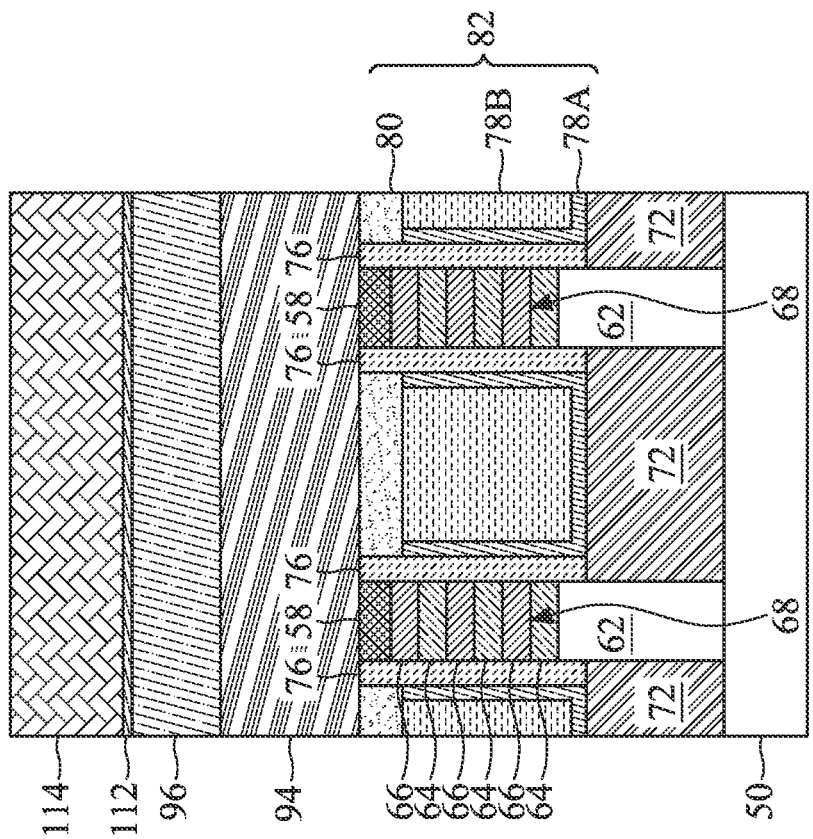

In FIGS. 19A-19C, a first inter-layer dielectric (ILD) 114 is deposited over the epitaxial source/drain regions 108, the gate spacers 98, the masks 96 (if present) or the dummy gates 94. The first ILD 114 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 112 is formed between the first ILD 114 and the epitaxial source/drain regions 108, the gate spacers 98, and the masks 96 (if present) or the dummy gates 94. The CESL 112 may be formed of a dielectric material, such as silicon nitride, silicon oxide, silicon oxynitride, or the like, having a high etching selectivity from the etching of the first ILD 114. The CESL 112 may be formed by any suitable method, such as CVD, ALD, or the like.

Figure 20A:
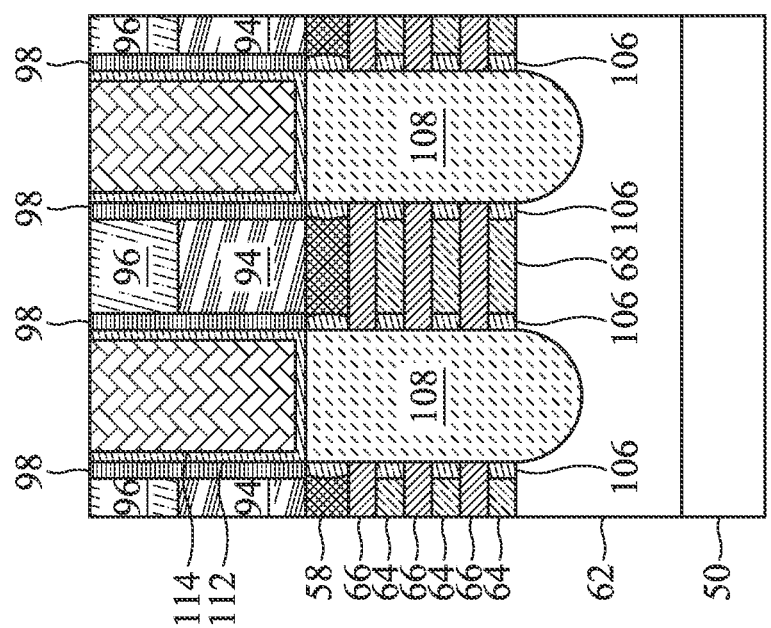

In FIGS. 20A-20C, a removal process is performed to level the top surfaces of the first ILD 114 with the top surfaces of the masks 96 (if present) or the dummy gates 94. In some embodiments, a planarization process such as a chemical mechanical polish (CMP), an etch-back process, combinations thereof, or the like may be utilized. The planarization process may also remove the masks 96 on the dummy gates 94, and portions of the gate spacers 98 along sidewalls of the masks 96. After the planarization process, the top surfaces of the gate spacers 98, the first ILD 114, the CESL 112, and the masks 96 (if present) or the dummy gates 94 are coplanar (within process variations). Accordingly, the top surfaces of the masks 96 (if present) or the dummy gates 94 are exposed through the first ILD 114. In the illustrated embodiment, the masks 96 remain, and the planarization process levels the top surfaces of the first ILD 114 with the top surfaces of the masks 96.

Figure 21A:
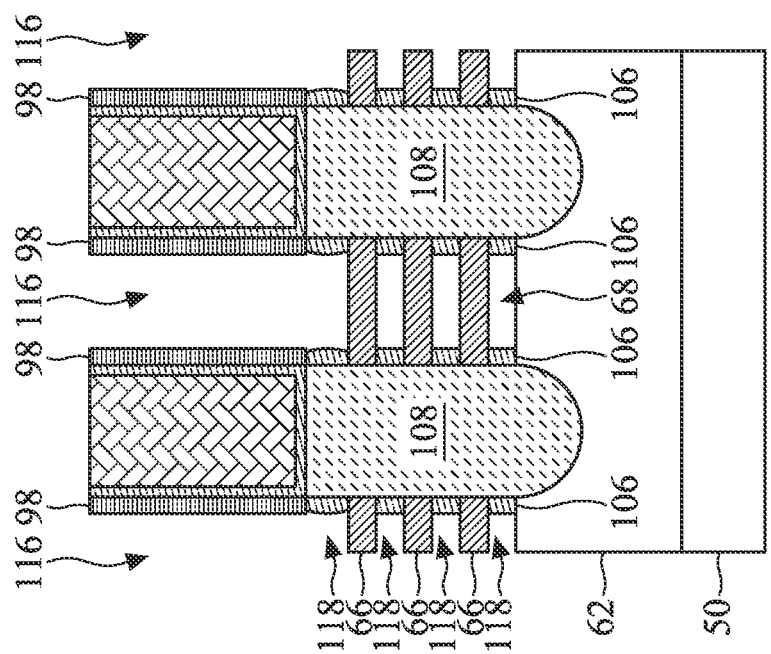
Figure 21C:
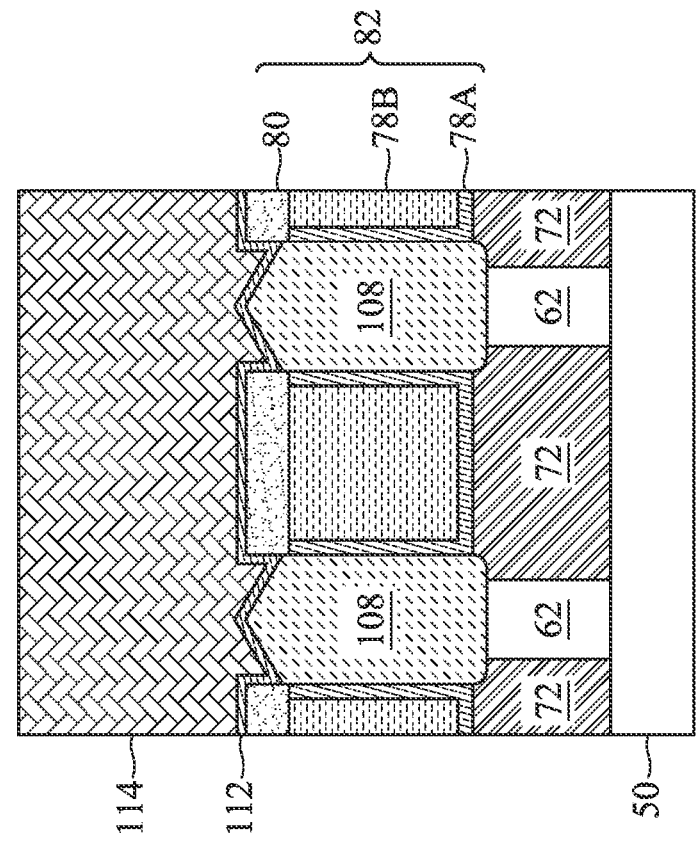
Figure 21B:
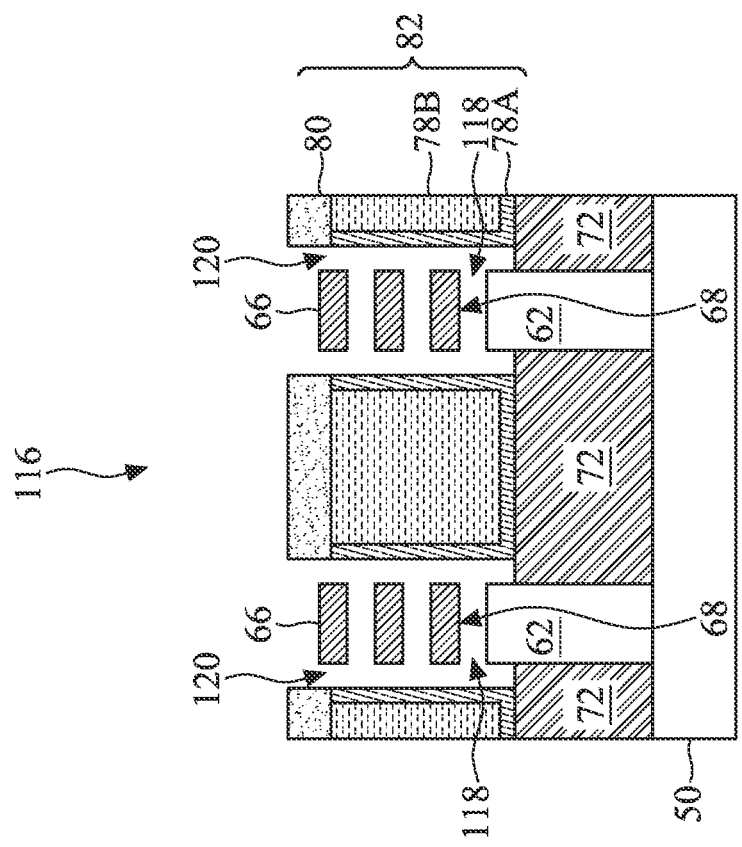

In FIGS. 21A-21C, the masks 96 (if present) and the dummy gates 94 are removed in an etching process, so that recesses 116 are formed. In some embodiments, the dummy gates 94 are removed by an anisotropic dry etch process. For example, the etching process may include a dry etch process using reaction gas(es) that selectively etch the dummy gates 94 at a faster rate than the first ILD 114 or the gate spacers 98. Each recess 116 exposes and/or overlies portions of the channel regions 68. Portions of the nanostructures 66 which act as the channel regions 68 are disposed between adjacent pairs of the epitaxial source/drain regions 108.

The remaining portions of the nanostructures 64 are then removed to expand the recesses 116, such that openings 118 are formed in regions between the nanostructures 66. The remaining portions of the sacrificial spacers 76 are also removed to expand the recesses 116, such that openings 120 are formed in regions between semiconductor fins 62 and the insulating fins 82. The remaining portions of the nanostructures 64 and the sacrificial spacers 76 can be removed by any acceptable etching process that selectively etches the material(s) of the nanostructures 64 and the sacrificial spacers 76 at a faster rate than the material of the nanostructures 66. The etching may be isotropic. For example, when the nanostructures 64 and the sacrificial spacers 76 are formed of silicon germanium and the nanostructures 66 are formed of silicon, the etching process may be a wet etch using tetramethylammonium hydroxide (TMAH), ammonium hydroxide ($NH_4OH$), or the like. The masks 58 (if present) may also be removed. In some embodiments, a trim process (not separately illustrated) is performed to decrease the thicknesses of the exposed portions of the nanostructures 66.

Figure 22C:
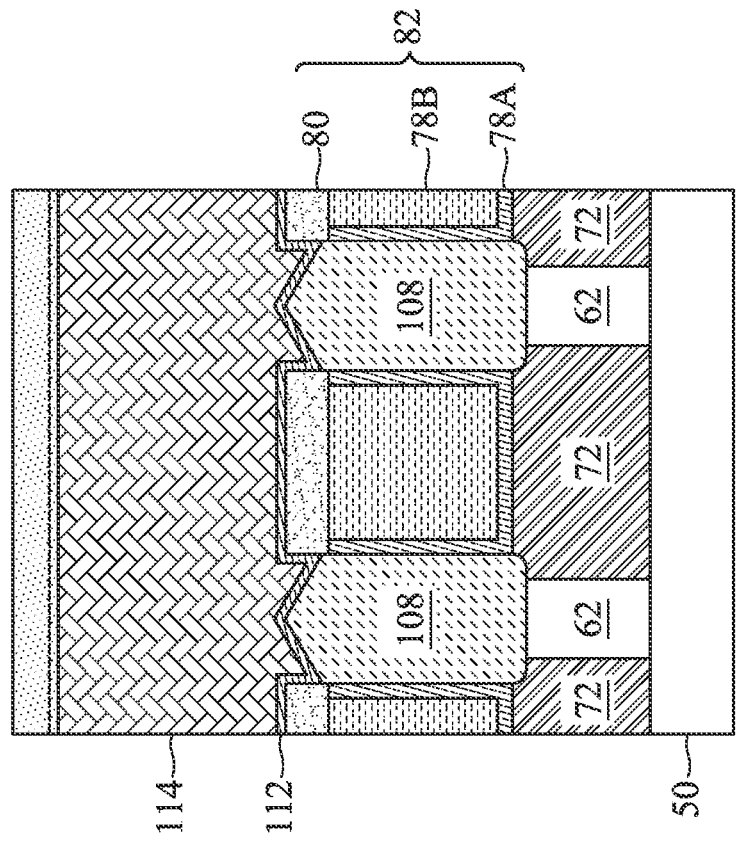
Figure 22B:
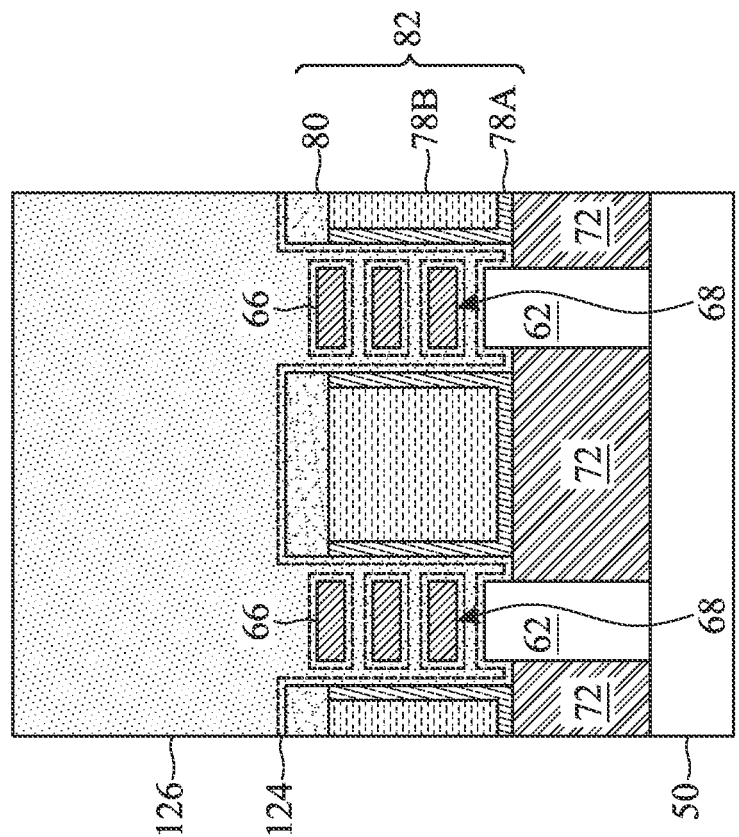

In FIGS. 22A-22C, a gate dielectric layer 124 is formed in the recesses 116. A gate electrode layer 126 is formed on the gate dielectric layer 124. The gate dielectric layer 124 and the gate electrode layer 126 are layers for replacement gates, and each wrap around all (e.g., four) sides of the nanostructures 66. Thus, the gate dielectric layer 124 and the gate electrode layer 126 are formed in the openings 118 and the openings 120 (see FIGS. 21A and 21C).

The gate dielectric layer 124 is disposed on the sidewalls and/or the top surfaces of the semiconductor fins 62; on the top surfaces, the sidewalls, and the bottom surfaces of the nanostructures 66; on the sidewalls of the inner spacers 106 adjacent the epitaxial source/drain regions 108 and the gate spacers 98 on top surfaces of the inner spacers 106; and on the top surfaces and the sidewalls of the insulating fins 82. The gate dielectric layer 124 may also be formed on the top surfaces of the first ILD 114 and the gate spacers 98. The gate dielectric layer 124 may include an oxide such as silicon oxide or a metal oxide, a silicate such as a metal silicate, combinations thereof, multi-layers thereof, or the like. The gate dielectric layer 124 may include a high-k dielectric material (e.g., a dielectric material having a k-value greater than about 7.0), such as a metal oxide or a silicate of hafnium, aluminum, zirconium, lanthanum, manganese, barium, titanium, lead, and combinations thereof. Although a single-layered gate dielectric layer 124 is illustrated in FIGS. 22A-22C, the gate dielectric layer 124 may include any number of interfacial layers and any number of main layers.

The gate electrode layer 126 may include a metal-containing material such as titanium nitride, titanium oxide, tungsten, cobalt, ruthenium, aluminum, combinations thereof, multi-layers thereof, or the like. Although a single-layered gate electrode layer 126 is illustrated in FIGS. 22A-22C, the gate electrode layer 126 may include any number of work function tuning layers, any number of barrier layers, any number of glue layers, and a fill material.

The formation of the gate dielectric layers 124 in the n-type region 50N and the p-type region 50P may occur simultaneously such that the gate dielectric layers 124 in each region are formed of the same materials, and the formation of the gate electrode layers 126 may occur simultaneously such that the gate electrode layers 126 in each region are formed of the same materials. In some embodiments, the gate dielectric layers 124 in each region may be formed by distinct processes, such that the gate dielectric layers 124 may be different materials and/or have a different number of layers, and/or the gate electrode layers 126 in each region may be formed by distinct processes, such that the gate electrode layers 126 may be different materials and/or have a different number of layers. Various masking steps may be used to mask and expose appropriate regions when using distinct processes.

Figure 23A:
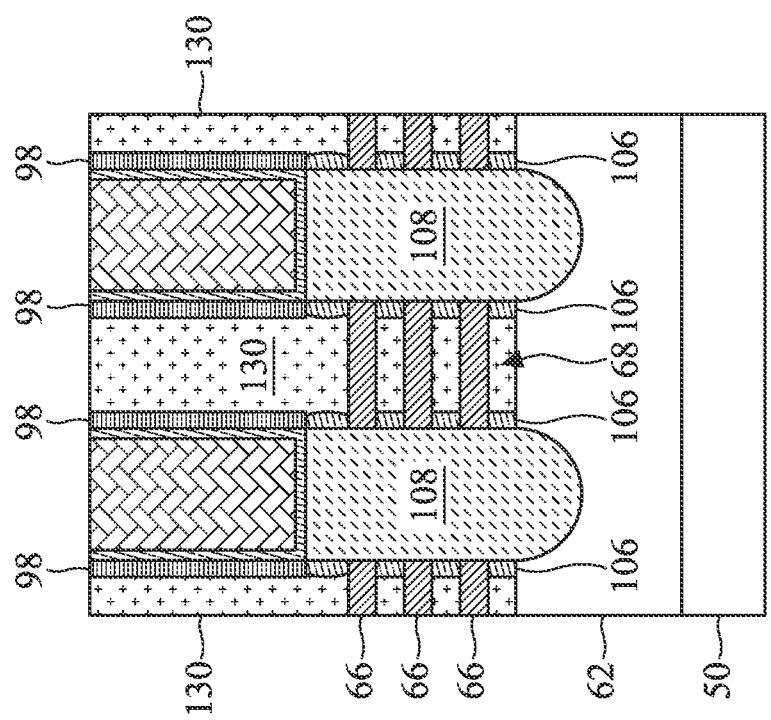
Figure 23C:
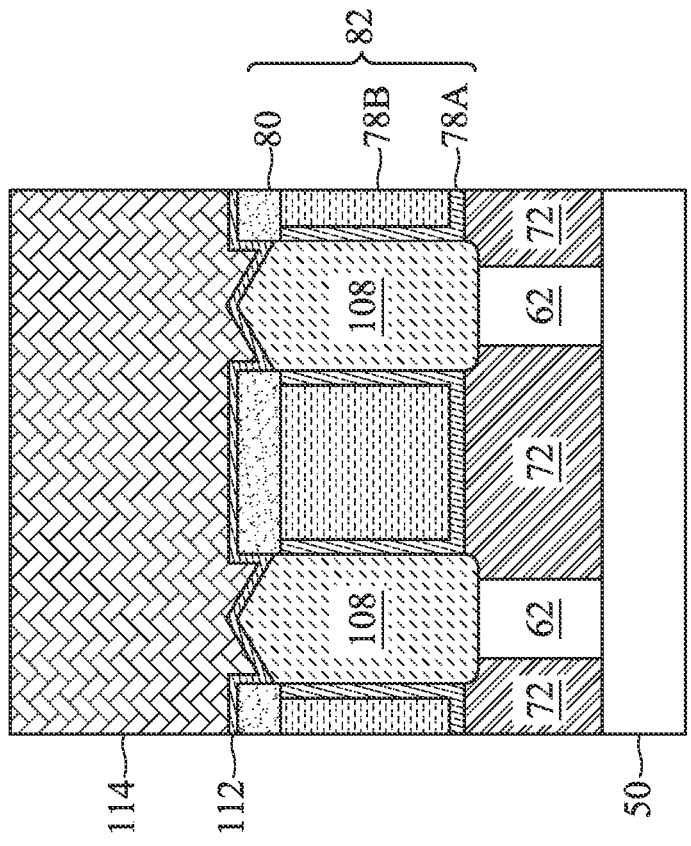
Figure 23B:
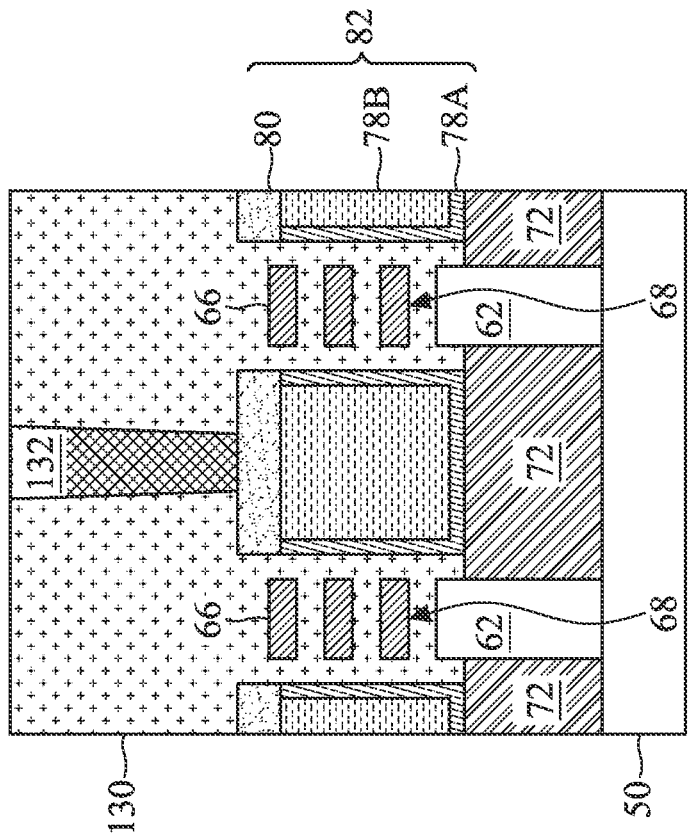

In FIGS. 23A-23C, a removal process is performed to remove the excess portions of the materials of the gate dielectric layer 124 and the gate electrode layer 126, which excess portions are over the top surfaces of the first ILD 114 and the gate spacers 98, thereby forming gate structures 130. In some embodiments, a planarization process such as a chemical mechanical polish (CMP), an etch-back process, combinations thereof, or the like may be utilized. The gate dielectric layer 124, when planarized, has portions left in the recesses 116 (thus forming gate dielectrics for the gate structures 130). The gate electrode layer 126, when planarized, has portions left in the recesses 116 (thus forming gate electrodes for the gate structures 130). The top surfaces of the gate spacers 98; the CESL 112; the first ILD 114; and the gate structures 130 are coplanar (within process variations). The gate structures 130 are replacement gates of the resulting nano-FETs, and may be referred to as "metal gates." The gate structures 130 each extend along top surfaces, sidewalls, and bottom surfaces of a channel region 68 of the nanostructures 66.

The gate structures 130 fill the area previously occupied by the nanostructures 64, the sacrificial spacers 76, and the dummy gates 94. After they are formed, the gate structures 130 have the same profile shape as the sacrificial spacers 76.

In some embodiments, isolation regions 132 are formed extending through some of the gate structures 130. An isolation region 132 is formed to divide (or "cut") a gate structure 130 into multiple gate structures 130. The isolation region 132 may be formed of a dielectric material, such as silicon nitride, silicon oxide, silicon oxynitride, or the like, which may be formed by a deposition process such as CVD, ALD, or the like. As an example to form the isolation regions 132, openings can be patterned in the desired gate structures 130. Any acceptable etch process, such as a dry etch, a wet etch, the like, or a combination thereof, may be performed to pattern the openings. The etching may be anisotropic. One or more layers of dielectric material may be deposited in the openings. A removal process may be performed to remove the excess portions of the dielectric material, which excess portions are over the top surfaces of the gate structures 130, thereby forming the isolation regions 132.

Figure 24A:
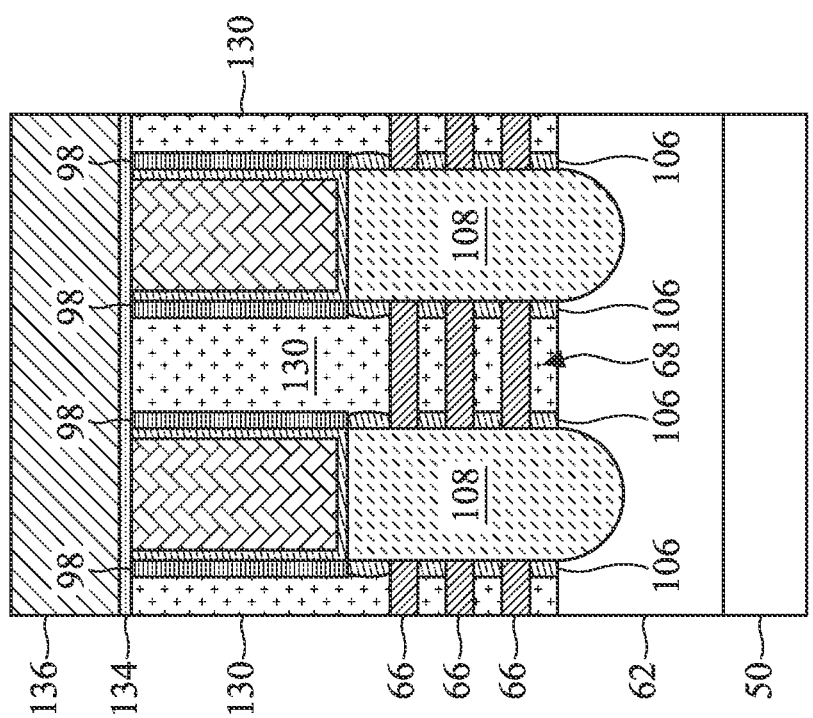
Figures 24B, 24C:
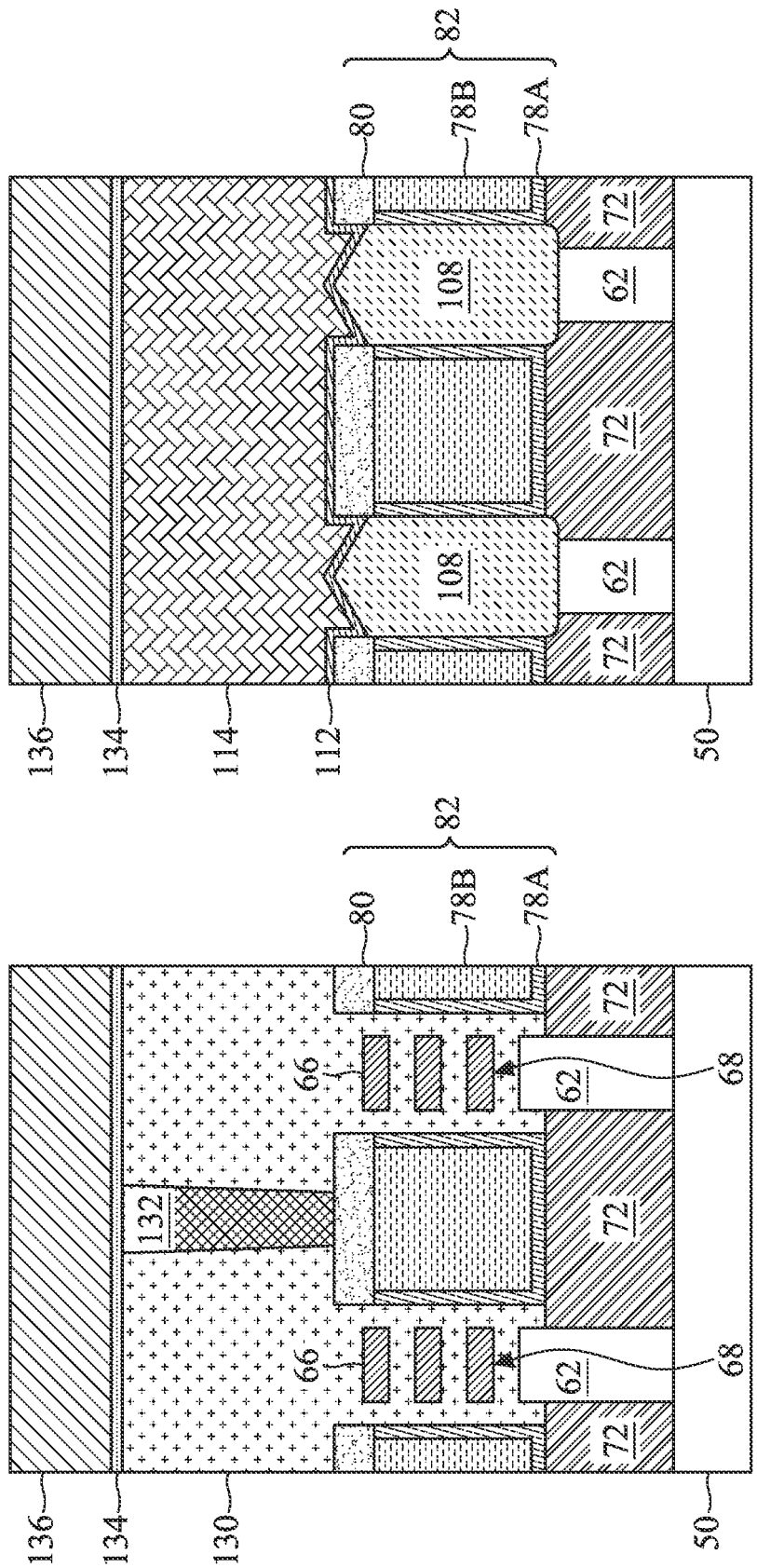

In FIGS. 24A-24C, a second ILD 136 is deposited over the gate spacers 98, the CESL 112, the first ILD 114, and the gate structures 130. In some embodiments, the second ILD 136 is a flowable film formed by a flowable CVD method. In some embodiments, the second ILD 136 is formed of a dielectric material such as PSG, BSG, BPSG, USG, or the like, which may be deposited by any suitable method, such as CVD, PECVD, or the like.

In some embodiments, an etch stop layer (ESL) 134 is formed between the second ILD 136 and the gate spacers 98, the CESL 112, the first ILD 114, and the gate structures 130. The ESL 134 may include a dielectric material, such as silicon nitride, silicon oxide, silicon oxynitride, or the like, having a high etching selectivity from the etching of the second ILD 136.

Figure 25A:
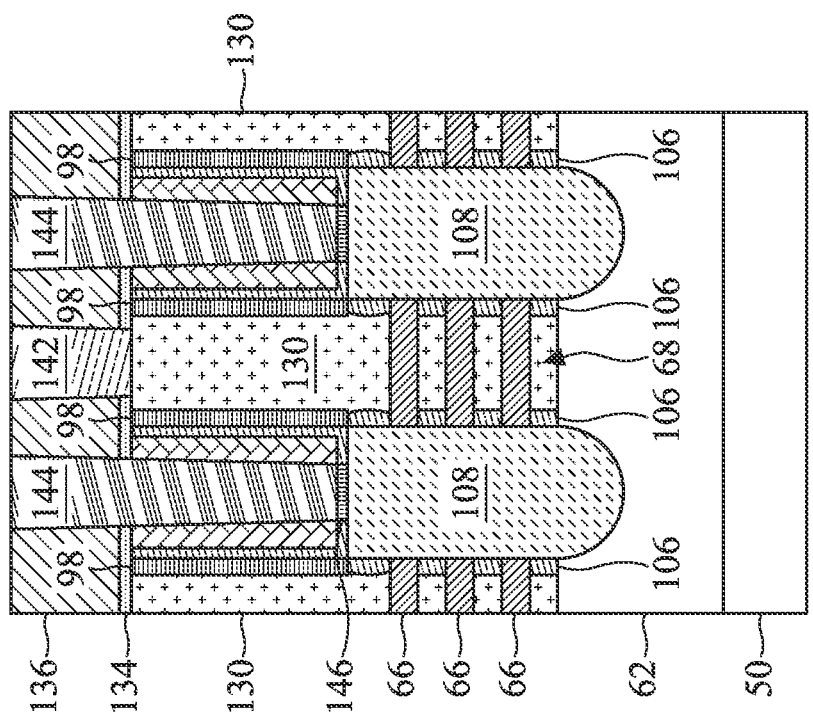
Figure 25D:
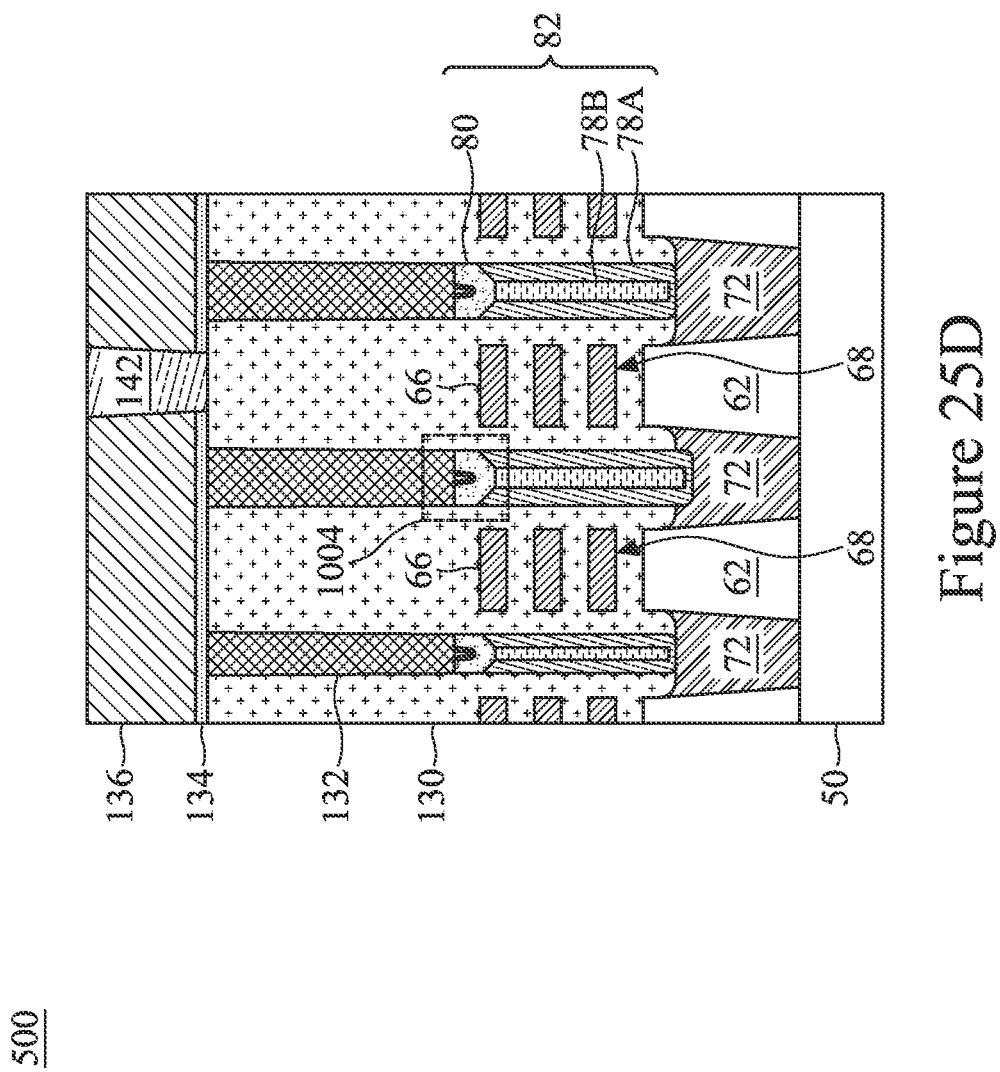

In FIGS. 25A-25C, gate contacts 142 and source/drain contacts 144 are formed to contact, respectively, the gate structures 130 and the epitaxial source/drain regions 108. The gate contacts 142 are physically and electrically coupled to the gate structures 130. The source/drain contacts 144 are physically and electrically coupled to the epitaxial source/drain regions 108.

As an example to form the gate contacts 142 and the source/drain contacts 144, openings for the gate contacts 142 are formed through the second ILD 136 and the ESL 134, and openings for the source/drain contacts 144 are formed through the second ILD 136, the ESL 134, the first ILD 114, and the CESL 112. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 136. The remaining liner and conductive material form the gate contacts 142 and the source/drain contacts 144 in the openings. The gate contacts 142 and the source/drain contacts 144 may be formed in distinct processes, or may be formed in the same process. Although shown as being formed in the same cross-sections, it should be appreciated that each of the gate contacts 142 and the source/drain contacts 144 may be formed in different cross-sections, which may avoid shorting of the contacts.

Optionally, metal-semiconductor alloy regions 146 are formed at the interfaces between the epitaxial source/drain regions 108 and the source/drain contacts 144. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 146 can be formed before the material(s) of the source/drain contacts 144 by depositing a metal in the openings for the source/drain contacts 144 and then performing a thermal anneal process. The metal can be any metal capable of reacting with the semiconductor materials (e.g., silicon, silicon-germanium, germanium, etc.) of the epitaxial source/drain regions 108 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 146. The material(s) of the source/drain contacts 144 can then be formed on the metal-semiconductor alloy regions 146.

FIG. 25D follows from FIG. 13F and illustrates a region of the dense area 500 with four semiconductor fins 62 and three insulating fins 82 disposed between them, in accordance with some embodiments. The structures illustrated in FIG. 25D may be formed from the structures illustrated in FIG. 13F using similar methods and materials as described in respect to FIGS. 14A-25C. In some embodiments, isolation regions 132 extend through the gate structures 130 to physically contact top surfaces of the upper dielectric layers 80 of the insulating fins 82 in order to electrically isolate the adjacent gate structures 130.

Figure 25E:
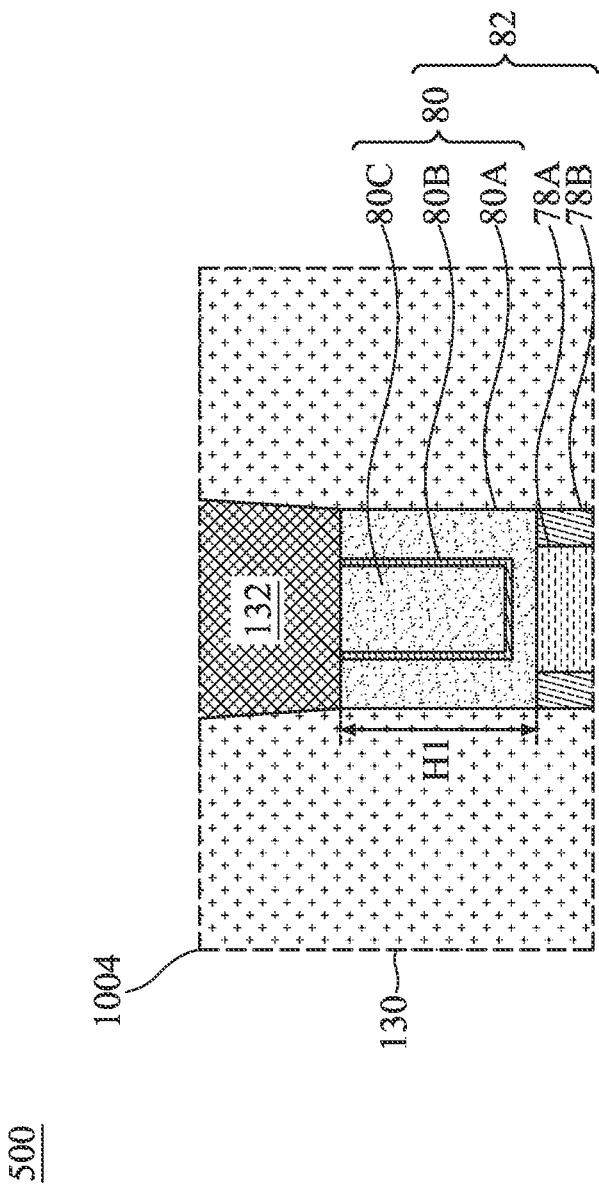
Figure 25F:
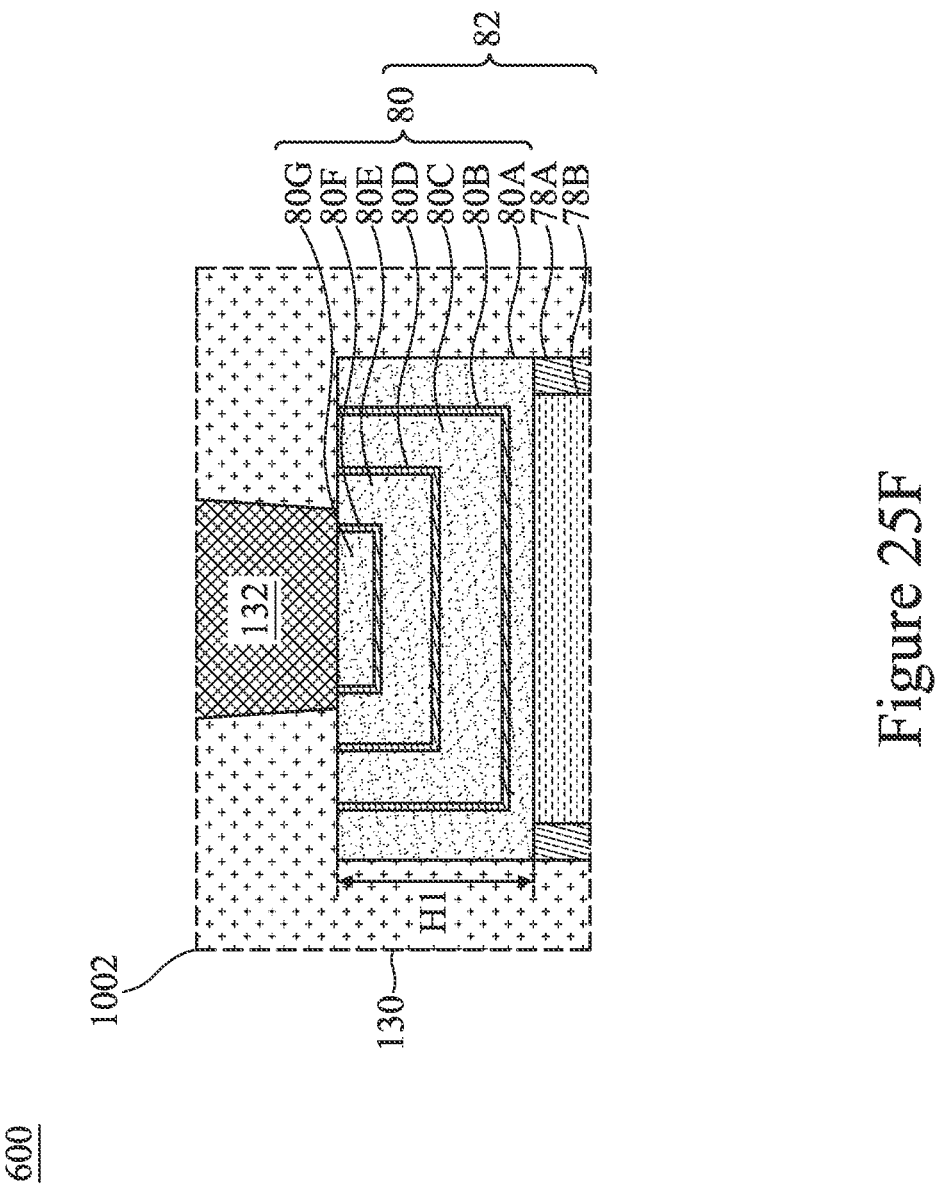

FIG. 25E illustrates a view of region 1004 in the dense area 500 as shown in FIG. 25D, and FIG. 25F illustrates a view of region 1002 in the sparse area 600 as shown in FIG. 25B. Isolation regions 132 in the dense area 500 land on top surfaces of the upper dielectric layers 80 of the insulating fins 82. In some embodiments, the isolation regions 132 cover top surfaces of the capping layer 80B and the high-k dielectric layer 80C. As illustrated in FIG. 25E in accordance with some embodiments, the upper dielectric layers 80 in the dense area 500 include high-k dielectric layers 80A and 80C and the capping layer 80B. However, the upper dielectric layers 80 in the dense area 500 may include any suitable number of sequentially deposited, alternating high-k dielectric layers and capping layers, e.g. 3 high-k dielectric layers and 2 capping layers, 4 high-k dielectric layers and 3 capping layers, or 5 high-k dielectric layers and 4 capping layers. As illustrated in FIG. 25F in accordance with some embodiments, the upper dielectric layers 80 in the sparse area 600 include: high-k dielectric layers 80A, 80C, 80E, and 80G; and the capping layers 80B, 80D, and 80F. However, the upper dielectric layers 80 in the sparse area 600 may include any suitable number of sequentially deposited, alternating high-k dielectric layers and capping layers, e.g. 3 high-k dielectric layers and 2 capping layers, 5 high-k dielectric layers and 4 capping layers, 6 high-k dielectric layers and 5 capping layers, or 10 high-k dielectric layers and 9 capping layers.

Embodiments may achieve advantages. For example, in some embodiments, insulating fins formed between stacks of nanostructures may reduce undesired merging of source/drain regions. Top portions of the insulating fins formed with alternating high-k dielectric layers and capping layers may reduce extrusion defects resulting from local grain growth on top surfaces of the high-k portions may be reduced by the capping layers. Better control ability over film quality and CMP polish rate may be provided by the alternating high-k dielectric layers and capping layers.

In accordance with an embodiment, a semiconductor device includes: a first channel region and a second channel region, the first channel region and the second channel region being over a substrate; and a first insulating fin on the substrate, the first insulating fin being interposed between the first channel region and the second channel region, the first insulating fin including: a lower portion including a fill material; and an upper portion including: a first dielectric layer on the lower portion, the first dielectric layer being a first dielectric material; a first capping layer on the first dielectric layer, the first capping layer being a second dielectric material, the second dielectric material being different than the first dielectric material; and a second dielectric layer on the first capping layer, the second dielectric layer being the first dielectric material. In an embodiment, the first dielectric material is hafnium oxide. In an embodiment, the second dielectric material is silicon oxide. In an embodiment, the first capping layer covers inner sidewalls of the first dielectric layer. In an embodiment, the second dielectric layer is interposed between sidewall portions of the first dielectric layer. In an embodiment, the first capping layer covers outer sidewalls and a bottom surface of the second dielectric layer. In an embodiment, a top surface of the first dielectric layer is coplanar with a top surface of the first capping layer and a top surface of the second dielectric layer. In an embodiment, the first channel region includes a first stack of nanostructures and the second channel region includes a second stack of nanostructures. In an embodiment, the lower portion of the first insulating fin further includes a liner, the liner covering sidewalls and a bottom surface of the fill material.

In accordance with another embodiment, a semiconductor device includes: a first source/drain region on a first semiconductor fin; a second source/drain region on a second semiconductor fin; and a first insulating fin between the first source/drain region and the second source/drain region, the first insulating fin including: a bottom portion, the bottom portion including a liner and a fill material, the fill material being interposed between sidewalls of the liner; and a top portion on the bottom portion, the top portion including: a first high-k dielectric layer; a second high-k dielectric layer between inner sidewalls of the first high-k dielectric layer; and a first capping layer between the first high-k dielectric layer and the second high-k dielectric layer. In an embodiment, the top portion of the first insulating fin further includes: a second capping layer on the second high-k dielectric layer; and a third high-k dielectric layer on the second capping layer. In an embodiment, top surfaces of the first high-k dielectric layer, the second high-k dielectric layer, the third high-k dielectric layer, the first capping layer, and the second capping layer are coplanar. In an embodiment, the first high-k dielectric layer has a thickness in a range of 3 nm to 12 nm. In an embodiment, the first capping layer has a thickness in a range of 0.5 nm to 2 nm. In an embodiment, the semiconductor device further includes a first stack of nanostructures over the first semiconductor fin and a second stack of nanostructures over the second semiconductor fin, the first insulating fin being interposed between the first stack of nanostructures and the second stack of nanostructures.

In accordance with yet another embodiment, a method of forming a semiconductor device includes: forming a liner between a first semiconductor fin and a second semiconductor fin; forming a fill material over the liner; recessing the liner and the fill material to define a first opening over the liner and the fill material; forming a first high-k dielectric layer on sidewalls and a bottom surface of the first opening; forming a first capping layer on the first high-k dielectric layer; and forming a second high-k dielectric layer on the first capping layer. In an embodiment, the method further includes removing upper portions of the first high-k dielectric layer, the first capping layer, and the second high-k dielectric layer. In an embodiment, the material of the first high-k dielectric layer is deposited in a substantially amorphous state. In an embodiment, the method further includes crystallizing the first high-k dielectric layer with an anneal. In an embodiment, the first high-k dielectric layer includes hafnium and the first capping layer includes silicon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first channel region and a second channel region, the first channel region and the second channel region being over a substrate; and
a first insulating fin on the substrate, the first insulating fin being interposed between the first channel region and the second channel region, the first insulating fin comprising:
a lower portion comprising a fill material; and
an upper portion comprising:

a first dielectric layer on the lower portion, the first dielectric layer being a first dielectric material;

a first capping layer on the first dielectric layer, the first capping layer covering inner sidewalls of the first dielectric layer, the first capping layer being a second dielectric material, the second dielectric material being different than the first dielectric material; and a second dielectric layer on the first capping layer, the second dielectric layer being the first dielectric material.

2. The semiconductor device of claim 1, wherein the first dielectric material is hafnium oxide.

3. The semiconductor device of claim 1, wherein the second dielectric material is silicon oxide.

4. The semiconductor device of claim 1, wherein the second dielectric layer is interposed between sidewall portions of the first dielectric layer.

5. The semiconductor device of claim 1, wherein the first capping layer covers outer sidewalls and a bottom surface of the second dielectric layer.

6. The semiconductor device of claim 1, wherein a top surface of the first dielectric layer is coplanar with a top surface of the first capping layer and a top surface of the second dielectric layer.

7. The semiconductor device of claim 1, wherein the first channel region comprises a first stack of nanostructures and the second channel region comprises a second stack of nanostructures.

8. The semiconductor device of claim 1, wherein the lower portion of the first insulating fin further comprises a liner, the liner covering sidewalls and a bottom surface of the fill material.

9. The semiconductor device of claim 1, wherein the upper portion of the first insulating fin further comprises:
a second capping layer on the second dielectric layer; and
a third dielectric layer on the second capping layer.

10. A semiconductor device, comprising:
a first source/drain region on a first semiconductor fin;
a second source/drain region on a second semiconductor fin; and
a first insulating fin between the first source/drain region and the second source/drain region, the first insulating fin comprising:
a bottom portion, the bottom portion comprising a liner and a fill material, the fill material being interposed between sidewalls of the liner; and
a top portion on the bottom portion, the top portion comprising:
a first high-k dielectric layer;
a second high-k dielectric layer between inner sidewalls of the first high-k dielectric layer; and
a first capping layer between the first high-k dielectric layer and the second high-k dielectric layer.

11. The semiconductor device of claim 10, wherein the top portion of the first insulating fin further comprises:
a second capping layer on the second high-k dielectric layer; and
a third high-k dielectric layer on the second capping layer.

12. The semiconductor device of claim 11, wherein top surfaces of the first high-k dielectric layer, the second high-k dielectric layer, the third high-k dielectric layer, the first capping layer, and the second capping layer are coplanar.

13. The semiconductor device of claim 10, wherein the first high-k dielectric layer has a thickness in a range of 3 nm to 12 nm.

14. The semiconductor device of claim 10, wherein the first capping layer has a thickness in a range of 0.5 nm to 2 nm.

15. The semiconductor device of claim 10, further comprising a first stack of nanostructures over the first semiconductor fin and a second stack of nanostructures over the second semiconductor fin, the first insulating fin being interposed between the first stack of nanostructures and the second stack of nanostructures.

16. A method of forming a semiconductor device, the method comprising:
forming a liner between a first semiconductor fin and a second semiconductor fin;
forming a fill material over the liner;
recessing the liner and the fill material to define a first opening over the liner and the fill material;
forming a first high-k dielectric layer on sidewalls and a bottom surface of the first opening;
forming a first capping layer on the first high-k dielectric layer; and
forming a second high-k dielectric layer on the first capping layer.

17. The method of claim 16, further comprising removing upper portions of the first high-k dielectric layer, the first capping layer, and the second high-k dielectric layer.

18. The method of claim 16, wherein a material of the first high-k dielectric layer is deposited in a substantially amorphous state.

19. The method of claim 18, further comprising crystallizing the first high-k dielectric layer with an anneal.

20. The method of claim 16, wherein the first high-k dielectric layer comprises hafnium and the first capping layer comprises silicon.

* * * * *